US012218250B2

(12) United States Patent
Chiang et al.

(10) Patent No.: US 12,218,250 B2
(45) Date of Patent: *Feb. 4, 2025

(54) OXIDE SEMICONDUCTOR TRANSISTOR STRUCTURE IN 3-D DEVICE AND METHODS FOR FORMING THE SAME

(71) Applicant: Taiwan Semiconductor Manufacturing Company Limited, Hsinchu (TW)

(72) Inventors: Kuo-Chang Chiang, Hsinchu (TW); Hung-Chang Sun, Kaohsiung (TW); Sheng-Chih Lai, Hsinchu (TW); TsuChing Yang, Taipei (TW); Yu-Wei Jiang, Hsinchu (TW); Feng-Cheng Yang, Zhudong Township (TW); Neil Quinn Murray, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/334,496

(22) Filed: Jun. 14, 2023

(65) Prior Publication Data

US 2023/0327024 A1    Oct. 12, 2023

Related U.S. Application Data

(63) Continuation of application No. 17/230,624, filed on Apr. 14, 2021, now Pat. No. 11,721,767.
(Continued)

(51) Int. Cl.
*H01L 21/02*    (2006.01)
*H01L 21/477*    (2006.01)
(Continued)

(52) U.S. Cl.
CPC .... *H01L 29/7869* (2013.01); *H01L 21/02565* (2013.01); *H01L 21/477* (2013.01);
(Continued)

(58) Field of Classification Search
CPC . H01L 21/02565; H01L 21/02; H01L 21/477; H01L 21/02365; H01L 21/0243;
(Continued)

(56) References Cited

U.S. PATENT DOCUMENTS 10,658,446 B2    5/2020    Liu
11,037,958 B2    6/2021    Luo
(Continued)

FOREIGN PATENT DOCUMENTS

KR    20080104860 A    12/2008
KR    20140002496 A    1/2014
(Continued)

OTHER PUBLICATIONS

Taiwan Patent and Trademark Office, Application No. 110121583 Office Action of Jan. 4, 2022, 9 pages.
(Continued)

*Primary Examiner* — Nikolay K Yushin
(74) *Attorney, Agent, or Firm* — The Marbury Law Group, PLLC

(57) ABSTRACT

A transistor including a channel layer including an oxide semiconductor material and methods of making the same. The transistor includes a channel layer having a first oxide semiconductor layer having a first oxygen concentration, a second oxide semiconductor layer having a second oxygen concentration and a third oxide semiconductor layer having a third oxygen concentration. The second oxide semiconductor layer is located between the first semiconductor oxide layer and the third oxide semiconductor layer. The second
(Continued)

oxygen concentration is lower than the first oxygen concentration and the third oxygen concentration.

20 Claims, 35 Drawing Sheets

Related U.S. Application Data

(60) Provisional application No. 63/045,370, filed on Jun. 29, 2020.

(51) Int. Cl.
*H01L 29/24* (2006.01)
*H01L 29/51* (2006.01)
*H01L 29/66* (2006.01)
*H01L 29/786* (2006.01)

(52) U.S. Cl.
CPC ............ *H01L 29/24* (2013.01); *H01L 29/517* (2013.01); *H01L 29/66969* (2013.01); *H01L 29/78642* (2013.01)

(58) Field of Classification Search
CPC ......... H01L 21/02472; H01L 21/02483; H01L 21/02502; H01L 21/02554; H01L 21/02587; H01L 21/02631; H01L 29/7869; H01L 29/786; H01L 29/24; H01L 29/517; H01L 29/518; H01L 29/51; H01L 29/66969; H01L 29/66; H01L 29/78642; H01L 29/78696; H01L 29/78612; H01L 29/78621; H01L 29/1033; H01L 21/38; H01L 21/449; H01L 21/461; H01L 21/475; H01L 29/16; H01L 29/18; H01L 29/20; H01L 29/22; H01L 29/42376; H01L 29/7838; H01L 29/10; H01L 29/1054; H01L 29/41733; H01L 29/417; H01L 29/4908; H01L 29/49; H10K 99/00; H10B 61/22; H10B 61/00; H10B 63/30

See application file for complete search history.

(56) References Cited

U.S. PATENT DOCUMENTS

| 2014/0034945 | A1 | 2/2014 | Tokunaga et al. |
| 2018/0013003 | A1 | 1/2018 | Yamazaki |
| 2019/0140101 | A1 | 5/2019 | Im et al. |
| 2019/0386083 | A1 | 12/2019 | Liu |
| 2020/0176603 | A1 | 6/2020 | Baeck et al. |
| 2020/0411567 | A1 | 12/2020 | Luo |

FOREIGN PATENT DOCUMENTS

| TW | 201310645 A | 3/2013 |
| TW | 201431073 A | 8/2014 |
| TW | 202005059 A | 1/2020 |

OTHER PUBLICATIONS

Korean Patent and Trademark Office, Application No. 10-2021-0076201; Official Notice of Aug. 16, 2022, 4 pages.
Chinese Patent and Trademark Office, CN Application No. 202110721471.1; first Office Action of Jun. 28, 2024, 16 pages.

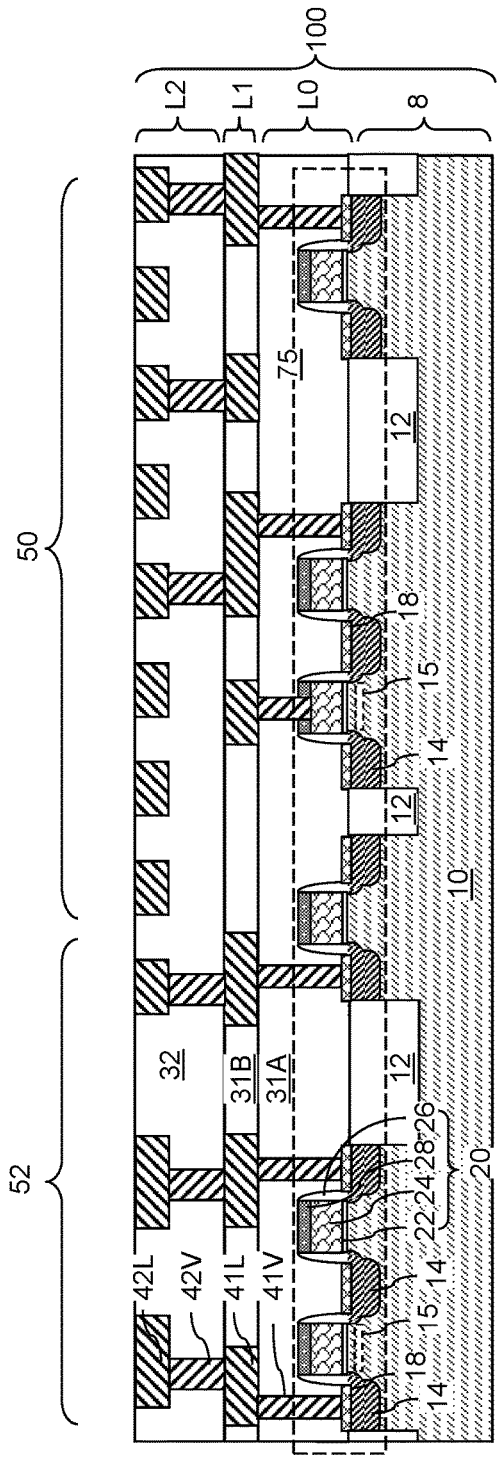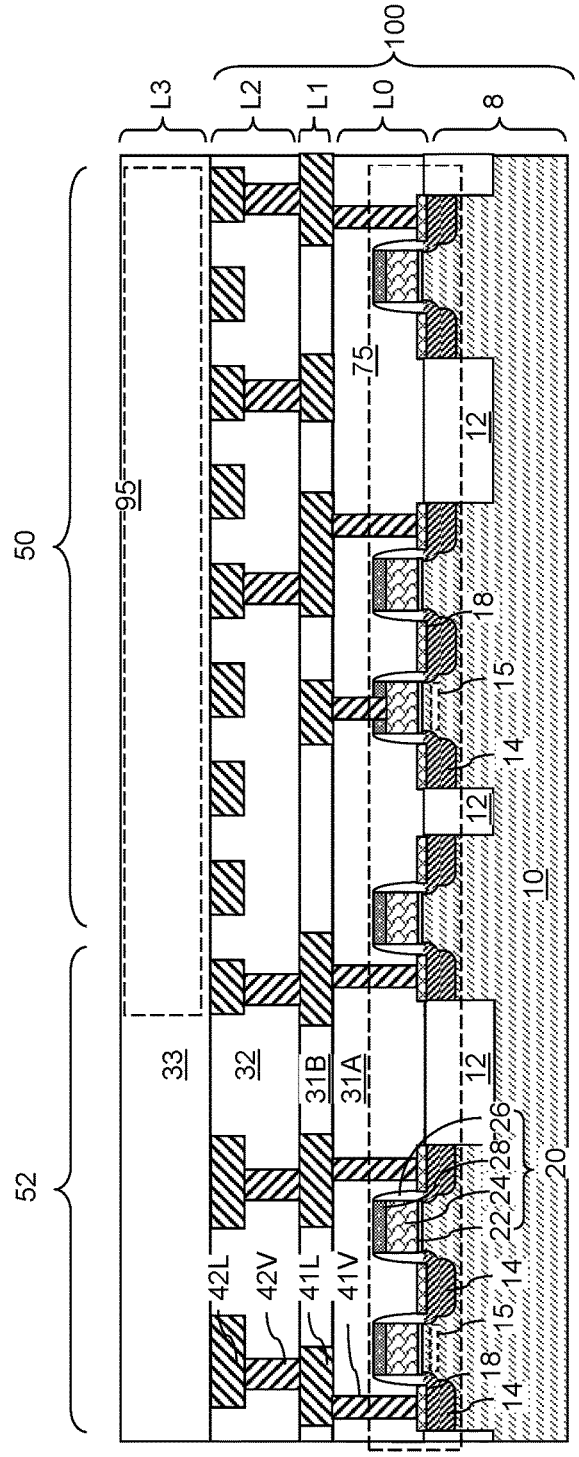
FIG. 1A
FIG. 1B

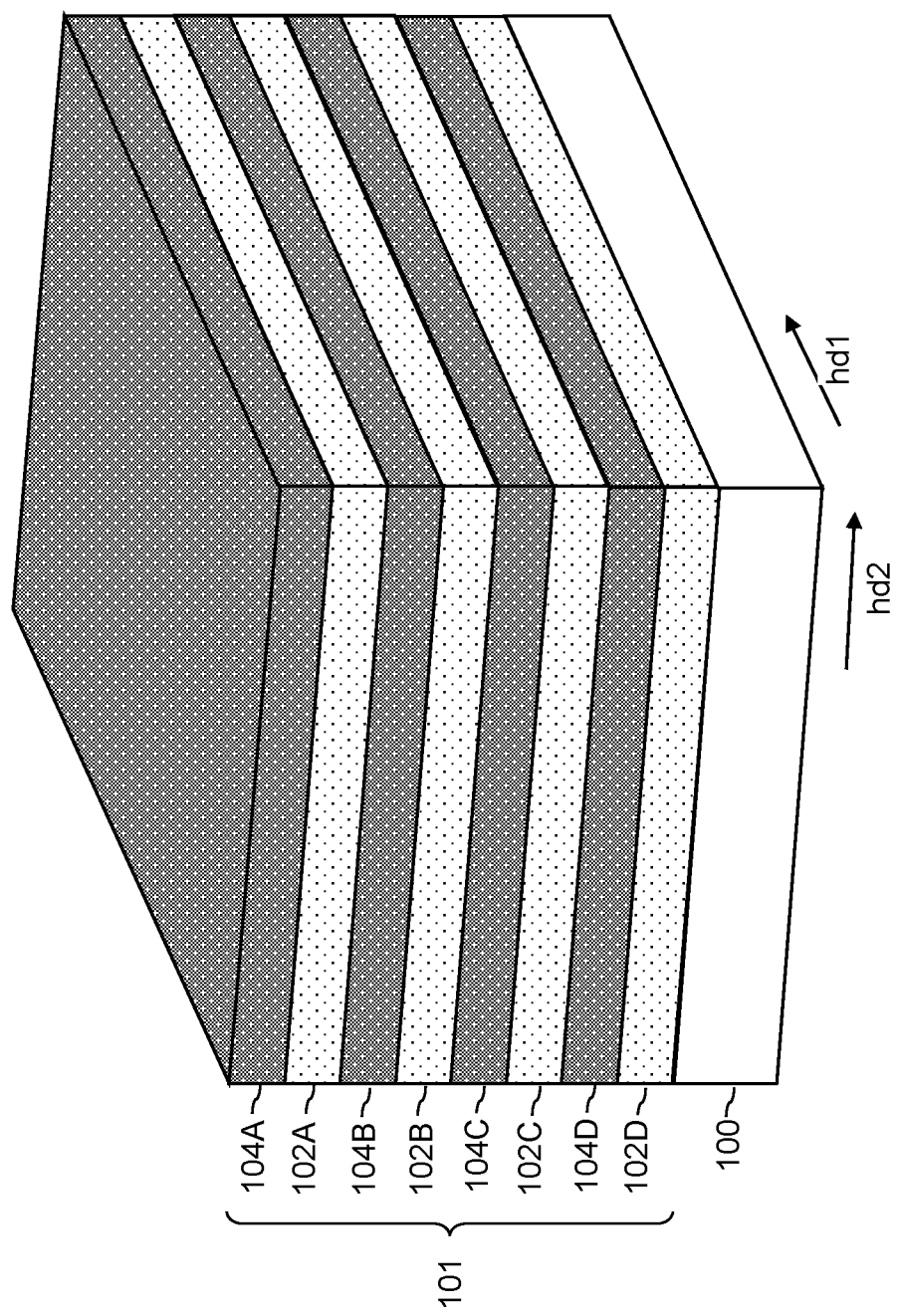

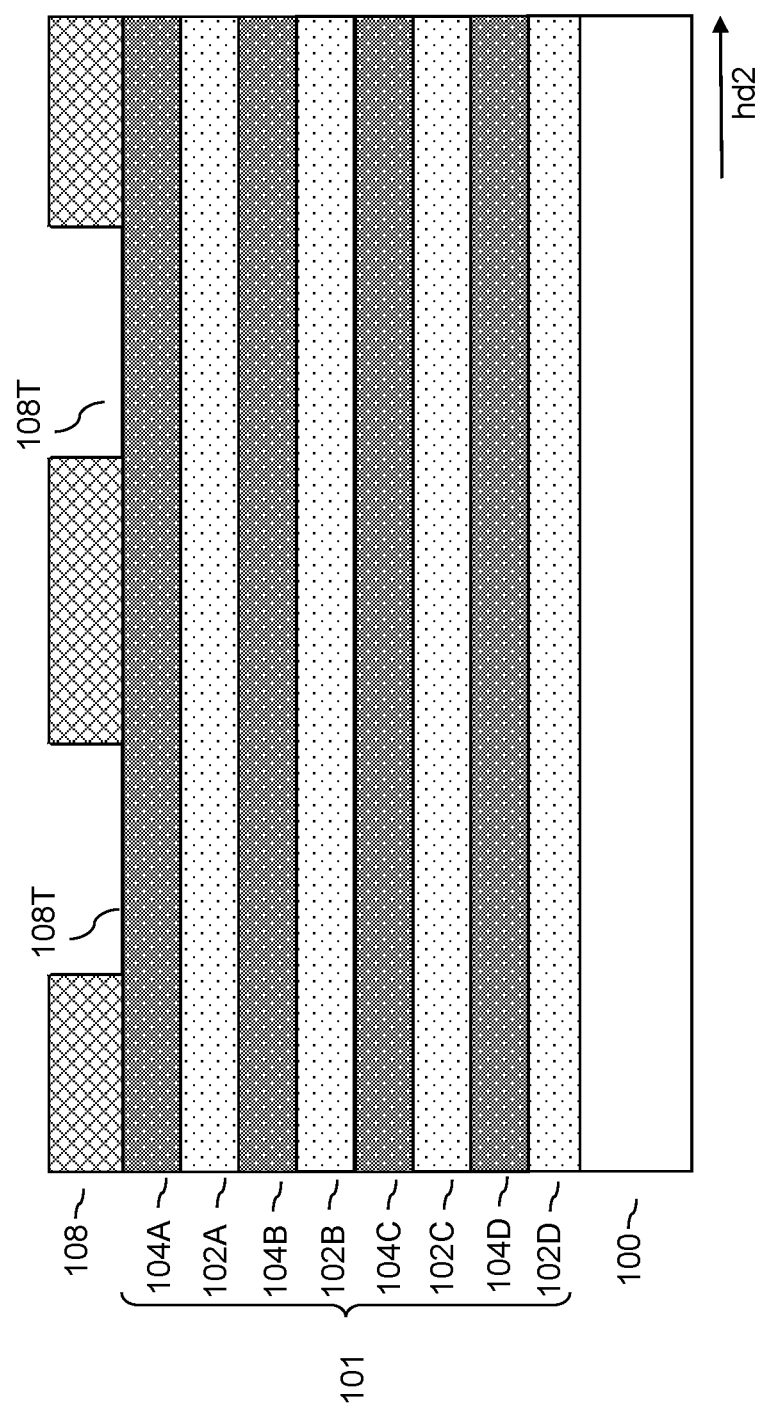

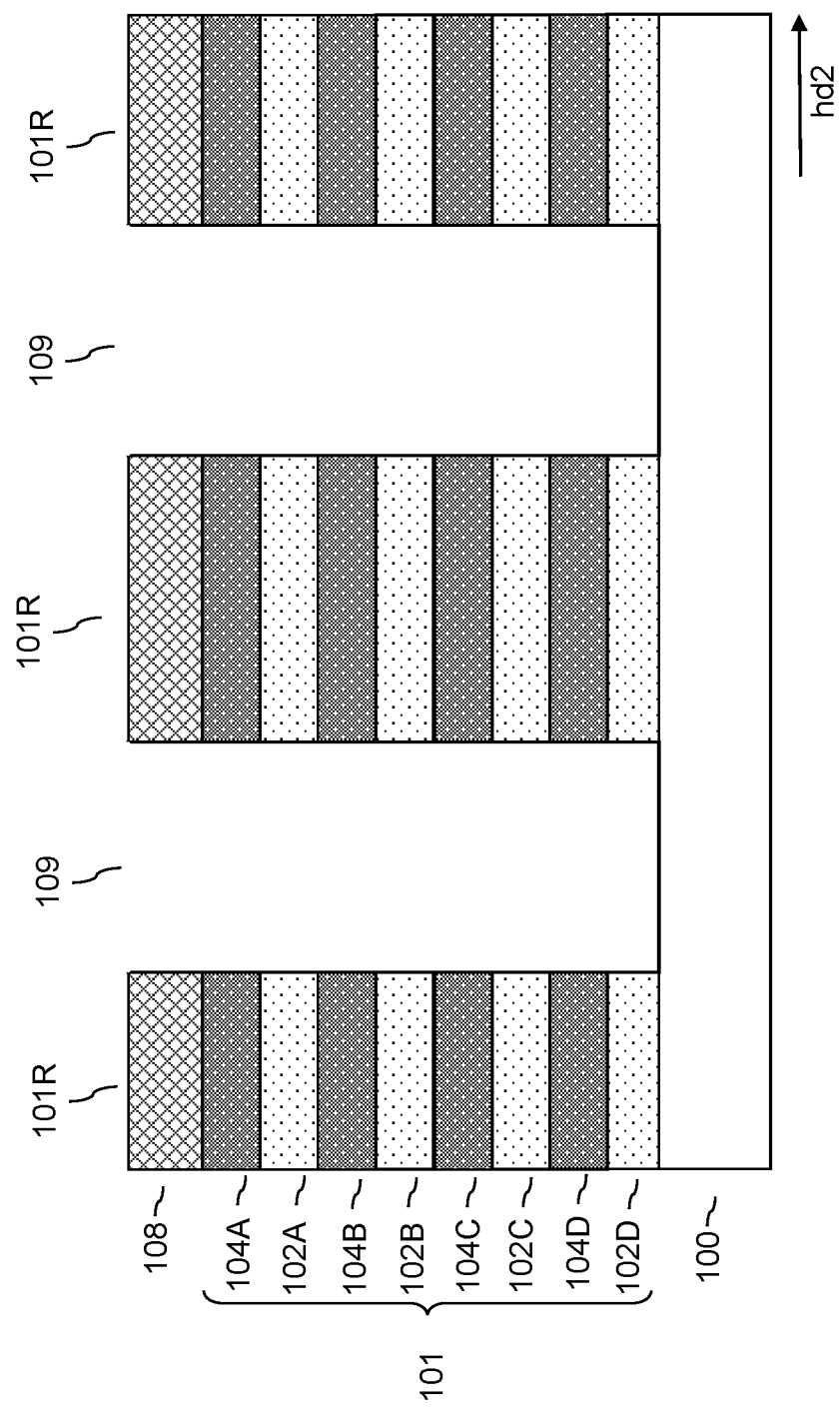

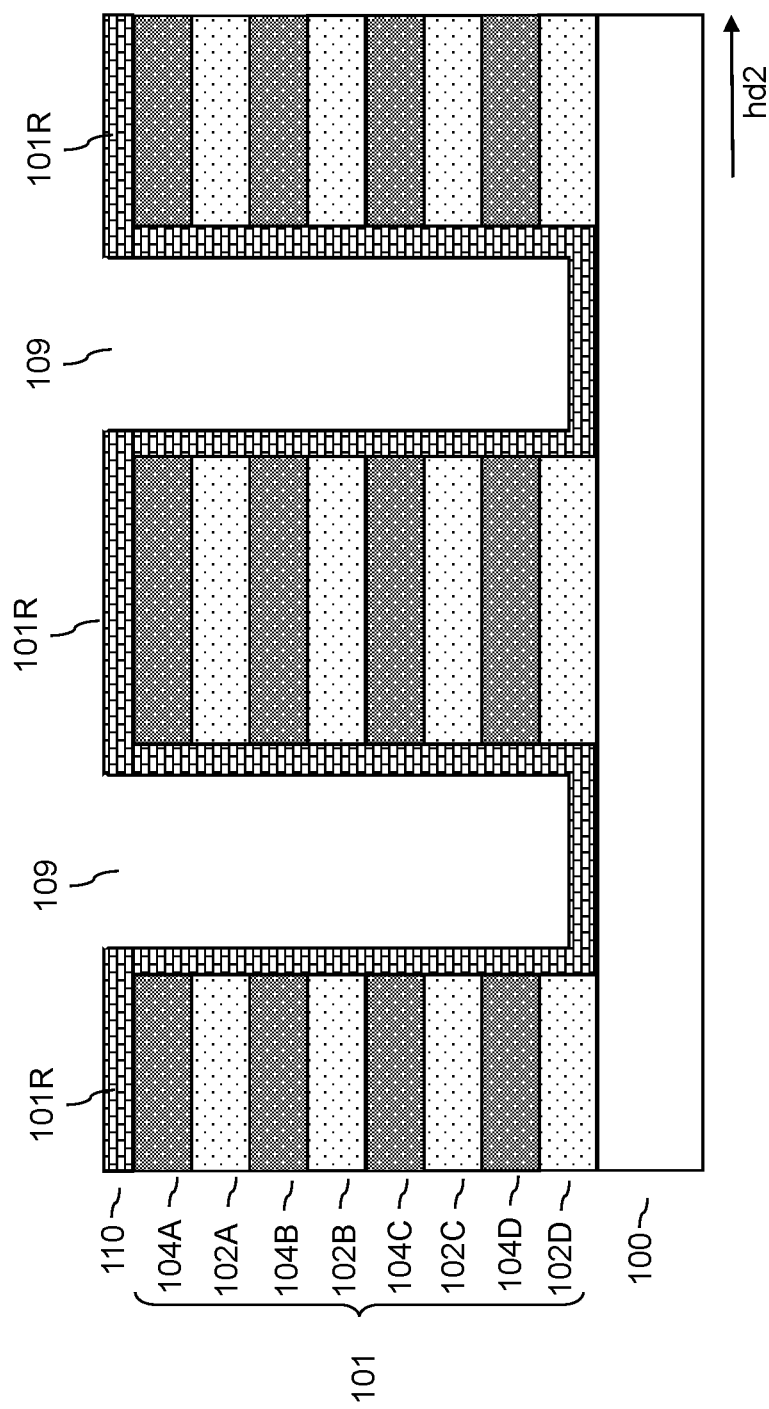

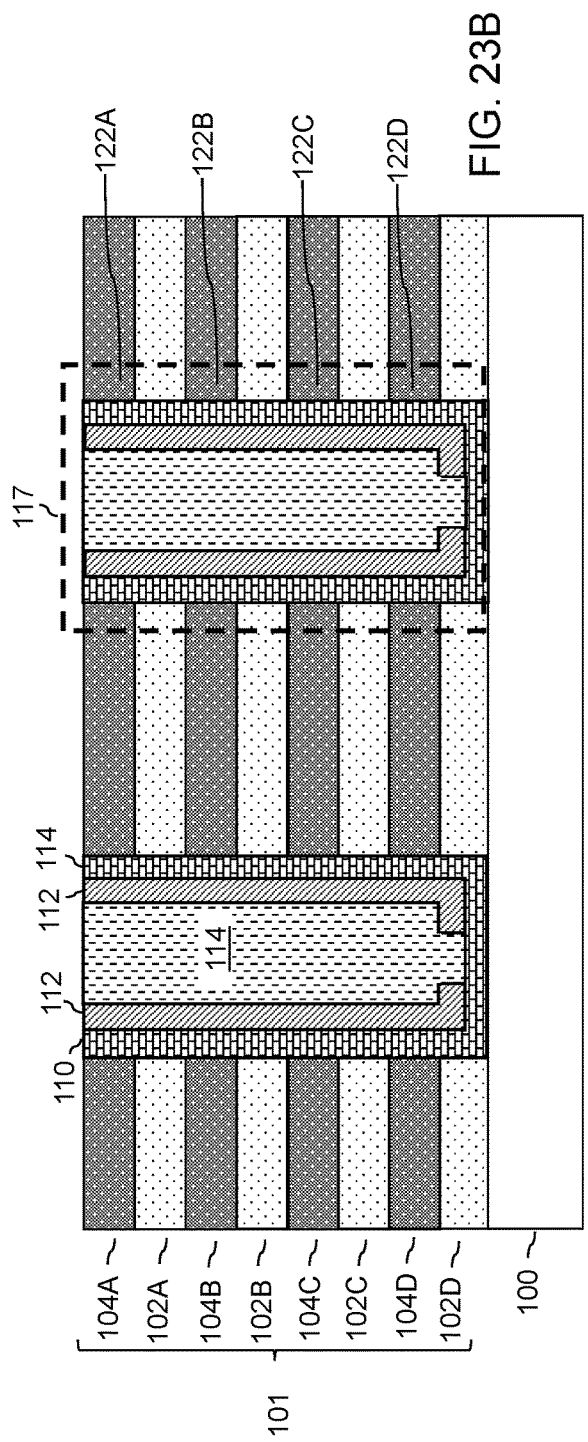
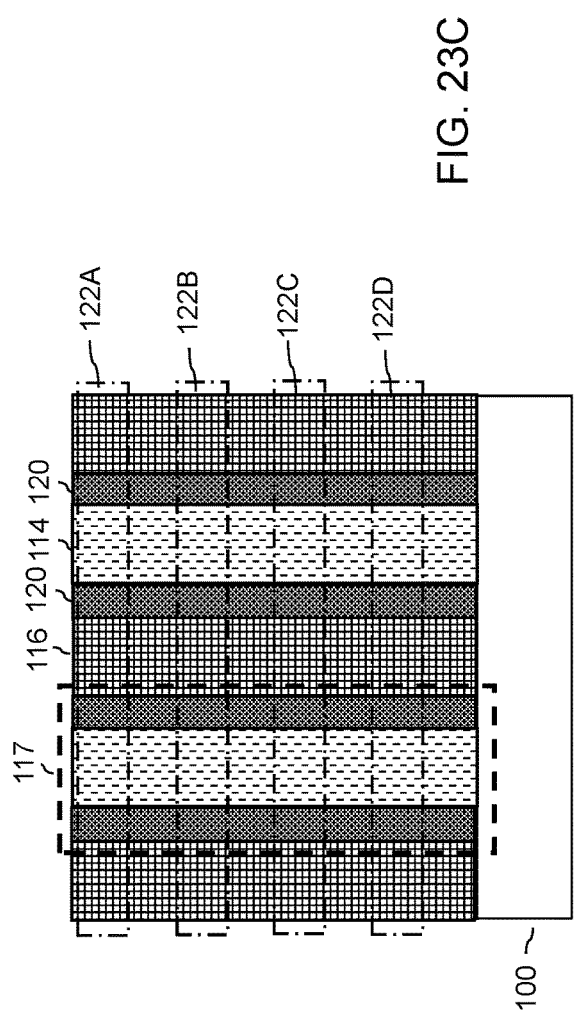
FIG. 23B
FIG. 23C

OXIDE SEMICONDUCTOR TRANSISTOR STRUCTURE IN 3-D DEVICE AND METHODS FOR FORMING THE SAME

RELATED APPLICATIONS

This application is a continuation of U.S. patent application Ser. No. 17/230,624, entitled "Oxide Semiconductor Transistor Structure in 3-D Device and Methods of Forming the Same," filed on Apr. 14, 2021, which claims priority to U.S. Provisional Patent Application No. 63/045,370 entitled "Oxide Semiconductor Device And Manufacturing Method Of Oxide Semiconductor Transistor Structure In 3-D Device" filed on Jun. 29, 2020, the entire contents of both of which are hereby incorporated by reference for all purposes.

BACKGROUND

In the semiconductor industry, there is constant desire to increase the areal density of integrated circuits. To do so, individual transistors have become increasingly smaller. To improve device density, smaller transistors such as thin-film transistors (TFTs) become increasingly attractive.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a vertical cross-sectional view of an exemplary structure after formation of complementary metal-oxide-semiconductor (CMOS) transistors, metal interconnect structures embedded in dielectric material layers, and a connection-via-level dielectric material layer according to an embodiment of the present disclosure.

FIG. 1B is a vertical cross-sectional view of the first exemplary structure during formation of the array of fin back gate field effect transistors according to an embodiment of the present disclosure.

FIG. 2C is a perspective view of the intermediate structure illustrated in FIGS. 2A and 2B according to various embodiments of the present disclosure.

FIG. 11 is a vertical cross-sectional view of the intermediate structure of FIG. 10B with the hard mask layer patterned and the photoresist layer removed according to various embodiments of the present disclosure.

FIG. 12 is a vertical cross-sectional view of the intermediate structure of FIG. 11 after etching the stack of alternating conductive and dielectric layers using the patterned hard mask according to various embodiments of the present disclosure.

FIG. 13 is a vertical cross-sectional view of the intermediate structure of FIG. 12 after conformally depositing a dielectric layer over the surface of the intermediate structure illustrated in FIG. 12 according to various embodiments of the present disclosure.

FIG. 23B is a vertical cross sectional view through the plane AA' of FIG. 23A.

FIG. 23C is a vertical cross sectional view through the line BB' of FIG. 23A.

DETAILED DESCRIPTION

Figure 1C:
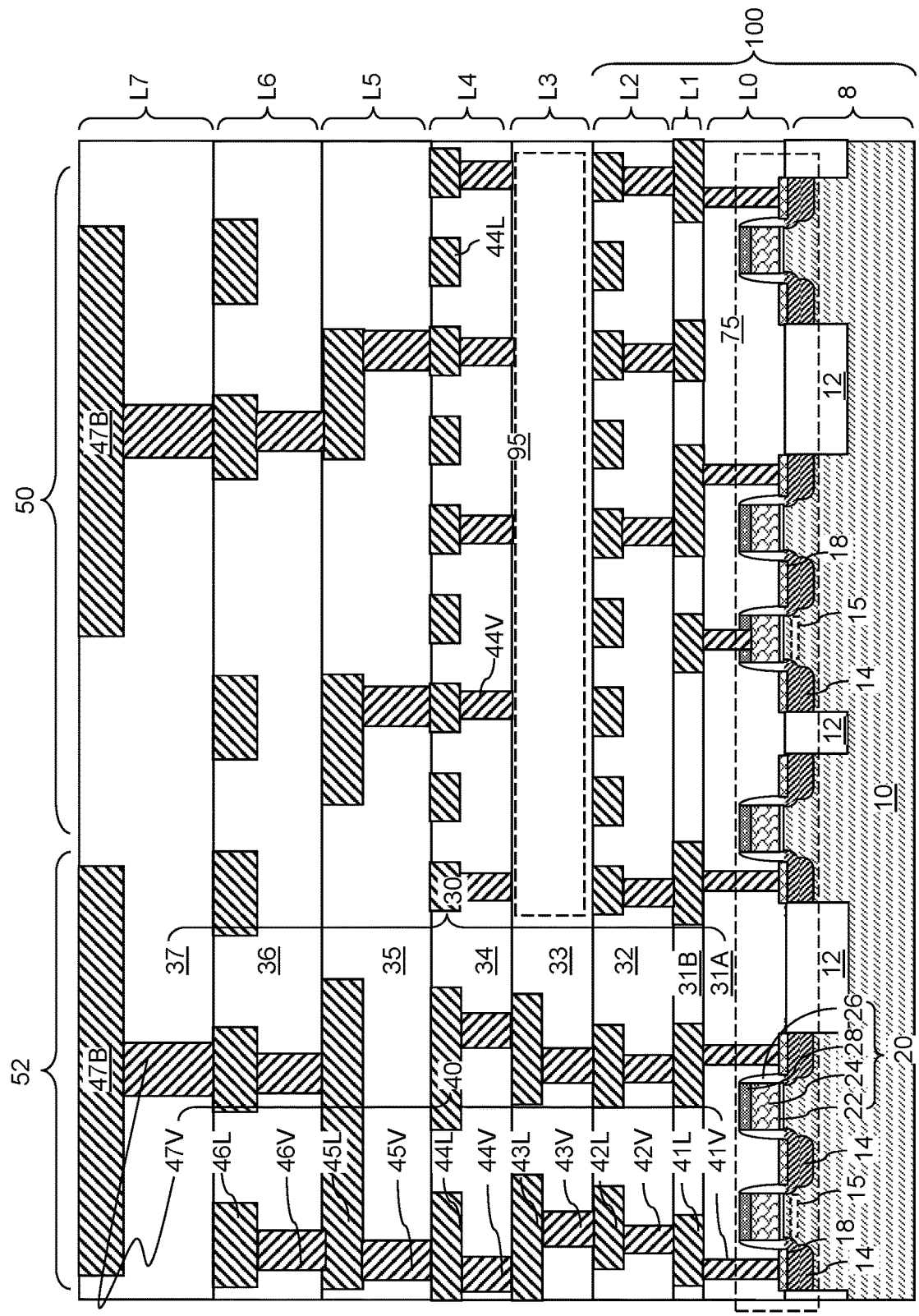
FIG. 1C is a vertical cross-sectional view of the first exemplary structure after formation of upper-level metal interconnect structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and in particular, embodiments of the present disclosure are drawn to field effect transistors with oxide semiconductor channel layers. Specifically, embodiments are drawn to field effect transistors with multilayer oxide semiconductor channel layers. In various embodiments, the multilayer oxide semiconductor channel layer includes a first oxide semiconductor layer having a first oxygen concentration, a second oxide semiconductor layer having a second oxygen concentration and a third oxide semiconductor layer having a third oxygen concentration. In various embodiments, the second oxide semiconductor layer is located between the first oxide semiconductor layer and the third oxide semiconductor layer and the second oxygen concentration is lower than the first oxygen concentration or the third oxygen concentration. In various embodiments, the first oxygen concentration and the third oxygen concentration may be the same.

Oxide semiconductor (OS) is known to have high tunability of carrier concentrations under the control of electric fields. In addition, oxide semiconductor materials may have a high mobility for high speed driving and utilize low current for low power consumption under the control of an electric field. In light of this characteristic, metal oxide semiconducting (OS) materials may be applied in transistor devices and may be used as a channel material in a transistor device. For example, thin film transistors (TFTs) may be an example of a transistor device that use OS materials such as indium gallium zinc oxide (IGZO). Such transistors may provide higher refresh rates and lower power consumption. However, carrier traps may be generated at the interfaces between the oxide semiconductor channel layer and adjacent oxide dielectric layers due to the formation of physical defects in the oxide semiconductor channel layer and/or the adjacent oxide layers. The carrier traps that form at the interface of the oxide semiconductor channel layer and adjacent oxide dielectric layers may deteriorate the subthreshold swing (SS) and large hysteresis characteristic of the formed transistor device. As a consequence of charge trapping, there may be an increase in resistance and threshold voltage (the voltage needed for the transistor to conduct), and a decrease in drain current in a transistor. The increase in resistance and threshold voltage degrades the transistor performance over time, until ultimately the thresholds collapse. Thus, it would be advantageous to have an oxide semiconductor transistor with fewer carrier traps at the interfaces between the oxide semiconductor channel layer and adjacent oxide dielectric layers.

Accordingly, various embodiments disclosed herein provide a multilayer channel layer having different oxygen levels that reduces interfacial carrier traps by suppressing the interaction between the oxide semiconductor channel layer and adjacent dielectric oxide layers. The multi-layer channel structure may have fewer carrier traps due to the suppression of the interaction between the OS structure and adjacent oxide layer. Further, the multilayer channel layer may enhance to low hysteresis characteristics of the device as the small-signal RF characteristics due to gate swing bias. By varying the amount of oxygen in each layer, the carrier concentration may by similarly varied. By decreasing the oxygen concentration in in a layer of the multi-layer channel structure, the carrier concentration may be increased. Carrier concentration control may be an important factor in contributing to mobility and driving speed of the oxide semiconductor device. However, as device decrease in size and with the overall decrease in size, the channel length is reduced, the short channel effect may become more significant. The varying oxygen concentration of embodiment multilayer channel devices may be detected and confirmed by secondary ion mass spectroscopy (SIMS).

Further embodiments include an oxide semiconductor channel having a carrier concentration that increases in accordance with a gradient profile as a function of increasing depth from a surface of the channel. Control of the carrier concentration of an oxide semiconductor channel is an important factor for mobility and driving speed of a transistor device. However, with increasing reduction of channel lengths, the short channel effect has become more significant. Existing oxide semiconductor transistor devices are unable to take full advantage of the increment of high carrier concentration to ultra-fast driving speeds because a high carrier concentration (e.g., over $10^{18}$ cm$^{-3}$) may result from the generation of oxygen vacancies which can result in the creation of unwanted conductive pathways across the short channel length between the source and drain electrodes. One or more materials of the oxide semiconductor material, such as indium, may also segregate to the surface of the channel layer, which may contribute to excessive generation of oxygen vacancies near the channel surface. This may negatively affect device reliability. However, at lower carrier concentrations (e.g., less than $10^{13}$ cm$^{-3}$), there is a larger positive threshold voltage shift and lower Ion current, which can also negatively impact the performance of the transistor device.

Accordingly, various embodiments disclosed herein provide a channel layer having a carrier concentration that increases in accordance with a gradient profile as a function of increasing depth from a surface of the channel layer. In embodiments, the surface of the channel layer may electrically contact respective source and drain electrodes (e.g., a source line and bit line) of a transistor device. In various embodiments, the carrier concentration throughout the channel layer may vary within a range between $1\times10^{11}$ cm$^{-3}$ and $1\times10^{21}$ cm$^{-3}$. In various embodiments, channel layer may have an oxygen vacancy concentration that increases in accordance with a gradient profile as a function of increasing depth from the surface of the channel layer. By providing a channel layer for a transistor device having a carrier concentration that increases in accordance with a gradient profile as a function of increasing depth from a surface of the channel layer, the transistor device may have a small positive threshold voltage shift and high Ion current, and may enable ultra fast driving, while avoiding the formation of unwanted conductive paths through the channel due to the short channel effect. In some applications, transistors may be fabricated in a BEOL position. By fabricating the transistors in the BEOL position, functionality may be added at the BEOL while valuable chip area may be made available in the FEOL. Moreover, transistors that use metal oxide semiconductors may be an attractive option for BEOL integration since such transistors may be processed at low temperatures and thus, will not damage previously fabricated devices. While fabricating transistors in the BEOL protects the transistors from a number of harsh conditions, BEOL transistors may still be subject to gases in the ambient environment during the formation of other BEOL devices. For example, BEOL transistor may be exposed to plasma and air in the ambient environment.

FIG. 1A is a vertical cross-section view of an exemplary lower level device structure 100 after formation of complementary metal-oxide-semiconductor (CMOS) transistors and metal interconnect structures formed in dielectric layers according to an embodiment of the present disclosure. Referring to FIG. 1A, a first exemplary structure according to an embodiment of the present disclosure is illustrated prior to formation of an array of memory structures, according to various embodiments of the present disclosure. The first exemplary lower level device structure 100 includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). The exemplary structure may include various devices regions, which may include a memory array region 50 in which at least one array of non-volatile memory cells may be subsequently formed.

For example, the at least one array of non-volatile memory cells may include three-dimensional (3D) memory structures as those described in more detail below. The at least one array of non-volatile memory cells may include resistive random-access memory (RRAM or ReRAM), magnetic/magneto-resistive random-access memory (MRAM), ferroelectric random-access memory (FeRAM), and phase-change memory (PCM) devices. The exemplary structure may also include a peripheral logic region 52 in which electrical connections between each array of non-volatile memory cells and a peripheral circuit including field effect transistors may be subsequently formed. Areas of the memory array region 50 and the logic region 52 may be employed to form various elements of the peripheral circuit.

Semiconductor devices such as field effect transistors (FETs) may be formed on, and/or in, the semiconductor material layer 10 during a FEOL operation. For example, shallow trench isolation structures 12 may be formed in an upper portion of the semiconductor material layer 10 by forming shallow trenches and subsequently filling the shallow trenches with a dielectric material such as silicon oxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer.

Each gate structure 20 may include a vertical stack of a gate dielectric 22, a gate electrode 24, and a gate cap dielectric 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed that use the gate structures 20 as self-aligned implantation masks to form deep active regions. Such deep active regions may include deep source regions and deep drain regions. Upper portions of the deep active regions may overlap with portions of the extension implantation regions. Each combination of an extension implantation region and a deep active region may constitute an active region 14, which may be a source region or a drain region depending on electrical biasing. A semiconductor channel 15 may be formed underneath each gate stack (22, 24, 28) between a neighboring pair of active regions 14. Metal-semiconductor alloy regions 18 may be formed on the top surface of each active region 14. Field effect transistors may be formed on the semiconductor material layer 10. Each field effect transistor may include a gate structure 20, a semiconductor channel 15, a pair of active regions 14 (one of which functions as a source region and another of which functions as a drain region), and optional metal-semiconductor alloy regions 18. Complementary metal-oxide-semiconductor (CMOS) circuits 75 may be provided on the semiconductor material layer 10, which may include a periphery circuit for the array(s) of transistors such as thin film transistors to be subsequently formed.

Various interconnect-level structures may be subsequently formed, which are formed prior to formation of an array of field effect transistors and are herein referred to as lower interconnect-level structures (L0, L1, L2). In case a two-dimensional array of transistors is to be subsequently formed over two levels of interconnect-level metal lines, the lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 includes a first interconnect level dielectric layer 31B and first metal lines 41L formed within the first interconnect level dielectric layer 31B. The first interconnect level dielectric layer 31B is also referred to as a first line-level dielectric layer. The first metal lines 41L may contact a respective one of the contact via structures 41V. The second interconnect-level structure L2 includes a second interconnect level dielectric layer 32, which may include a stack of a first via-level dielectric material layer and a second line-level dielectric material layer or a line-and-via-level dielectric material layer. The second interconnect level dielectric layer 32 may have formed there within second interconnect-level metal interconnect structures (42V, 42L), which includes first metal via structures 42V and second metal lines 42L. Top surfaces of the second metal lines 42L may be coplanar with the top surface of the second interconnect level dielectric layer 32.

Referring to FIG. 1B, an array 95 of non-volatile memory cells and selector devices may be formed in the memory array region 50 over the second interconnect-level structure L2. The details for the structure and the processing steps for the array 95 of non-volatile memory cells and selector devices are subsequently described in detail below. A third interconnect level dielectric layer 33 may be formed during formation of the array 95 of non-volatile memory cells and selector devices. The set of all structures formed at the level of the array 95 of non-volatile memory cells and selector devices transistors is herein referred to as a third interconnect-level structure L3.

Referring to FIG. 1C, third interconnect-level metal interconnect structures (43V, 43L) may be formed in the third interconnect level dielectric layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth interconnect level dielectric layer 34 having formed therein fourth interconnect-level metal interconnect structures (44V, 44L), which may include third metal via structures 44V and fourth metal lines 44L. The fifth interconnect-level structure L5 may include a fifth interconnect level dielectric layer 35 having formed therein fifth interconnect-level metal interconnect structures (45V, 45L), which may include fourth metal via structures 45V and fifth metal lines 45L. The sixth interconnect-level structure L6 may include a sixth interconnect level dielectric layer 36 having formed therein sixth interconnect-level metal interconnect structures (46V, 46L), which may include fifth metal via structures 46V and sixth metal lines 46L. The seventh interconnect-level structure L7 may include a seventh interconnect level dielectric layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding), or may be configured for metal-to-metal bonding (such as copper-to-copper bonding).

Each interconnect level dielectric layer may be referred to as an interconnect level dielectric (ILD) layer 30. Each interconnect-level metal interconnect structures may be referred to as a metal interconnect structure 40. Each contiguous combination of a metal via structure and an overlying metal line located within a same interconnect-level structure (L2-L7) may be formed sequentially as two distinct structures by employing two single damascene processes, or may be simultaneously formed as a unitary structure employing a dual damascene process. Each of the metal interconnect structure 40 may include a respective metallic liner (such as a layer of TiN, TaN, or WN having a thickness in a range from 2 nm to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop dielectric layers and dielectric capping layers may be inserted between vertically neighboring pairs of ILD layers 30, or may be incorporated into one or more of the ILD layers 30.

While the present disclosure is described employing an embodiment in which the array 95 of non-volatile memory cells and selector devices may be formed as a component of a third interconnect-level structure L3, embodiments are expressly contemplated herein in which the array 95 of non-volatile memory cells and selector devices may be formed as components of any other interconnect-level structure (e.g., L1-L7). Further, while the present disclosure is described using an embodiment in which a set of eight interconnect-level structures are formed, embodiments are expressly contemplated herein in which a different number of interconnect-level structures is used. In addition, embodiments are expressly contemplated herein in which two or more arrays 95 of non-volatile memory cells and selector devices may be provided within multiple interconnect-level structures in the memory array region 50. While the present disclosure is described employing an embodiment in which an array 95 of non-volatile memory cells and selector devices may be formed in a single interconnect-level structure, embodiments are expressly contemplated herein in which an array 95 of non-volatile memory cells and selector devices may be formed over two vertically adjoining interconnect-level structures.

Figure 2A:
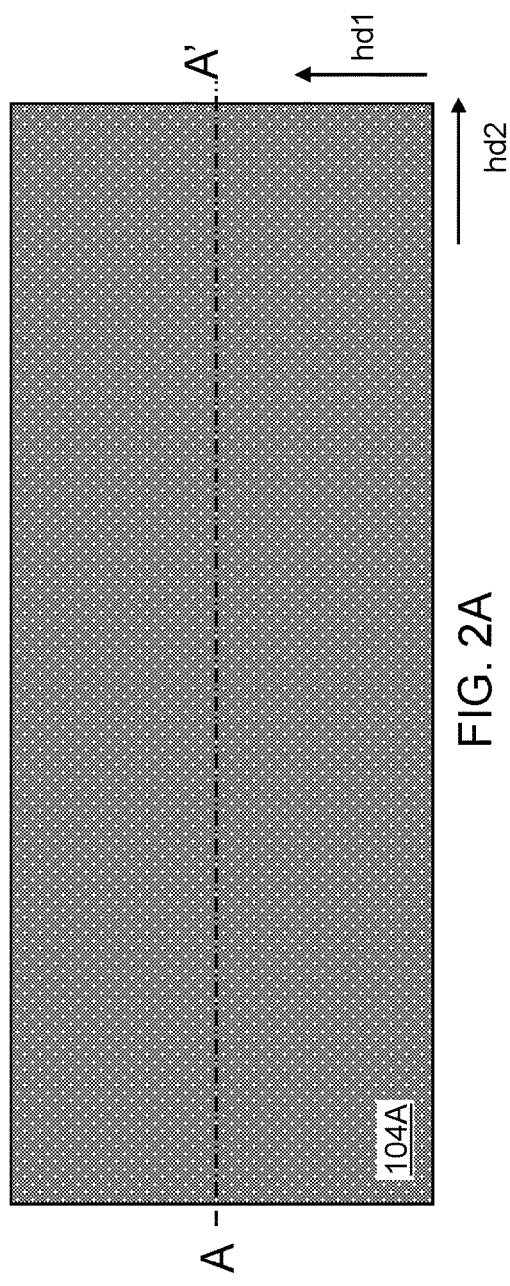
FIG. 2A is a plan view of an intermediate structure of a transistor after the deposition of a stack of alternating conductive and dielectric layers over a substrate according to various embodiments of the present disclosure.
Figure 2B:
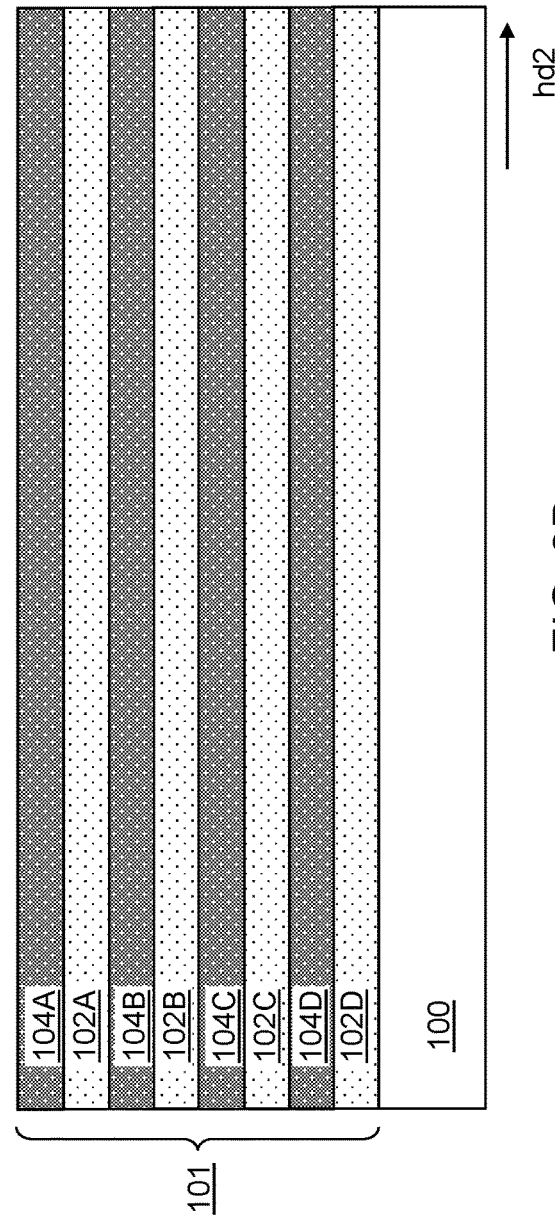
FIG. 2B is a vertical cross-sectional view taken along line A-A' of FIG. 2A according to various embodiments of the present disclosure.

FIG. 2A is a plan view of an intermediate structure of a transistor after the deposition of a stack 101 of alternating conductive layers 104A-104D and dielectric layers 102A-102D over a substrate 100 (or lower level device structure 100) while FIG. 2B is a vertical cross-sectional view taken along line A-A' of FIG. 2A according to various embodiments of the present disclosure. FIG. 2C is a perspective view of the intermediate structure. As illustrated in FIG. 2A, in addition to vertical stacking direction, a first horizontal direction hd1 and a second horizontal direction hd1 may be defined to aid in describing the following process steps. In embodiments in which the transistor stack is deposited over a substrate 100, the substrate 100 may be made of any suitable material, such as silicon, a compound semiconductor, glass or any other suitable material. The conductive layers 104A-104D of the stack 101 may include a metallic material such as a conductive metallic nitride (such as TiN, TaN or WN) or a combination of a conductive metallic nitride and an elemental metal, such as W, Cu, Co, Mo, or Ru. The conductive layers 104A-104D may be formed by chemical vapor deposition, (CVD), physical vapor deposition (PVD), plasma enhanced chemical vapor deposition (PECVD), atomic layer deposition (ALD) or any other suitable method.

FIG. 2A is a plan view of an intermediate structure of a transistor after the deposition of a stack 101 of alternating conductive layers 104A-104D and dielectric layers 102A-104A over a substrate 100 (or lower level device structure 100) while FIG. 2B is a vertical cross-sectional view taken along line A-A' of FIG. 2A according to various embodiments of the present disclosure. FIG. 2C is a perspective view of the intermediate structure. As illustrated in FIG. 2A, in addition to vertical stacking direction, a first horizontal direction hd1 and a second horizontal direction hd1 may be defined to aid in describing the following process steps. In embodiments in which the transistor stack is deposited over a substrate 100, the substrate 100 may be made of any suitable material, such as silicon, a compound semiconductor, glass or any other suitable material. The conductive layers 104A-104D of the stack 101 may include a metallic material such as a conductive metallic nitride (such as TiN, TaN or WN) or a combination of a conductive metallic nitride and an elemental metal, such as W, Cu, Co, Mo, or Ru. The conductive layers 104A-104D may be formed by chemical vapor deposition, (CVD), physical vapor deposition (PVD), plasma enhanced chemical vapor deposition (PECVD), atomic layer deposition (ALD) or any other suitable method. The dielectric layers 102A-102D may include silicon oxide, silicon oxynitride, and/or a low-k dielectric material such as organosilicate glass or any other suitable dielectric material. The dielectric layers 102A-102D may be formed by CVD, PVD, PECVD, ALD or any other suitable method.

Figure 3:
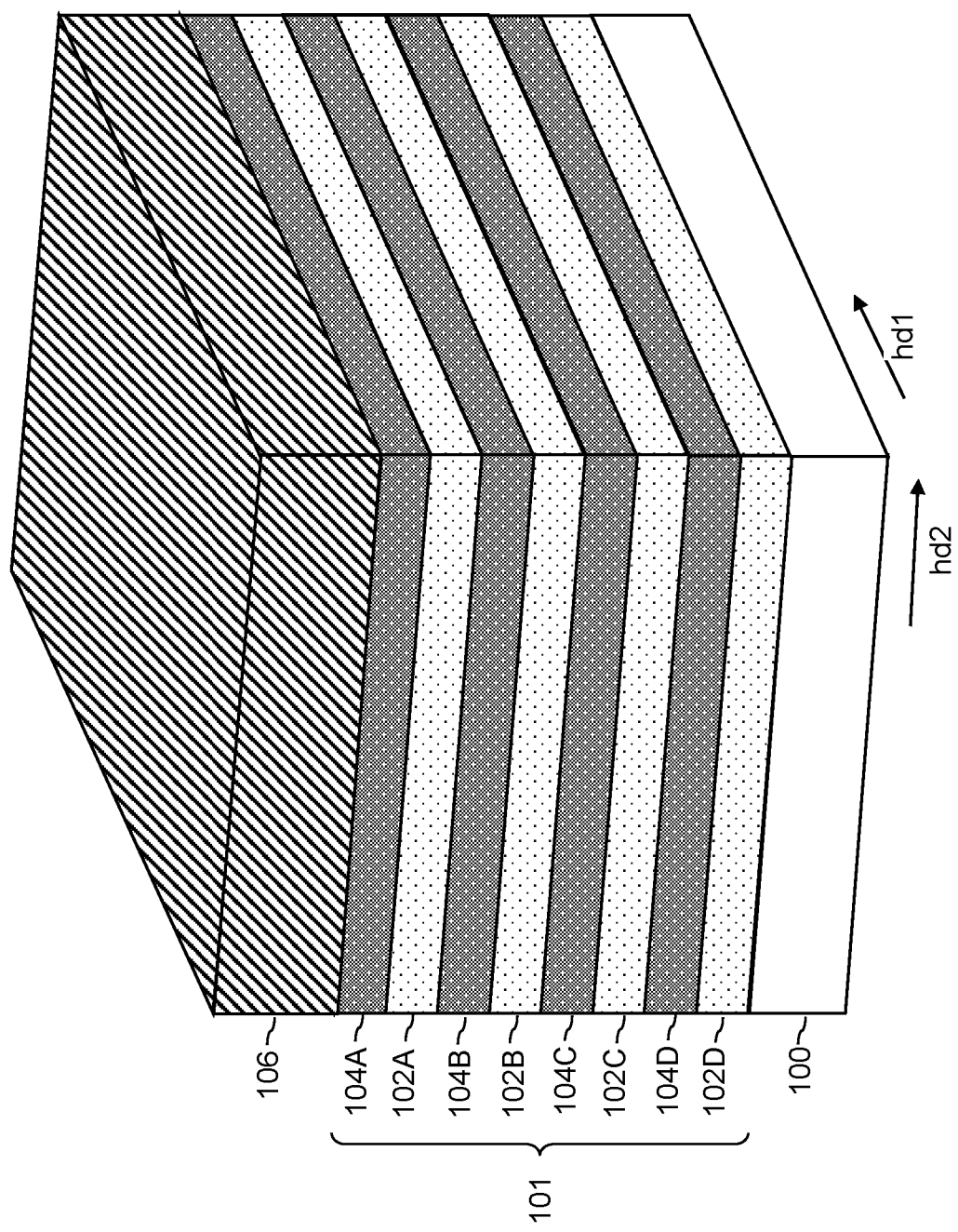
FIG. 3 is a perspective view of the intermediate structure of FIG. 2C with a photoresist layer formed thereon according to various embodiments of the present disclosure.

FIG. 3 is a perspective view of the intermediate structure of FIG. 1C with a photoresist layer formed thereon according to various embodiments of the present disclosure. Referring to FIG. 3, a photoresist layer 106 may be deposited over the intermediate structure illustrated in FIGS. 2A-2C. The photoresist layer 106 may be either a positive or a negative photoresist material. A positive photoresist material is a type of photoresist material in which the portion of the photoresist layer 106 that is exposed to light becomes soluble to a photoresist developer. The unexposed portion of the photoresist layer 106 remains insoluble to the photoresist developer. A negative photoresist material is a type of photoresist material in which the portion of the photoresist layer 106 that is exposed to light becomes insoluble to the photoresist developer. To transfer the pattern to the photoresist layer 106, the unexposed portion of the photoresist layer 106 may be dissolved by the photoresist developer.

Figure 4:
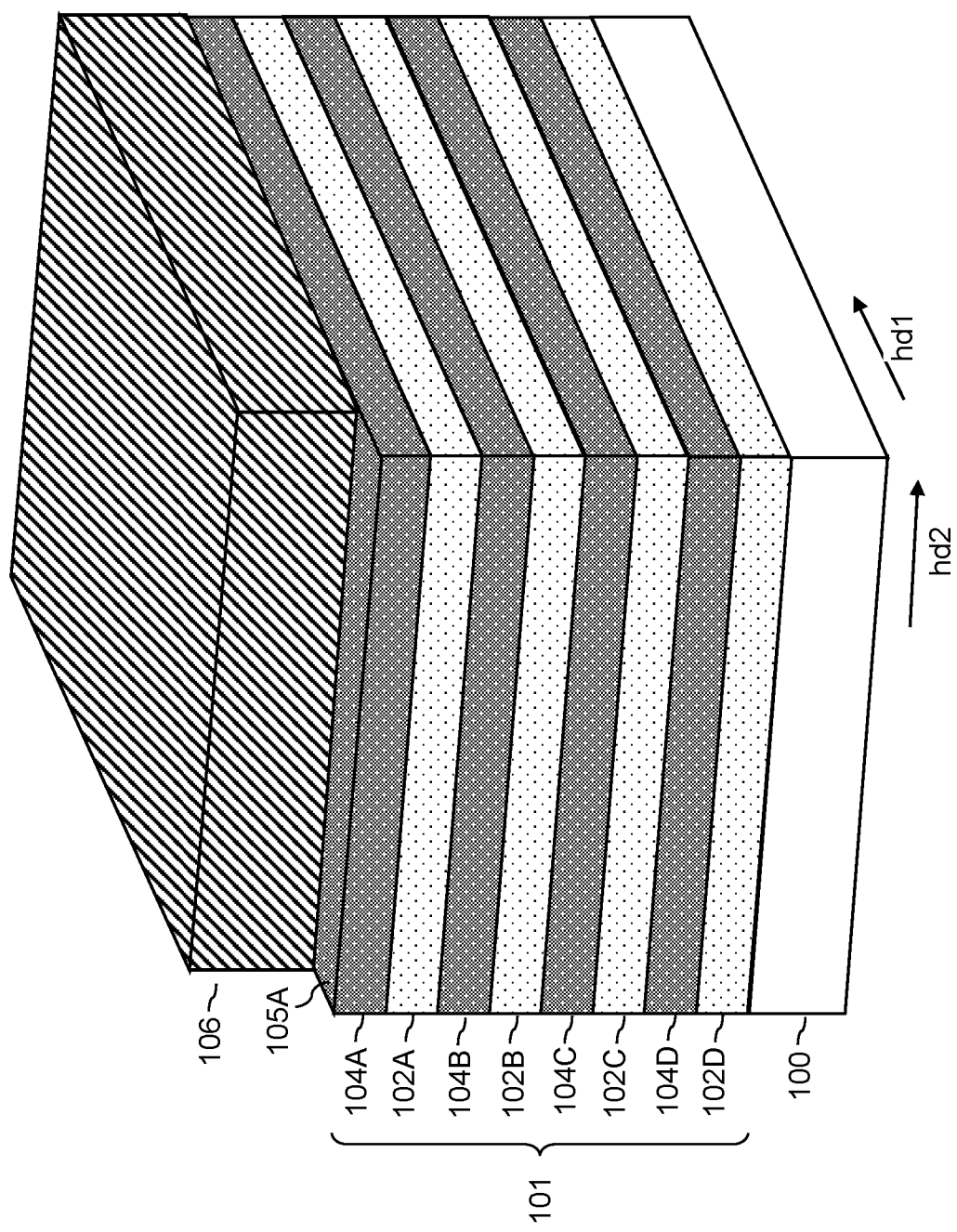
FIG. 4 is a perspective view of the intermediate structure of FIG. 3 with the photoresist layer patterned to expose a portion of the top conductive layer of the stack of alternating conductive and dielectric layers according to various embodiments of the present disclosure.

FIG. 4 is a perspective view of the intermediate structure of FIG. 3 with the photoresist layer patterned to expose a portion of the top conductive layer of the stack of alternating conductive and dielectric layers according to various embodiments of the present disclosure. Referring to FIG. 4, the photoresist layer 106 may be patterned to expose a portion 105A of a top surface of a first conductive layer 104A of the stack 101 of conductive layers 104A-104D and dielectric layers 102A-102D. In various embodiments, the exposed portion 105A of the top surface of the first conductive layer 104A has a stripe shape oriented in the second horizontal direction hd2 as illustrated in FIG. 4.

Figure 5:
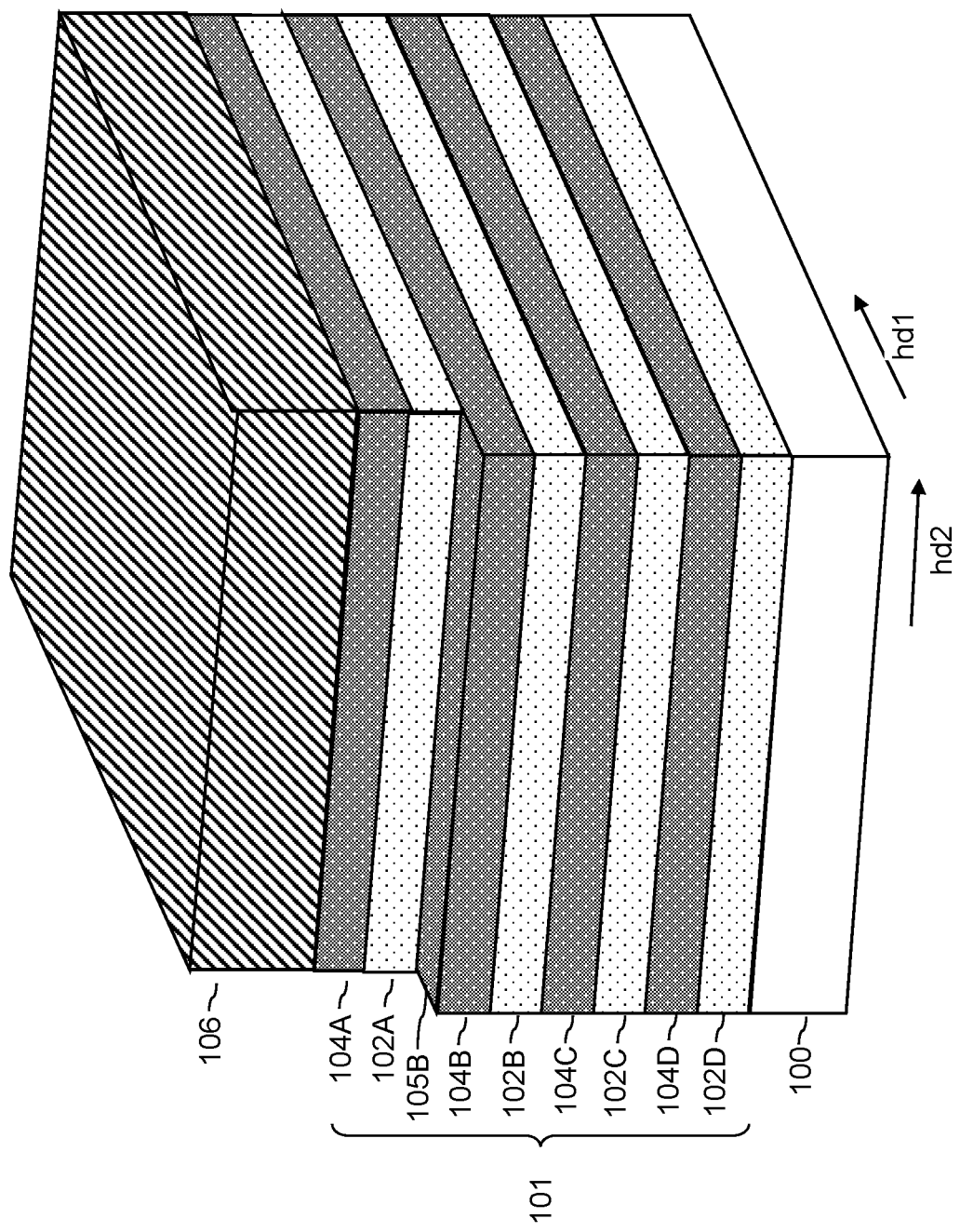
FIG. 5 is a perspective view of the intermediate structure of FIG. 4 with a first conductive layer and a first dielectric layer of the stack of alternating conductive and dielectric layers patterned using the photoresist layer as a mask according to various embodiments of the present disclosure.

FIG. 5 is a perspective view of the intermediate structure of FIG. 4 with a first conductive layer and a first dielectric layer of the stack of alternating conductive and dielectric layers patterned using the photoresist layer as a mask according to various embodiments of the present disclosure. Referring to FIG. 5, the first conductive layer 104A and the first dielectric layer 102A under the first conductive layer 104A may be etched to form a step in the stack 101 of stack of alternating conductive layers 104A-104D and dielectric layers 102A-102D. Etching may be performed in two steps. In a first etching step, the first conductive layer 104A may be selectively etched such that etching stops at the top surface of the first dielectric layer 102A. Next, the first dielectric layer 102A may be selectively etched such that etching stops at the top surface of the second conductive layer 104B in the stack 101 of alternating conductive layers 104A-104D and dielectric layers 102A-102D. As illustrated in FIG. 5, etching of the exposed portion of the first dielectric layer 102A results in the formation of an exposed portion 105B on the top surface of the second conductive layer 104B. In this manner a step may be formed in the stack 101 of alternating conductive layers 104A-104D and dielectric layers 102A-102D in which the exposed portion 105B on the top surface of the second conductive layer 104B has a stripe shape oriented in the second horizontal direction hd2 as illustrated in FIG. 5.

Figure 6:
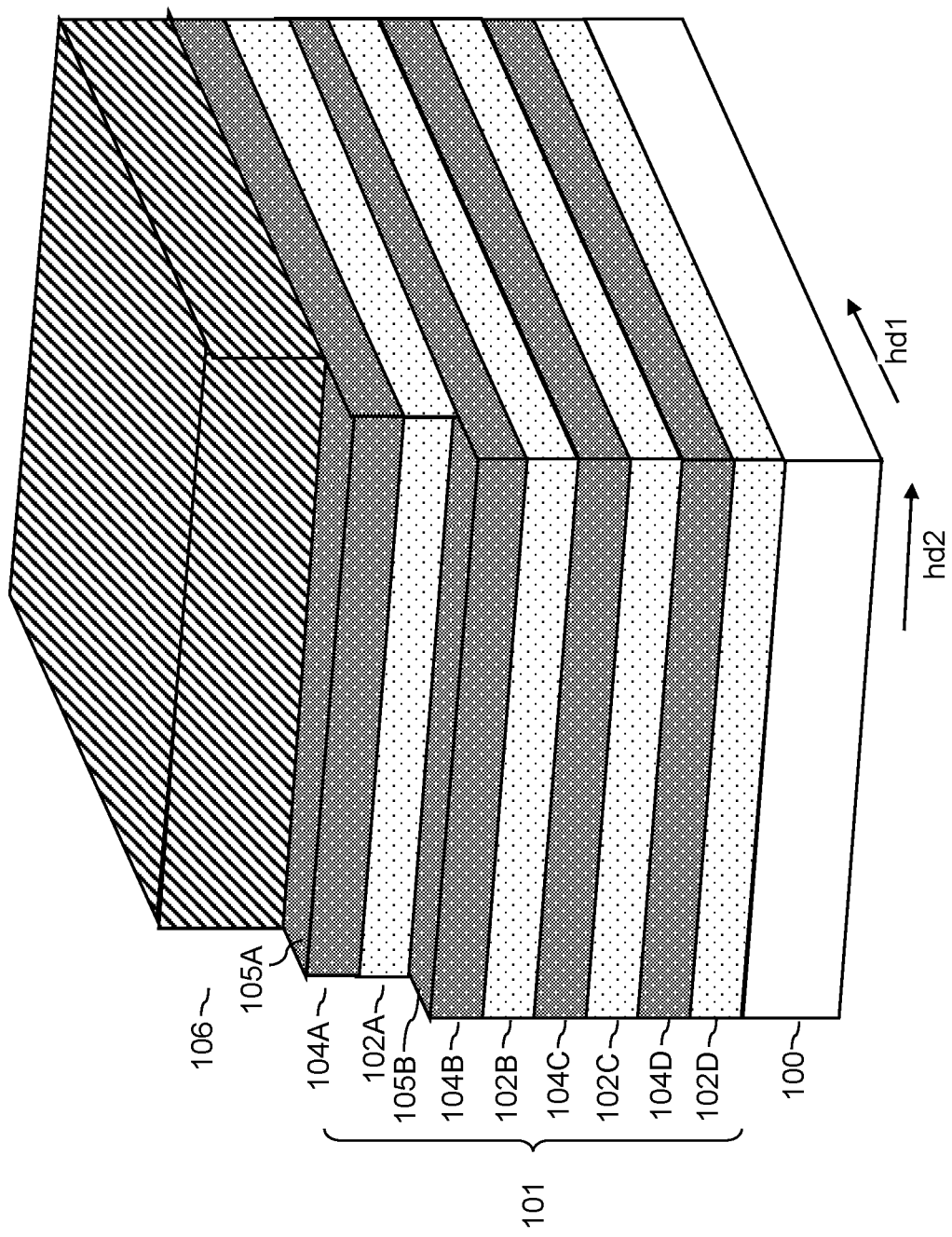
FIG. 6 is perspective view of the intermediate structure of FIG. 5 with the photoresist layer patterned to expose a second portion of the top conductive layer of the stack of alternating conductive and dielectric layers according to various embodiments of the present disclosure.

FIG. 6 is perspective view of the intermediate structure of FIG. 5 with the photoresist layer patterned to expose a second portion of the top conductive layer of the stack of alternating conductive and dielectric layers according to various embodiments of the present disclosure. Referring to FIG. 6, the photoresist layer 106 may be patterned again for form an exposed portion 105A of the top surface of the first conductive layer 104A of the stack 101 in addition to exposed portion 105B of the top surface of the conductive layer 104B of the stack 101. Both the exposed portions 105A and 105B illustrated in FIG. 6 may each have a stripe shape oriented in the second horizontal direction hd2 as illustrated in FIG. 6.

Figure 7:
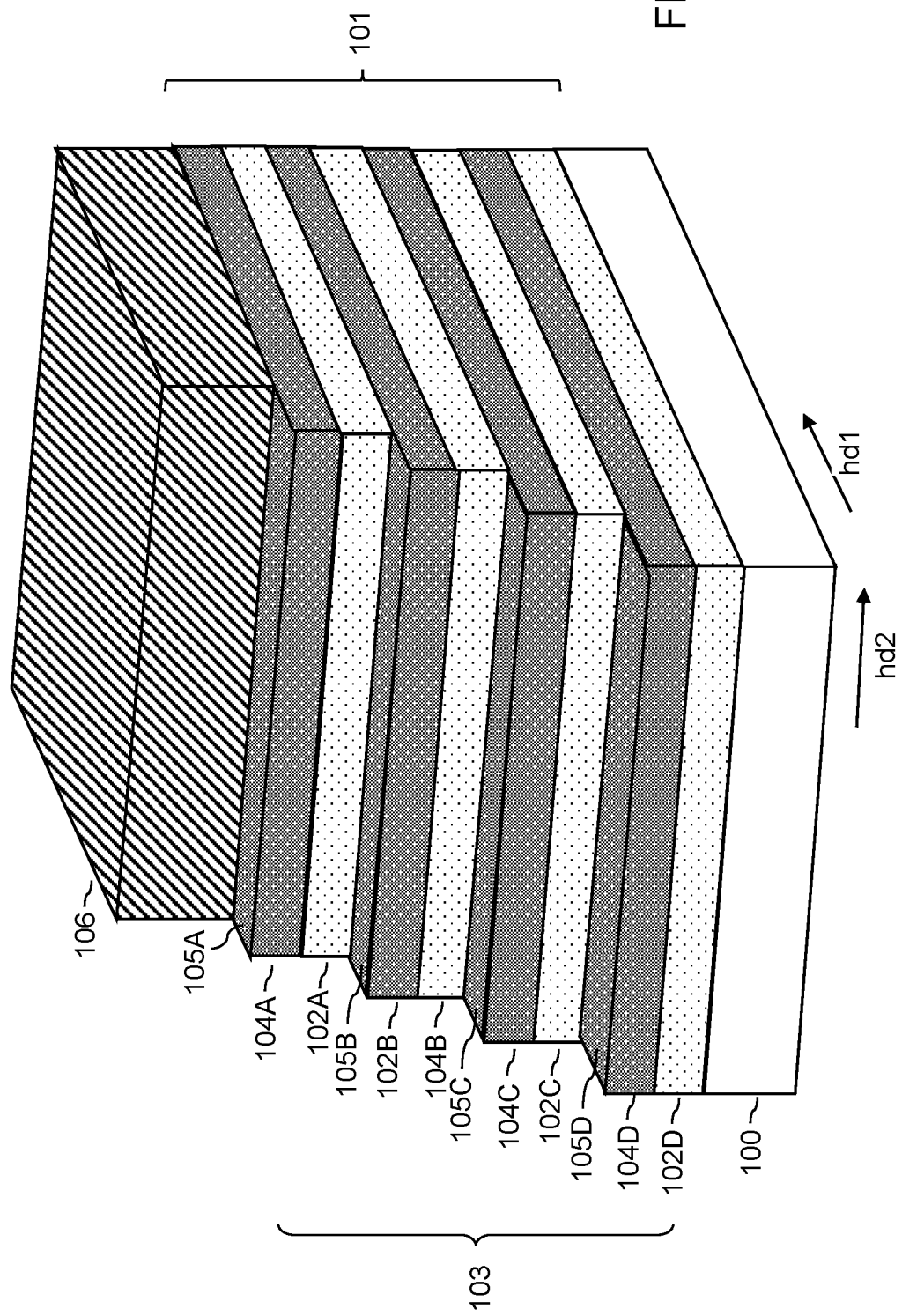
FIG. 7 is a perspective view of an intermediate structure after several patterning and etching steps to form a staircase structure in a portion of the stack of alternating conductive and dielectric layers according to various embodiments of the present disclosure.

FIG. 7 is a perspective view of an intermediate structure after several patterning and etching steps to form a staircase structure in a portion of the stack of alternating conductive and dielectric layers according to various embodiments of the present disclosure. Referring to FIG. 7, the patterning and selective etching processes in FIGS. 4-6 may repeated until an exposed portion 105D of the lowest conductive layer 104 (e.g., 104D) in the stack 101 of conductive layers 104 and dielectric layers 102 is exposed. As the photoresist layer 106 is recessed in each successive step, all of the exposed layers may be selectively etched simultaneously. For example, after recessing the photoresist layer 106 as illustrated in FIG. 6, the next selective etching steps (not illustrated) would result in removal of the exposed portion 105A of the top surface of the first conductive layer 104A as well as the exposed portion 105B of the top surface of the second conductive layer 104B, thereby exposing top surfaces of the underlying third dielectric layer 102C. The process may then be repeated as many times as desired. In this manner, a staircase structure 103 may be formed in the stack 101 of conductive layers 104 and dielectric layers 102. Each step includes an exposed portion 105A-105D of the top surface of a conductive layer 104A-104D as well as an underlying dielectric layer 102A-102D that electrically insulates adjacent conductive layers 104A-104D from each other. As illustrated in FIG. 7, the stack 101 of alternating conductive layers 104A-104D and dielectric layers 102A-102D includes four conductive layers 104A-104D and four dielectric layers 102A-102D. However, this is only for illustration. The stack 101 of alternating conductive layers 104A-104D and dielectric layers 102A-102D may have fewer layers or more layers, such as 2-64 conductive layers 104A-104D and 2-64 dielectric layers 102A-102D, such as 4-32 conductive layers 104A-104D and 4-32 dielectric layers 102A-102D.

Figure 8:
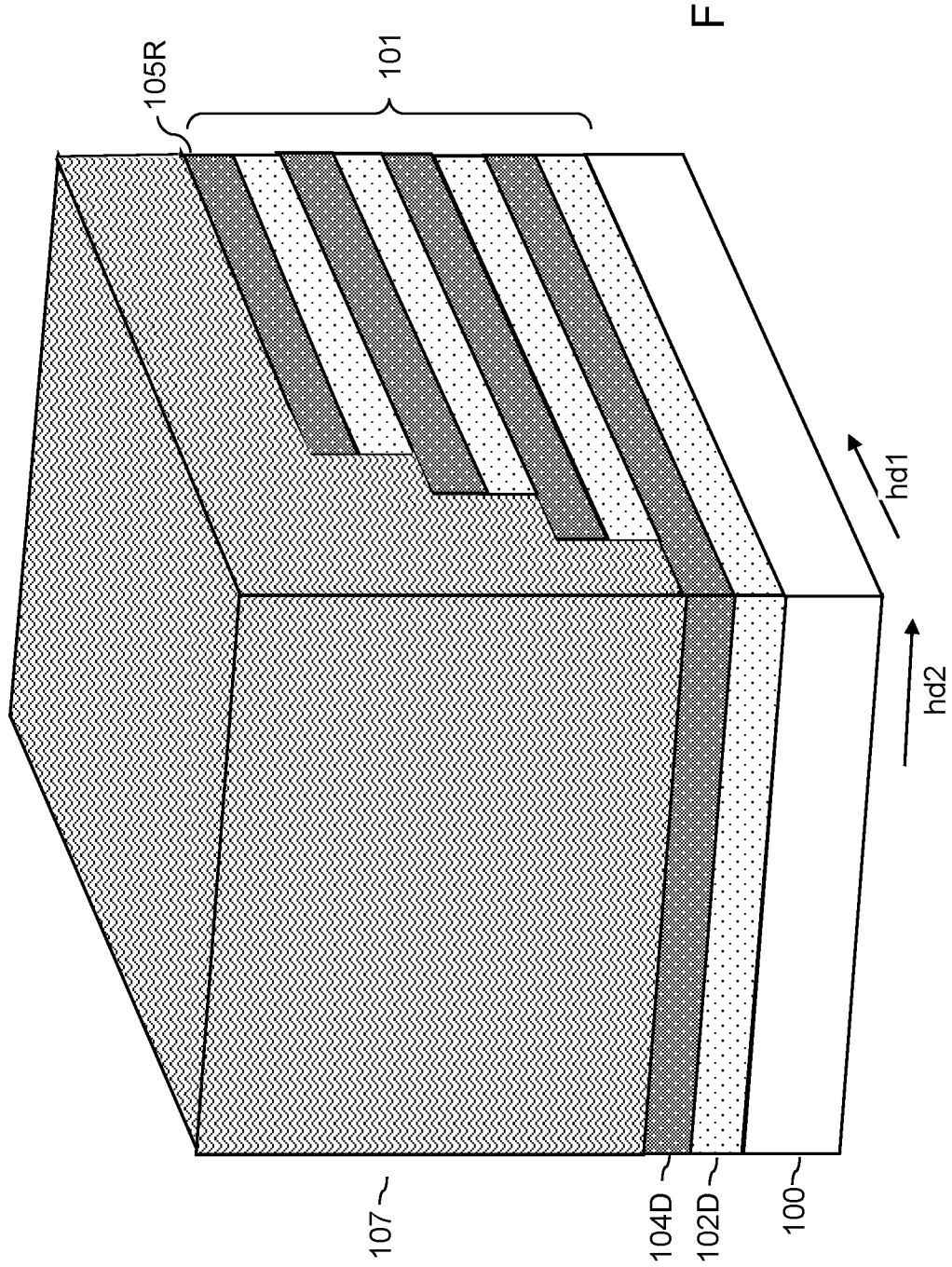
FIG. 8 is a perspective view of the intermediate structure of FIG. 7 with an inter-metal dielectric layer (IMD) deposited over the intermediate structure according to various embodiments of the present disclosure.

FIG. 8 is a perspective view of the intermediate structure of FIG. 7 with an inter-metal dielectric layer (IMD) deposited over the intermediate structure according to various embodiments of the present disclosure. Referring to FIG. 8, once the lowest conductive layer 104 (e.g., 104D) in the stack 101 of conductive layers 104 and dielectric layers 102 is exposed, the remaining photoresist layer 106 may be removed. Removal of the photoresist layer 106 may be accomplished by ashing or dissolving the photoresist layer 106 with a solvent. After removal of the photoresist layer 106, the top conductive layer 104A of the stack 101 of conductive layers 104 and dielectric layers 102 include a remaining portion 105R in which vertical pillars of transistors may be fabricated as discussed in more detail below. Next, the intermediate structure may be covered with an inter-metal dielectric (IMD) layer 107. The IMD may be made of silicon oxide, silicon oxynitride, and/or a low-k dielectric material such as organosilicate glass or any other suitable dielectric material. The IMD layer 107 may be deposited by CVD, PVD, PECVD, ALD or any other suitable process.

Figure 9:
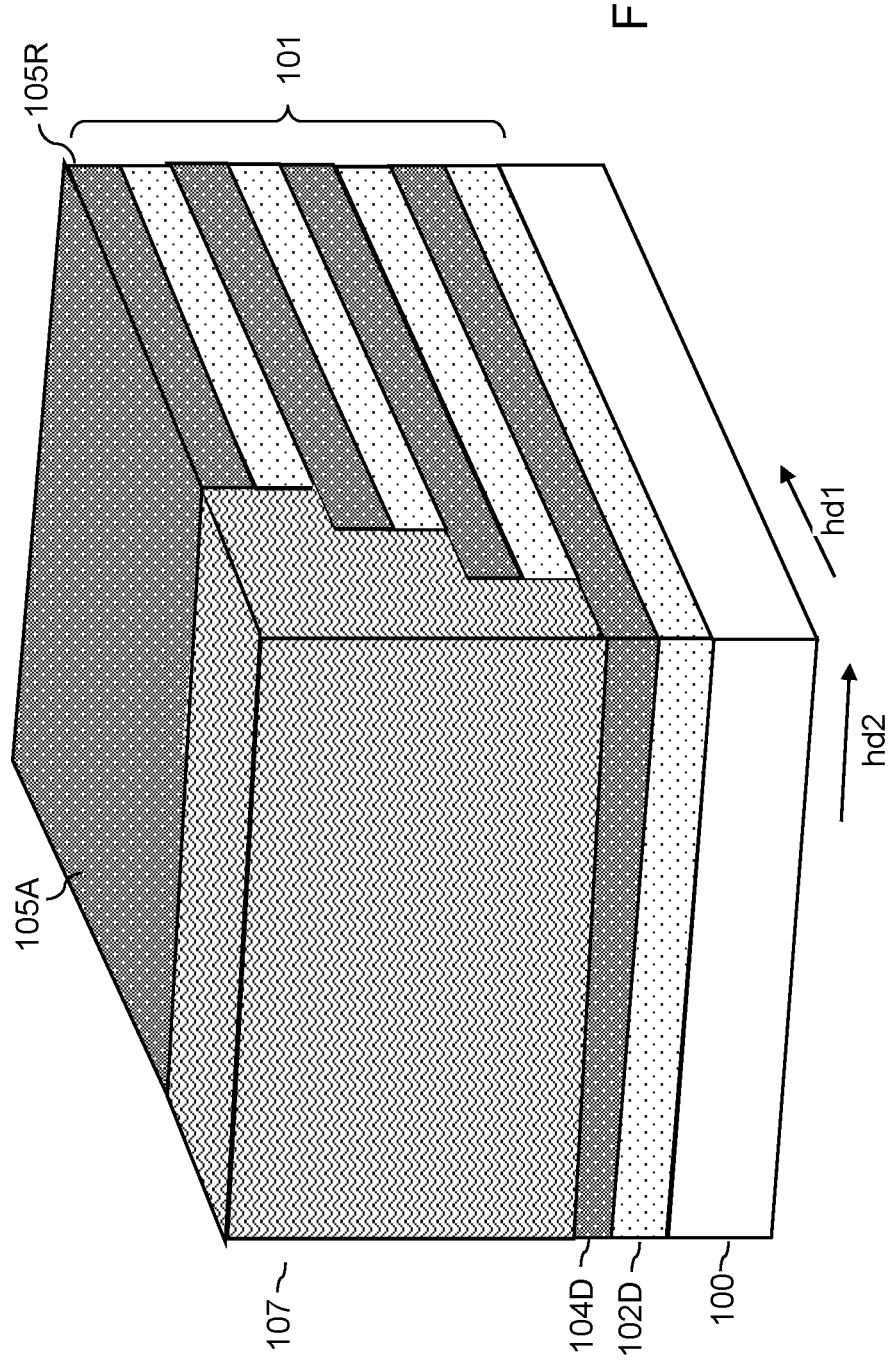
FIG. 9 is a perspective view of the intermediate structure of FIG. 8 after a planarization process exposing a top surface of the top conductive layer of the stack of alternating conductive and dielectric layers according to various embodiments of the present disclosure.

FIG. 9 is a perspective view of the intermediate structure of FIG. 8 after a planarization process exposing a top surface of the top conductive layer of the stack of alternating conductive and dielectric layers according to various embodiments of the present disclosure. Referring to FIG. 9, the intermediate structure illustrated in FIG. 8 may be planarized such that the IMD layer 107 may be removed from the remaining portion 105R of surface of the top conductive layer 104. As illustrated in FIG. 9, a portion of the IMD layer 107 remains over the staircase structure 103 of the stack 101 of conductive layers 104 and dielectric layers 102. Planarization may be accomplished by chemical-mechanical polishing. A top surface of the IMD layer 107 may be co-planar with a top surface 105A of the topmost conductive layer 104 (e.g., 104A) in the stack 101.

Figure 10A:
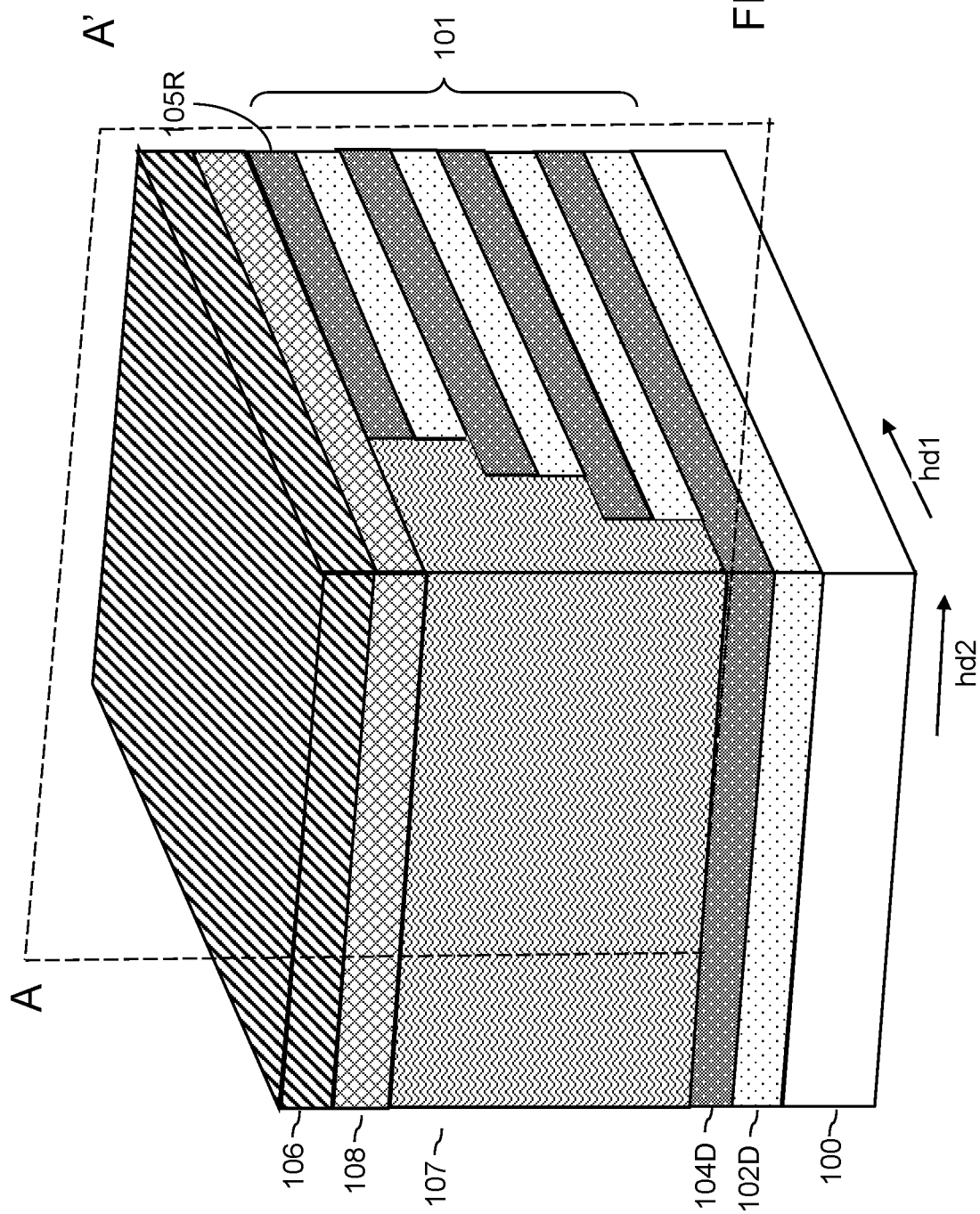
FIG. 10A is a perspective view of the intermediate structure of FIG. 9 after deposition of a hard mask layer and a photoresist layer according to various embodiments of the present disclosure.
Figure 10B:
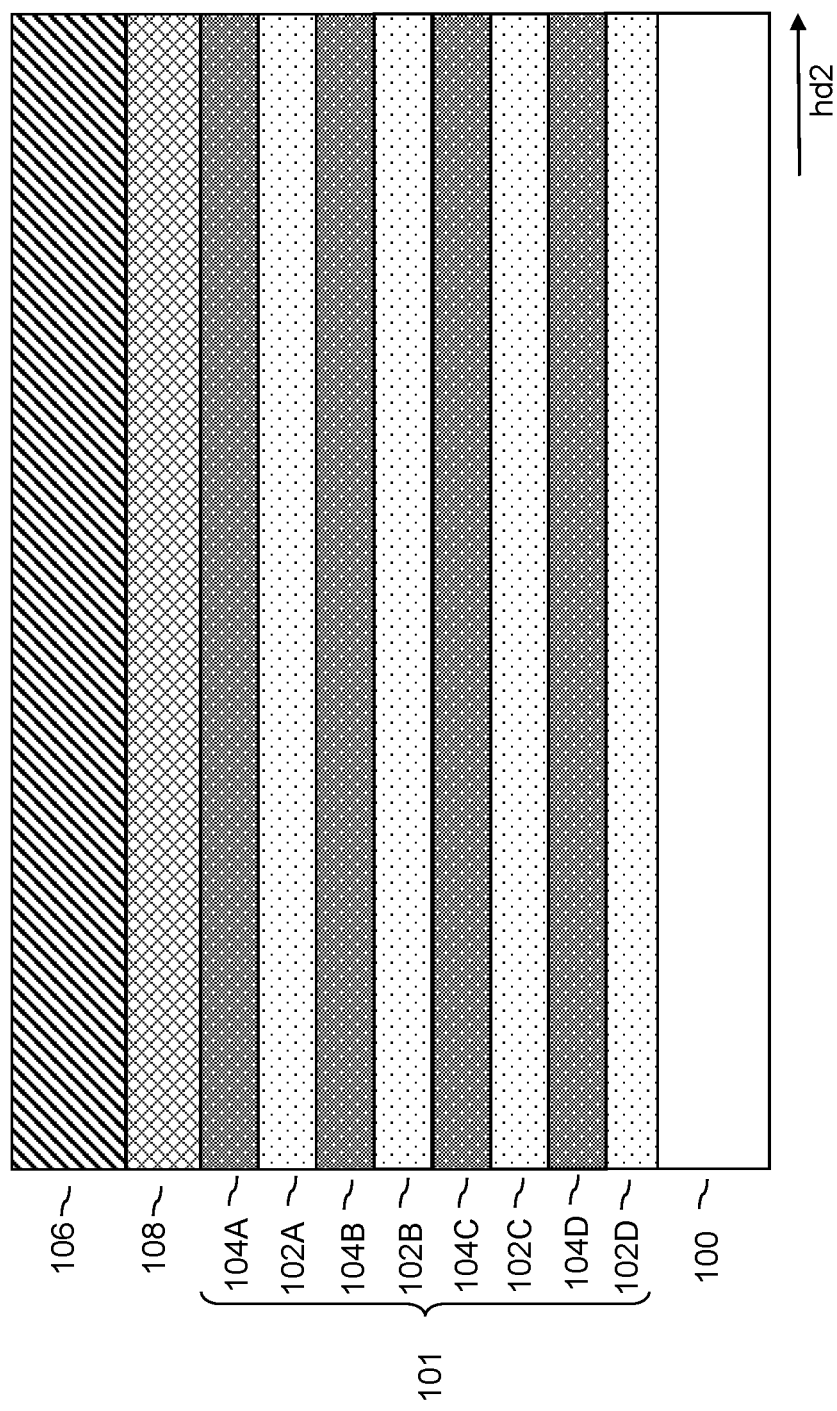
FIG. 10B is vertical cross-sectional view through the plane AA' of the intermediate structure illustrated in FIG. 10A with the addition of a hard mask layer and a photoresist layer according to various embodiments of the present disclosure.

FIG. 10A is a perspective view of the intermediate structure of FIG. 9 after deposition of a hard mask layer and a photoresist layer according to various embodiments of the present disclosure. FIG. 10B is vertical cross-sectional view through the plane AA' of the intermediate structure illustrated in FIG. 10A with the addition of a hard mask layer and a photoresist layer according to various embodiments of the present disclosure. Referring to FIGS. 10A and 10B, a hard mask layer 108 may be deposited over the surface of the intermediate structure illustrated in FIG. 9. Next, a photoresist layer 106 may be deposited over the hard mask layer 108. The hard mask layer 108 may include amorphous carbon, organo siloxane based materials, SiN, SiON or combinations thereof. The hard mask layer 108 may be deposited by CVD, PECVD, ALD or any other suitable method. Next, a photoresist layer 106 may be deposited over the hard mask layer 108.

FIG. 11 is a vertical cross-sectional view of the intermediate structure of FIG. 10B with the hard mask layer patterned and the photoresist layer removed according to various embodiments of the present disclosure. Referring to FIG. 11, the photoresist layer 106 may be patterned and used to pattern the hard mask layer 108. After patterning the hard mask layer 108, the photoresist layer 106 may be removed. As illustrated in FIG. 11, patterning of the hard mask layer 108 results in exposed portions 108T of the remaining portion 105A of surface of the top conductive layer 104. The exposed portions 108T may be generally stripe shaped oriented in the first horizontal direction hd1.

FIG. 12 is a vertical cross-sectional view of the intermediate structure of FIG. 11 after etching the stack of alternating conductive and dielectric layers using the patterned hard mask according to various embodiments of the present disclosure. Referring to FIG. 12, the stack 101 of alternating conductive layers 104 and dielectric layers 102 may be etched until a top surface of the substrate 100 is exposed. Etching may be performed in a single anisotropic etching step or in a series of anisotropic etching steps. In this manner, rails 101R of alternating conductive layers 104 and dielectric layers 102 separated by trenches 109 may be formed. As discussed above, the alternating conductive layers 104 and dielectric layers 102 may be etched in a series of selective etching steps.

FIG. 13 is a vertical cross-sectional view of the intermediate structure of FIG. 12 after conformally depositing a dielectric layer over the surface of the intermediate structure illustrated in FIG. 12 according to various embodiments of the present disclosure. Referring to FIG. 13, the hard mask layer 108 may be removed after forming the rails 101R of alternating conductive layers 104 and dielectric layers 102. The hard mask layer 108 may be removed by wet etching or dry etching. Next, a dielectric layer 110 may be conformally deposited over the surface of the intermediate structure illustrated in FIG. 12. That is, the dielectric layer 110 may be deposited over the exposed top surfaces of the conductive layer 104 in each rail 101R of alternating conductive layers 104 (104A, 104B, 104C . . . ) and dielectric layers 102 (102A, 102B, 102C . . . ), the exposed sidewall surfaces of the conductive layers 104 and the dielectric layers 102 in the rails 101R of alternating conductive layers 104 and dielectric layers 102 and the exposed top surface of the substrate 100. The dielectric layer 110 may include a dielectric material. In various embodiments, the dielectric layer 110 may include a high-k dielectric material having a dielectric constant higher than silicon oxide ($SiO_2$), which has a dielectric constant, k, of 3.9. Exemplary high k dielectric materials include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide ($ZrO_2$), titanium oxide ($TiO_2$), alumina ($Al_2O_3$), hafnium dioxide-alumina ($HfO_2$—$Al_2O_3$), and tantalum oxide ($Ta_2O_5$). In some embodiments, the dielectric layer 110 may include silicon oxide, such as $SiO_x/SiN_y/SiO_x$ (ONO). In some embodiments, the dielectric layer 110 may include a ferroelectric material. Other suitable materials are within the contemplated scope of disclosure. The dielectric layer 110 may be made of a single layer of dielectric material, or multiple layers of dielectric material, where different layers may have different compositions. The dielectric layer 110 may be made by CVD, PECVD, ALD, PVD, or any other suitable method.

Figure 14:
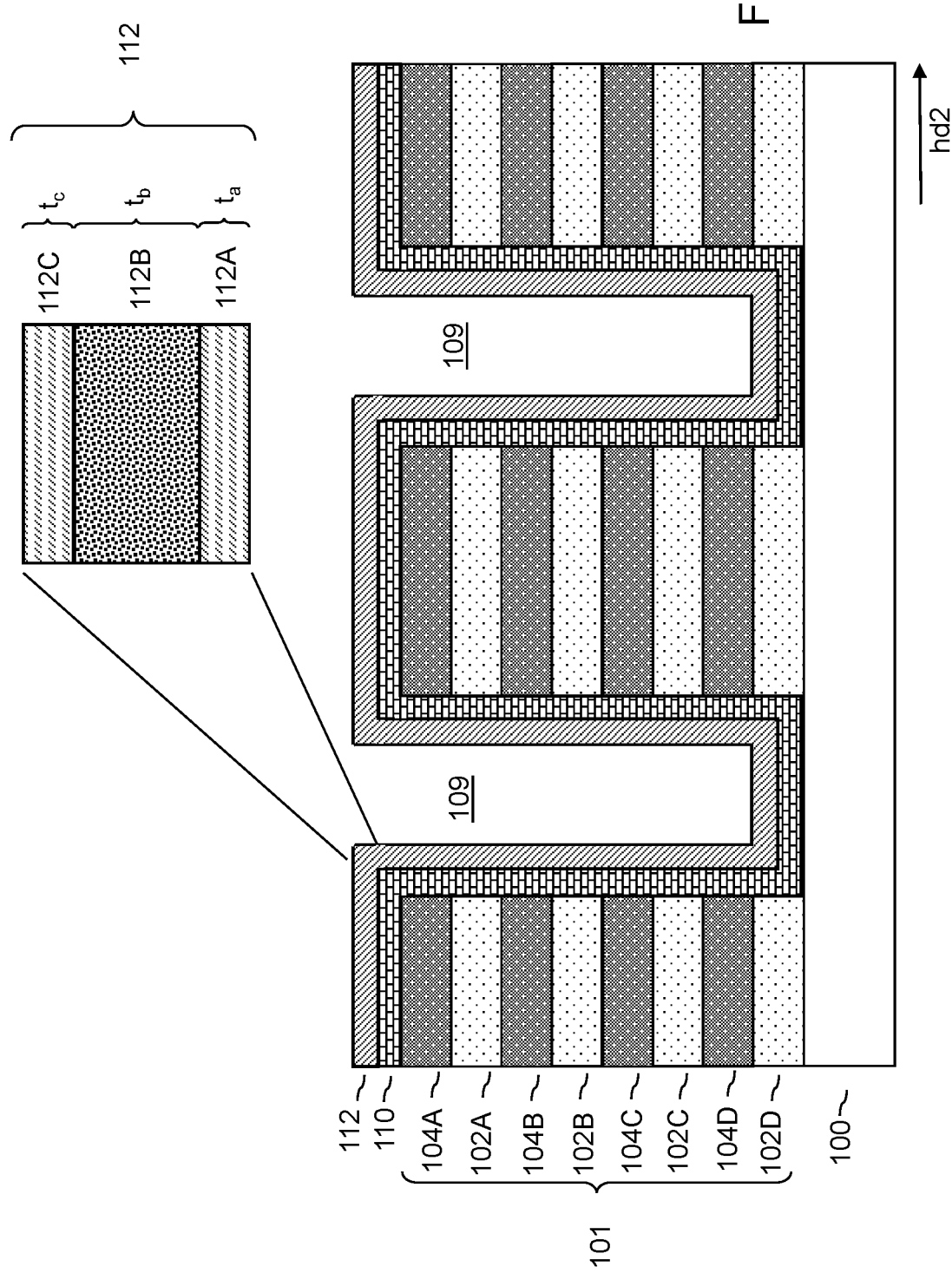
FIG. 14 is a vertical cross-sectional view of the intermediate structure of FIG. 13 after conformally depositing a channel layer over the intermediate structure illustrated in FIG. 13 according to various embodiments of the present disclosure.

FIG. 14 is a vertical cross-sectional view of the intermediate structure of FIG. 13 after conformally depositing a channel layer over the intermediate structure illustrated in FIG. 13 according to various embodiments of the present disclosure. Referring to FIG. 14, a channel layer 112 may be conformally deposited over the dielectric layer 110. As illustrated in FIG. 14, in various embodiments, the channel layer 112 may comprise a first oxide semiconductor layer 112A, a second oxide semiconductor layer 112B and a third oxide semiconductor layer 112C. In various embodiments, the first oxide semiconductor layer 112A may have a first oxygen concentration, the second oxide semiconductor layer 112B may have a second oxygen concentration and the third oxide semiconductor layer 112C may have a third oxygen concentration. In various embodiments, the second oxygen concentration may be lower than the first oxygen concentration or the third oxygen concentration. In various embodiments, the first oxygen concentration and the third oxygen concentration may be the same.

In various embodiments, the first oxide semiconductor layer 112A, the second oxide semiconductor layer 112B and the third oxide semiconductor layer 112C may each comprise $In_xGa_yZn_zM_wO$. M may be a metal selected from the group consisting of Ti, Al, Ag, Si, Sn and combinations thereof. In various embodiments, 0<(x, y, z)<1. In various embodiments, the ratio of In:Ga:Zn:M may be the same in all three oxide semiconductor layers 112A, 112B, 112C. Thus, in some embodiments, the various layers of oxide semiconductors 112A, 112B, 112C may be formed of the same material. In alternative embodiments, first oxide semiconductor layer 112A, the second oxide semiconductor layer 112B and the third oxide semiconductor layer 112C may have different ratios of In:Ga:Zn:M from each other. Further, as illustrated in FIG. 14, the dielectric layer may be located adjacent the first oxide semiconductor layer 112A opposite the second oxide semiconductor layer 112B. In some embodiments, while the first oxide semiconductor layer 112A may have a different composition of materials from the second oxide semiconductor layer 112B, the first oxide semiconductor layer 112A may have the same composition as the third oxide semiconductor layer 112C. By varying the composition of the oxide semiconductor layers 112A, 112B, and 112C the oxygen concentration of each oxide semiconductor layer may be altered relative to one another.

In an embodiment, the oxide semiconductor layers 112A, 112B and 112 C may be formed using PVD or ALD. During the PVD process, oxygen ($O_2$) and argon gas (Ar) may be introduced into the deposition chamber. By controlling the amount of $O_2$ gas in the atmosphere, the carrier concentration of the oxide semiconductor layer may be manipulated. For example, the first oxide semiconductor layer 112A may be deposited using a high flow rate ratio of $O_2$ to the total flow amount of Ar and $O_2$ (i.e., $O_2/Ar+O_2$) during the oxide semiconductor film deposition. The higher ratio of oxygen to argon ensures a desired percentage of oxygen in the environment during the deposition process to form an oxide semiconductor with a lower carrier concentration. To form the first oxide semiconductor layer 112A a ratio of flow rates "X" of $O_2/(Ar+O_2)$, where 0.05<X<1, provides for a desired $O_2$ percentage during the deposition process. Thus, for example, when the flow rate of $O_2$ is the 1 sccm and the flow rate of Ar is 19 sccm, the ratio may be 1/(19+1) or 0.05. In other embodiments, the atmosphere may contain predominately or all $O_2$, the ratio may be 1/(0+1) or 1.

The second oxide semiconductor layer 112B may be formed with a higher carrier concentration than that of the first oxide semiconductor layer 112A. The oxygen content of the second oxide semiconductor layer 112B may be lower than that of the first oxide semiconductor layer 112A. The lower flow rate ratio $O_2$ to the total flow amount of Ar and $O_2$ (i.e., $O_2$:Ar+$O_2$) insures a desired percentage of oxygen in the environment during the deposition process to form an oxide semiconductor with a higher carrier concentration. To form the second oxide semiconductor layer 112B a ratio of flow rates "Y" of $O_2/(Ar+O_2)$, where 0<Y<0.05, provides for a desired $O_2$ percentage during the deposition process. Thus, for example, when no $O_2$ is flowed into the deposition chamber, the ratio of flow rates may be 0 (i.e., 0/Ar+0=0). In other embodiments, the flow rate of $O_2$ may be as much as 1 sccm and the flow rate of Ar is 19 sccm, the ratio may be 1/(19+1) or 0.05. In this manner, the oxygen content of the second oxide semiconductor layer 112B may be lower than the oxygen content of the first oxide semiconductor layer 112A.

The third oxide semiconductor layer 112C may be formed in a manner similar to (i.e., using flow rate ratios similar to those used to form) the first oxide semiconductor layer 112A. Thus, to form the third oxide semiconductor layer 112C a high ratio of flow rates "X" of $O_2/(Ar+O_2)$, where 0.05<X<1, provides for a desired $O_2$ percentage during the deposition process. In this manner, both the first oxide semiconductor layer 112A and the third oxide semiconductor layer 112C may have a higher oxygen content than the second oxide semiconductor layer 112B.

Moreover, in some embodiments, the first oxide semiconductor layer 112A, the second oxide semiconductor layer 112B, and the third oxide semiconductor layer 112C may have a composition of $In_xGa_yZn_zM_wO$, wherein the ratio of In:Ga:Zn:M may be the same in all three oxide semiconductor layers 112A, 112B, 112C.

In various embodiments, the thickness of the second oxide semiconductor layer 112B ($t_b$) may be greater than a combined thickness of the first oxide semiconductor layer 112A ($t_a$) and the third oxide semiconductor layer 112C ($t_c$) (e.g., $t_b \geq t_a + t_c$). For example, the thickness of the first oxide semiconductor layer 112A (i.e., $t_a$) and the third oxide semiconductor layer 112C (i.e., $t_c$) may be in the range of 1-10 nm, although thicker or thinner for the first oxide semiconductor layer 112A and the third oxide semiconductor layer 112C may be used. The thickness of the second oxide semiconductor layer 112B ($t_b$) may be in the range of 10-100 nm, although a thicker or thinner second oxide semiconductor layer 112B may be used. Thus, the ratio of the thickness of the second oxide semiconductor layer 112B ($t_b$) to either the first oxide semiconductor layer ($t_a$) or the third oxide semiconductor layer ($t_c$) may be in a range of 10:1 to 100:1.

In various embodiments, the carrier concentration in the second oxide semiconductor layer 112B may be greater than of the first oxide semiconductor layer 112A or the third oxide semiconductor layer 112C. In various embodiments, the carrier concentration of the second oxide semiconductor layer 112B may be greater than a combined carrier concentration of the first oxide semiconductor layer 112A and the third oxide semiconductor layer 112C. In various embodiments, the carrier concentration in the first oxide semiconductor layer 112A and the third oxide semiconductor layer 112C may be in the range of $1\times10^{11}$ to $1\times10^{14}$. In various embodiments, the carrier concentration in the second oxide semiconductor layer 112B may be in the range of $1\times10^{14}$ to $1\times10^{20}$. Thus, the ratio of the carrier concentration in the second oxide semiconductor layer 112B to the first oxide semiconductor layer and/or third oxide semiconductor layer may be in a range of 1:1 to 1:109.

In various embodiments, the first oxide semiconductor layer 112A, the second oxide semiconductor layer 112B and the third oxide semiconductor layer 112C may be formed by PVD or ALD or any other suitable method. In various embodiments, the channel layer 112 may be formed by such that the first oxide semiconductor layer 112A and third oxide semiconductor layer 112C may be formed using a higher $O_2/Ar+O_2$ ratio than the second oxide semiconductor layer 112B. In various embodiments, the intermediate structure illustrated in FIG. 14 may be annealed. Annealing may be performed at any suitable temperature and time, such as in the range of 800-1200° C. for times in the range of 0.5-4 hrs.

Figure 15:
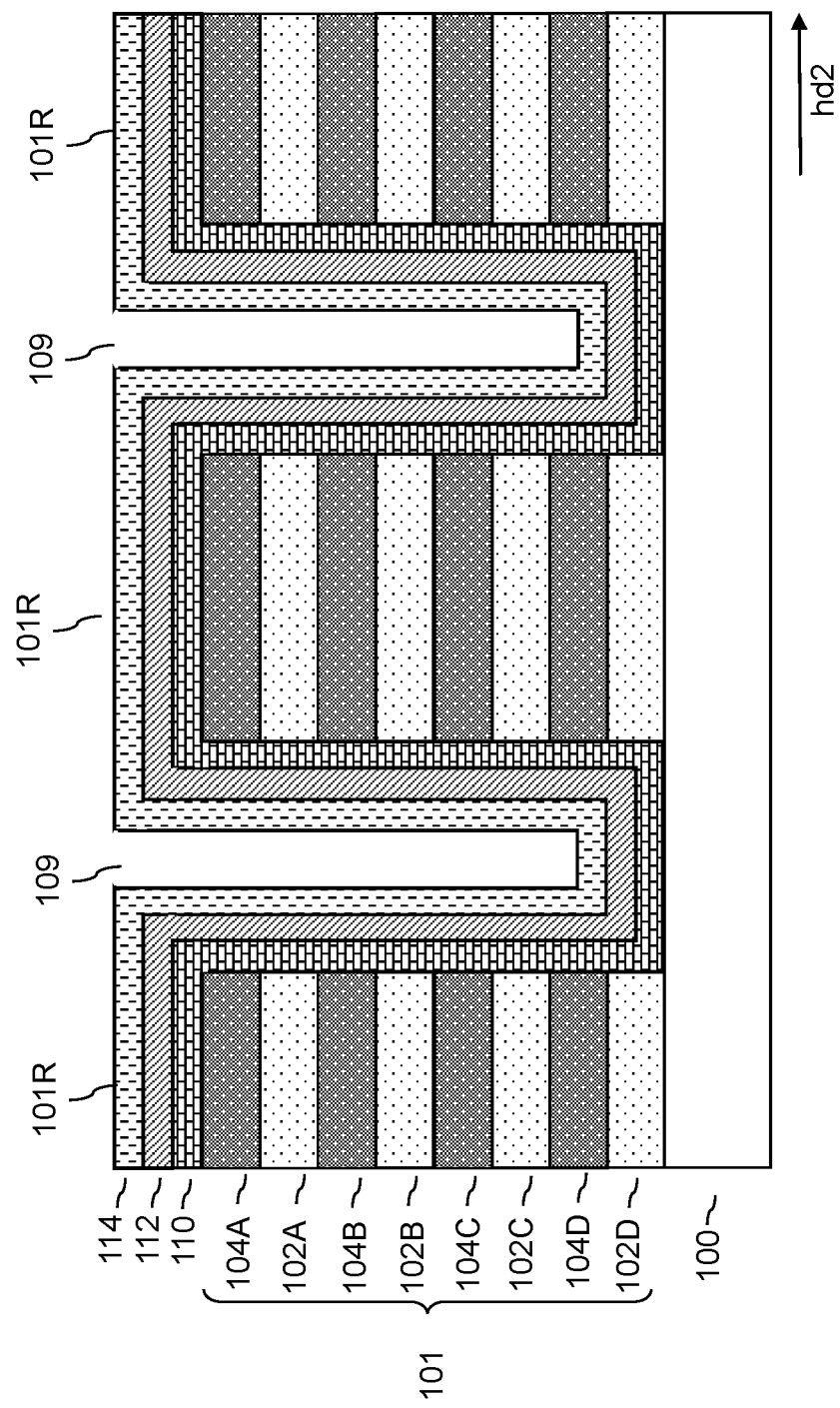
FIG. 15 is a vertical cross-sectional view of the intermediate structure of FIG. 14 after conformally depositing a dielectric layer over the channel layer according to various embodiments of the present disclosure.

FIG. 15 is a vertical cross-sectional view of the intermediate structure of FIG. 14 after conformally depositing a dielectric layer over the channel layer according to various embodiments of the present disclosure. Referring to FIG. 15, a dielectric layer 114 may be conformally deposited over the channel layer 112. The dielectric layer 114 may be made of or include silicon oxide, silicon oxynitride, and/or a low-k dielectric material such as organosilicate glass or any other suitable dielectric material. The dielectric layer 114 may be formed by CVD, PECVD, PVD, ALD or any other suitable method. As discussed above, metal oxide semiconductor materials utilized in transistors may suffer from carrier traps generated at the interfaces between the oxide semiconductor channel layer 112 and adjacent oxide dielectric layers 110. The carrier traps may be generated at the interfaces between the oxide semiconductor channel layer 112 and adjacent oxide dielectric layers, i.e., the high k dielectric layer 110 and the dielectric layer 114 due to physical defects in the oxide semiconductor channel layer 112 and/or the adjacent oxide layers (110, 114). As a consequence of carrier trapping, there may be an increase in resistance and threshold voltage in the channel (the voltage needed for the transistor to conduct), and a decrease in drain current in a transistor. The increase in resistance and threshold voltage degrades the chip performance over time, until ultimately the channel thresholds collapse. Further, carrier traps may interfere with more useful types of doping by compensating the dominant charge carrier type, annihilating either free electrons or electron holes depending on which is more prevalent. In addition, deep-level traps may shorten the non-radiative life time of charge carriers and facilitate recombination of minority carriers through the Shockley-Read-Hall (SRH) process. Shortening the non-radiative life time of charge carriers and facilitate recombination of minority carriers may also have adverse effects on the semiconductor device performance.

Various embodiments of the present invention provide a channel layer 112 formed with multiple sub layers, in which the second oxide semiconductor layer 112B has a lower oxygen concentration than the first oxide semiconductor layer 112A. The second oxide semiconductor layer 112B further may have a lower oxygen concentration than the third oxide semiconductor layer 112C. The varying oxygen concentrations of the various sub layers provides for a suppression of the interaction between the first and third oxide semiconductor layers 112A, 112C and the adjacent oxide layers, i.e. the high k dielectric layer 110 and the dielectric layer 114. As such, fewer charge traps may be formed at the interfaces between the channel layer 112 and the high k dielectric layer 110 and the dielectric layer 114, resulting in lower recombination and improved device performance.

Figure 16:
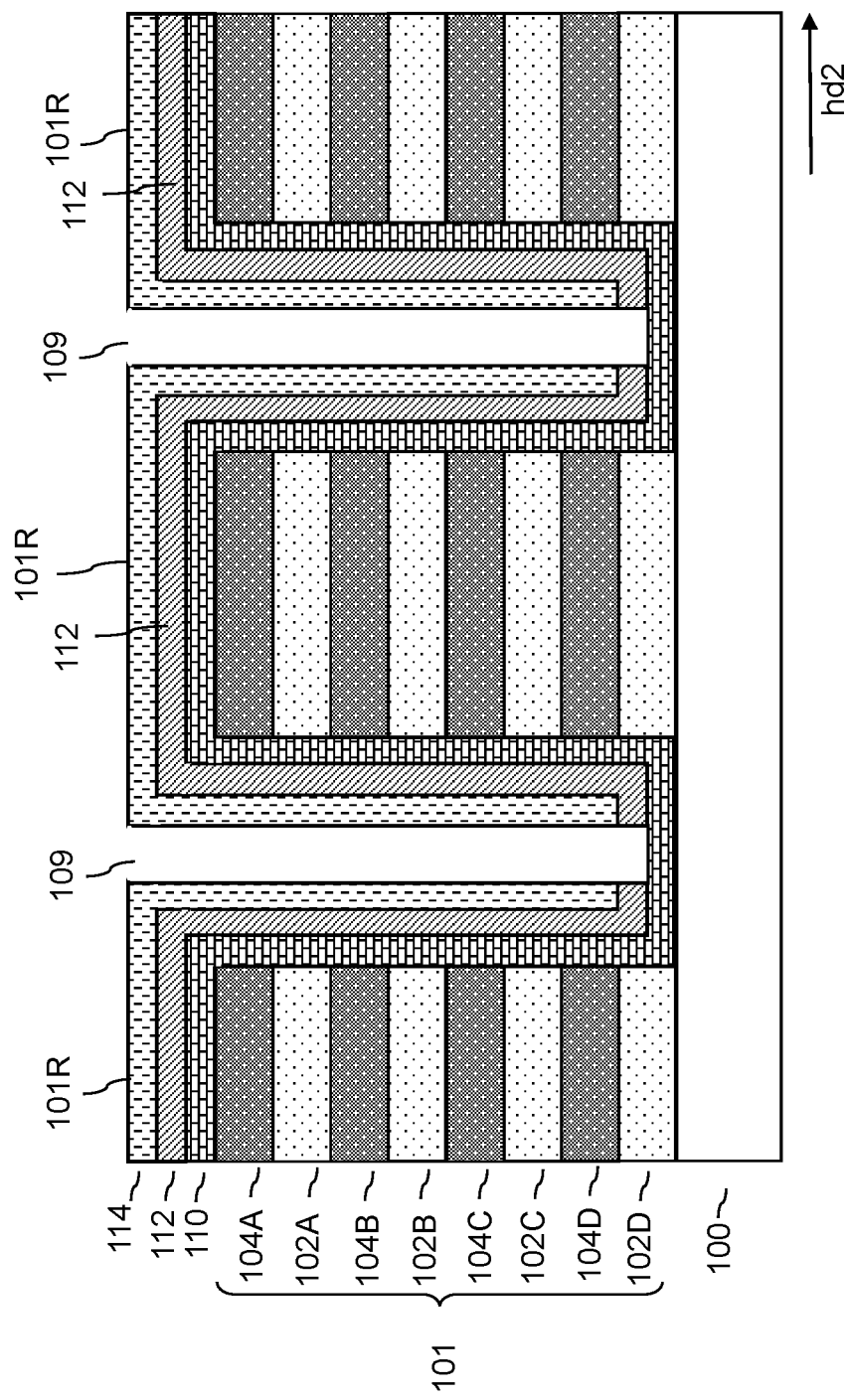
FIG. 16 is a vertical cross sectional view of the intermediate structure illustrated in FIG. 15 after deep trench etching to separate the channel layer according to an embodiment of the present disclosure.

FIG. 16 is a vertical cross sectional view of the intermediate structure illustrated in FIG. 15 after deep trench etching to separate the channel layer according to an embodiment of the present disclosure. Referring to FIG. 16, the dielectric layer 114 and the channel layer 112 may be selectively etched such that portion of the dielectric layer 114 and the channel layer 112 in the bottom of the trenches 109 are etched. Selective etching may be performed by dry etching, such as by reactive ion etching. In this manner, the channel layer 112 may be separated into separate channel layer 112 such that each rail 101R of alternating conductive layers 104 and dielectric layers 102 has its own channel layer 112 separate from a channel layer 112 of an adjacent rail 101R. In this way, vertical pillars of transistors may be fabricated as discussed in more detail below.

Figure 17:
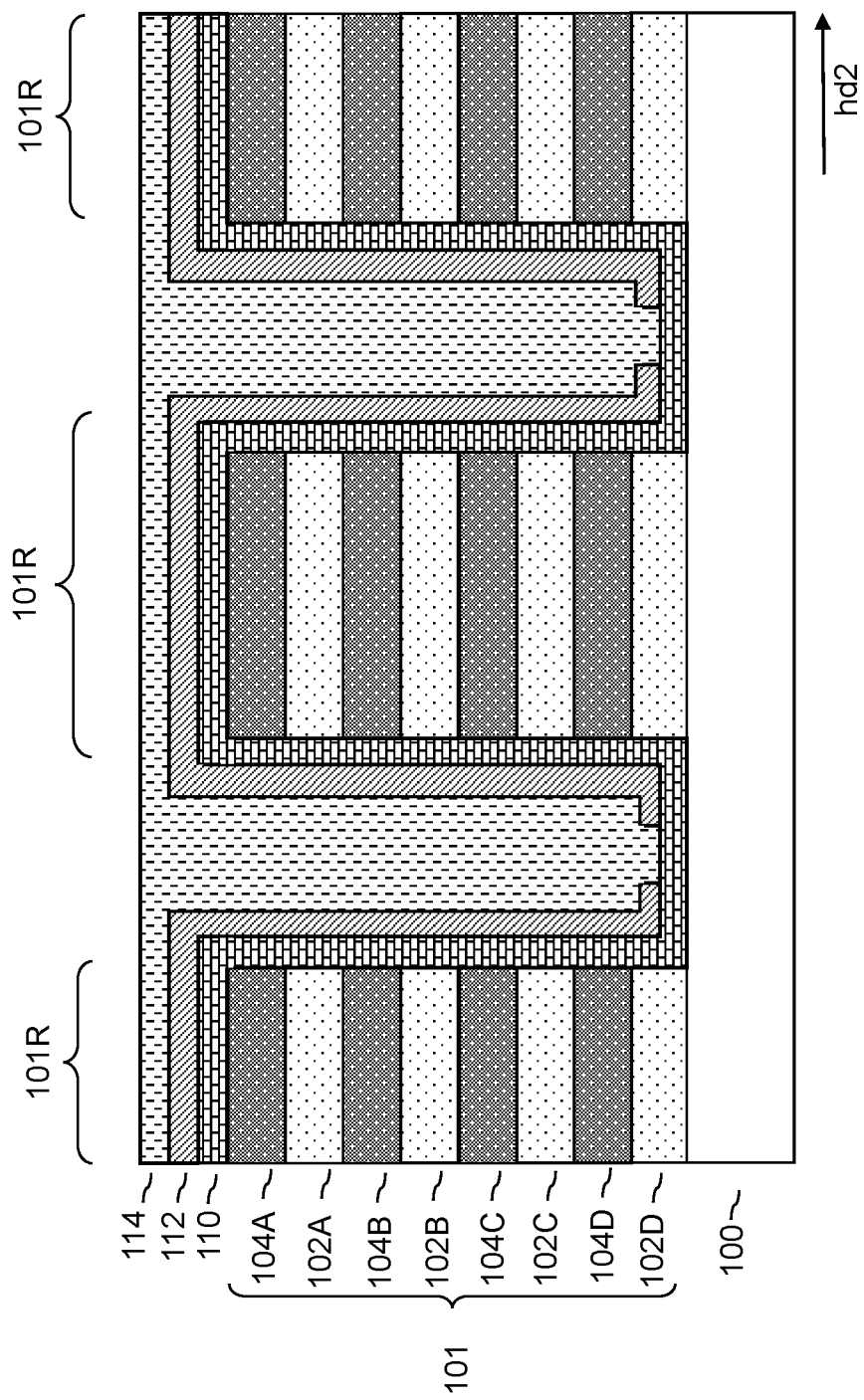
FIG. 17 is a vertical cross-sectional view of the intermediate structure illustrated in FIG. 16 after filling the trenches with dielectric material according to various embodiments of the present disclosure.

FIG. 17 is a vertical cross-sectional view of the intermediate structure illustrated in FIG. 16 after filling the trenches with dielectric material according to various embodiments of the present disclosure. Referring to FIG. 17, the remaining space in the trenches 109, including the etched portions of the dielectric layer 114 and the channel layer 112, may be filled with additional dielectric layer 114 material.

Figure 18A:
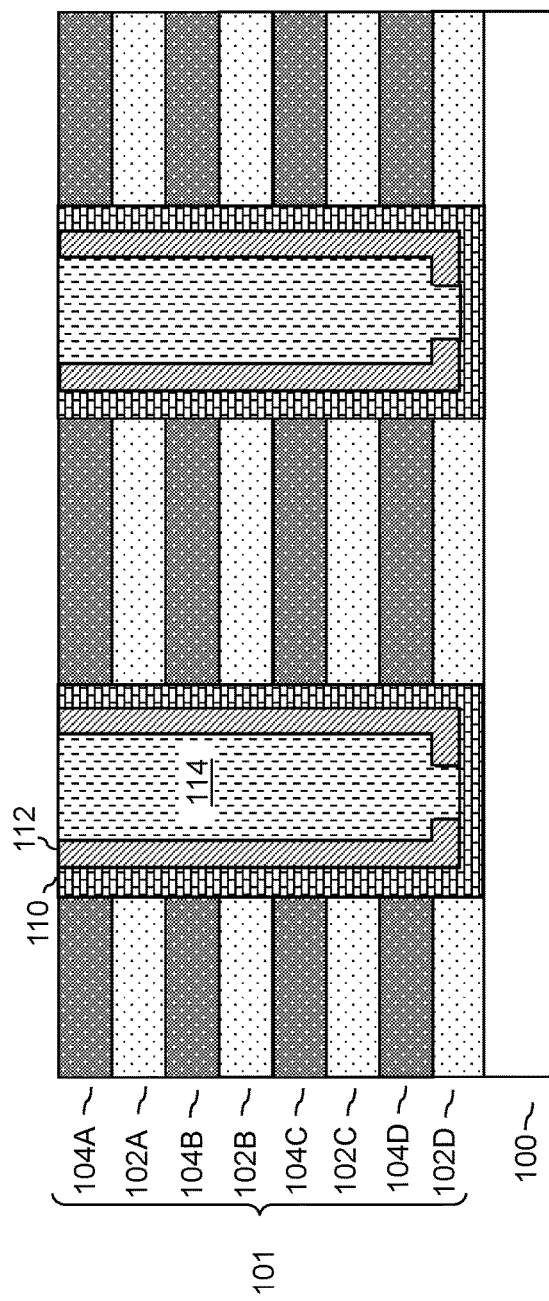
FIG. 18A is a vertical cross-sectional view of the intermediate structure illustrated in FIG. 17 after performing a planarization step according to various embodiments of the present disclosure.
Figure 18B:
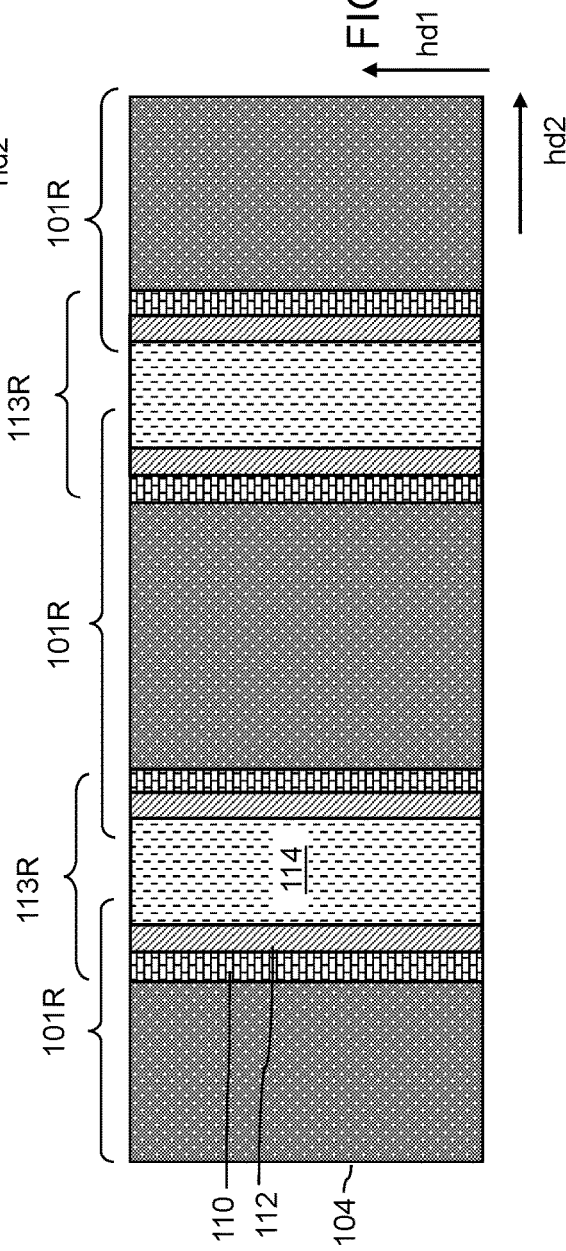
FIG. 18B is a plan view of the intermediate structure illustrated in FIG. 18A according to various embodiments of the present disclosure.

FIG. 18A is a vertical cross-sectional view of the intermediate structure illustrated in FIG. 17 after performing a planarization step according to various embodiments of the present disclosure. FIG. 18B is a plan view of the intermediate structure illustrated in FIG. 18A according to various embodiments of the present disclosure. Planarization may be performed by chemical-mechanical polishing. As illustrated in FIGS. 18A and 18B, planarization may be performed until the top surfaces of the conductive layers 104, dielectric layer 110 and channel layer 112 are exposed and are each co-planar with a top surface of the dielectric layer 114. The conductive layers 104 of the rails 101R form word lines of individual transistors as discussed in more detail below. Located between the adjacent rails 101R of alternating conductive layers 104A-104D and dielectric layers 102A-102D are device rails 113R in which vertical pillars of transistors may be formed as discussed in more detail below.

Figure 19:
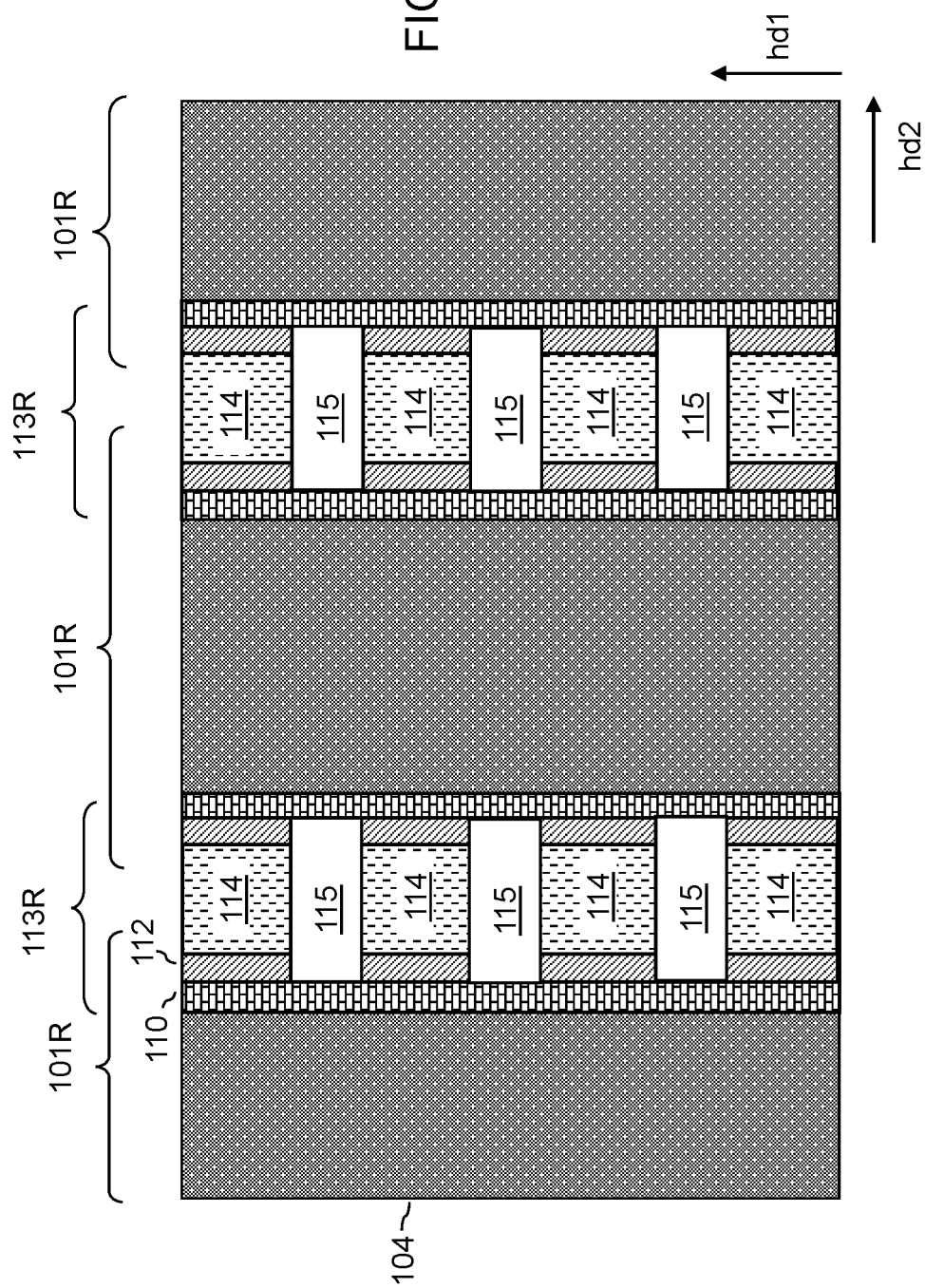
FIG. 19 is a plan view of the intermediate structure illustrated in FIG. 18B after forming isolation trenches according to an embodiment of the present disclosure.

FIG. 19 is an expanded plan view of the intermediate device structure shown in FIG. 18B. Referring to FIG. 19, isolation trenches 115 may be formed between adjacent device vertical pillars 117 (see FIGS. 23B, 23C). The isolation trenches 115 may be formed by covering the surface of the intermediate structure illustrated in FIGS. 18A and 18B with a photoresist layer (not shown) and patterning the photoresist layer to expose surface portions of the channel layer 112 and the dielectric layer 114. Next, the exposed portions of the channel layer 112 the dielectric layer 114 may be anisotropically etched down to the surface of the substrate 100. The isolation trenches 115 extend between adjacent dielectric layers 110. The isolation trenches 115 result in the formation of vertical pillars of channel material while may be used to form a device vertical pillar 117 of transistors as discussed in more detail below.

Figure 20:
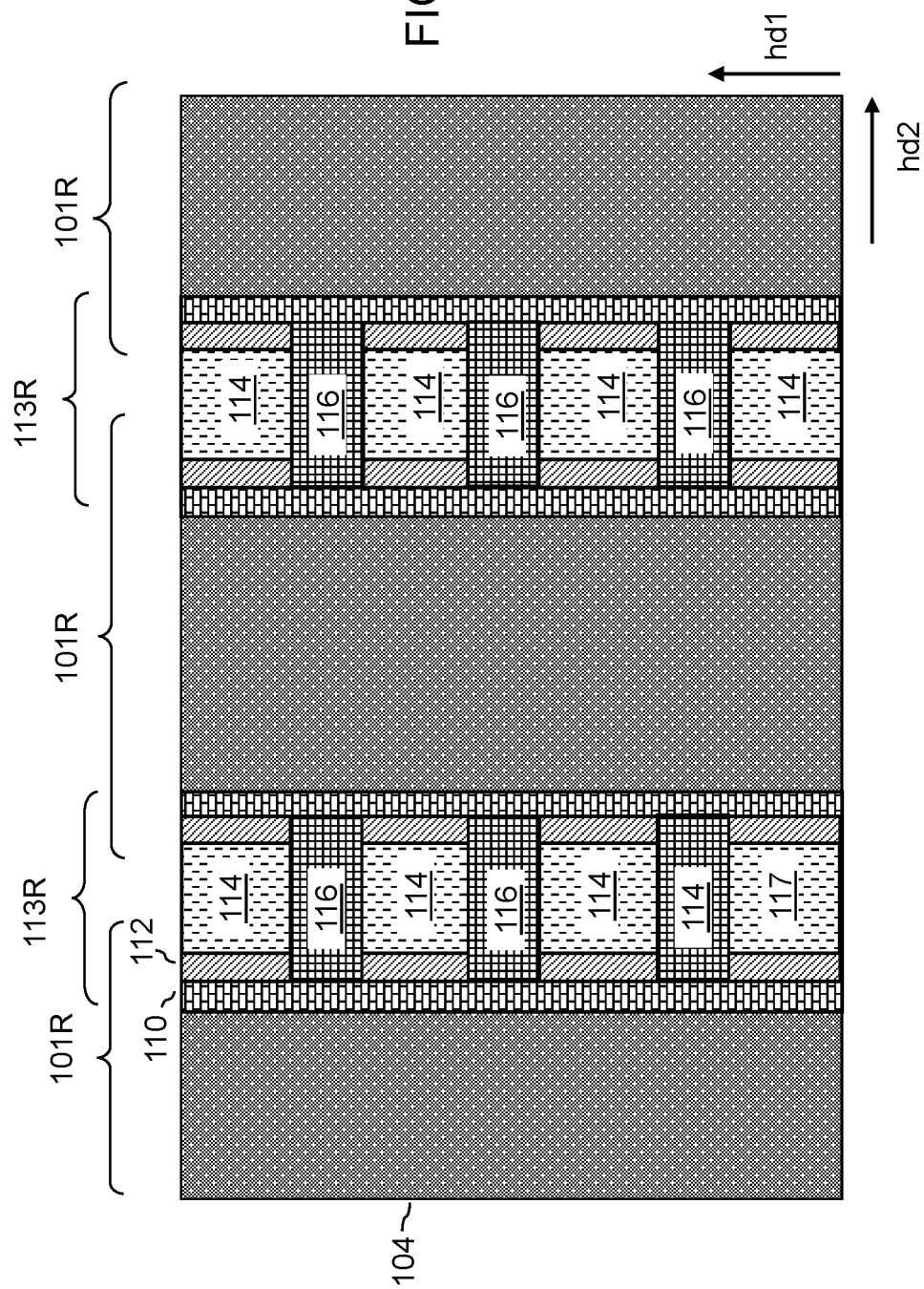
FIG. 20 is a plan view of the intermediate structure illustrated in FIG. 19 after forming isolation structures in the isolation trenches according to various embodiments of the present disclosure.

FIG. 20 is a plan view of the intermediate structure illustrated in FIG. 19 after forming isolation structures in the isolation trenches according to various embodiments of the present disclosure. Referring to FIG. 20, the isolation trenches 115 may be filled with a dielectric material to form isolation structures 116. The isolation structures 116 may be made of any suitable dielectric material such as, but not limited to, silicon oxide, silicon oxynitride, and/or a low-k dielectric material such as organosilicate glass or high-k materials such as hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$). The isolation structures may be made by any suitable methods, such as CVD, PECVD or ALD.

Figure 21:
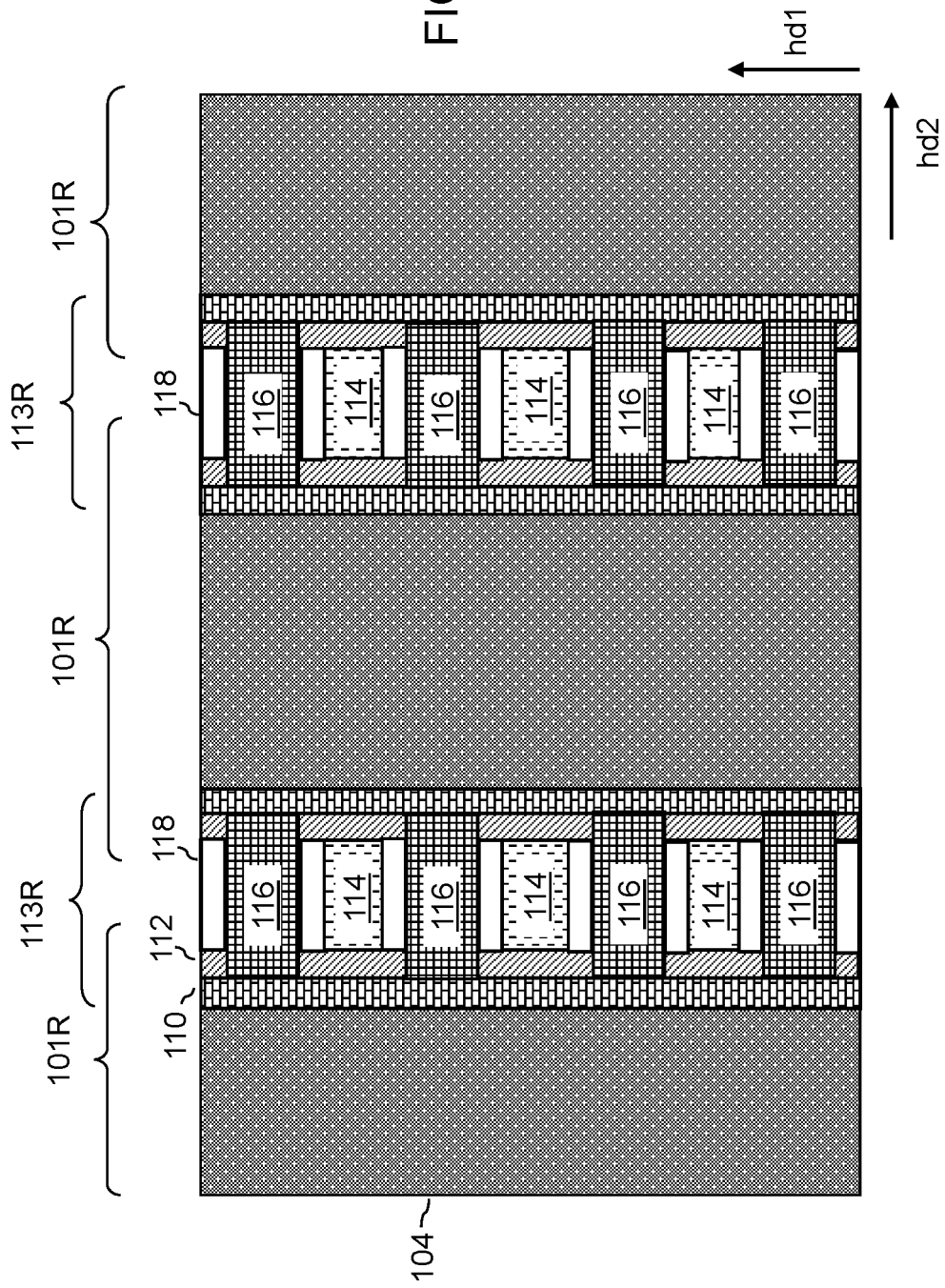
FIG. 21 is a plan view of FIG. 20 illustrating the formation of source line/bit line trenches according to various embodiments of the present disclosure.

FIG. 21 is a plan view of FIG. 20 illustrating the formation of source line/bit line trenches according to various embodiments of the present disclosure. Referring to FIG. 21, source line/bit line trenches 118 may be formed on alternate sides of the isolation structures 116. The source line/bit line trenches 118 extend between adjacent dielectric layers 110 and extend vertically to the surface of the substrate 100. The source line/bit line trenches 118 may be formed by depositing and patterning a photoresist layer (not shown) over the intermediate structure illustrated in FIG. 20. The patterned photoresist layer may then be used as mask for the etching step. Etching may be performed by wet etching or dry etching.

Figure 22:
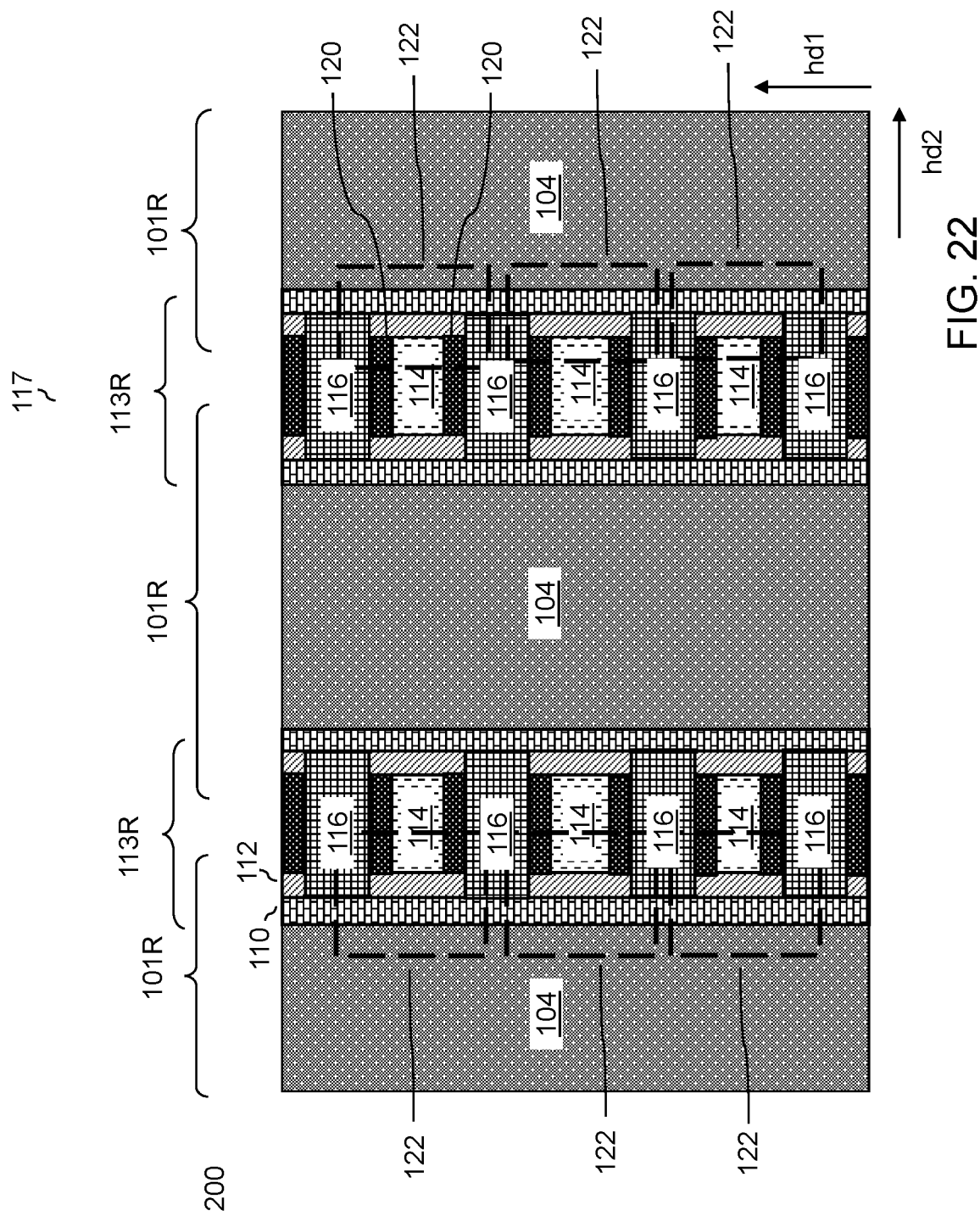
FIG. 22 is a plan view of FIG. 21 illustrating a transistor device the after formation of source lines and bit lines in the source line/bit line trenches according to various embodiments of the present disclosure.

FIG. 22 is a plan view of FIG. 21 illustrating a transistor device the after formation of source lines and bit lines in the source line/bit line trenches according to various embodiments of the present disclosure. Referring to FIG. 22, conductive material may be deposited in the source line/bit line trenches 118 to form source/drain regions 120. The source/drain regions 120 may be made of a metallic material such as a conductive metallic nitride (such as TiN, TaN or WN) or a combination of a conductive metallic nitride and an elemental metal, such as W, Cu, Co, Mo, or Ru. The source lines/bit lines 120 may be made by CVD, PECVD, PVD, ALD or any other suitable method. In this manner a plurality of transistors 122 may be fabricated. Each transistor may comprise a word line 104 that served as a gate electrode, a dielectric layer 110, a channel 112, and source/drain regions 120. Each channel 112 may comprise multiple sublayers, for example, a first oxide semiconductor layer 112A, a second oxide semiconductor layer 112B, and a third oxide semiconductor layer 112C. Each rail 101R may comprise transistors 122 formed on opposing sides of the rail 101R, wherein each adjacent transistor 122 may be spaced from one another in a first horizontal direction hd1 and isolated from one another by isolation structure 116. Moreover, each rail 101R may comprise additional transistors 122 spaced away from one another in a vertical direction, where each transistor 122 may be isolated from one another by each dielectric layer 102 formed between conductive word line layers 104. Thus, each layer of conductive layers 104 may comprise a plurality of transistors 122 formed on rail 101R.

Figure 23A:
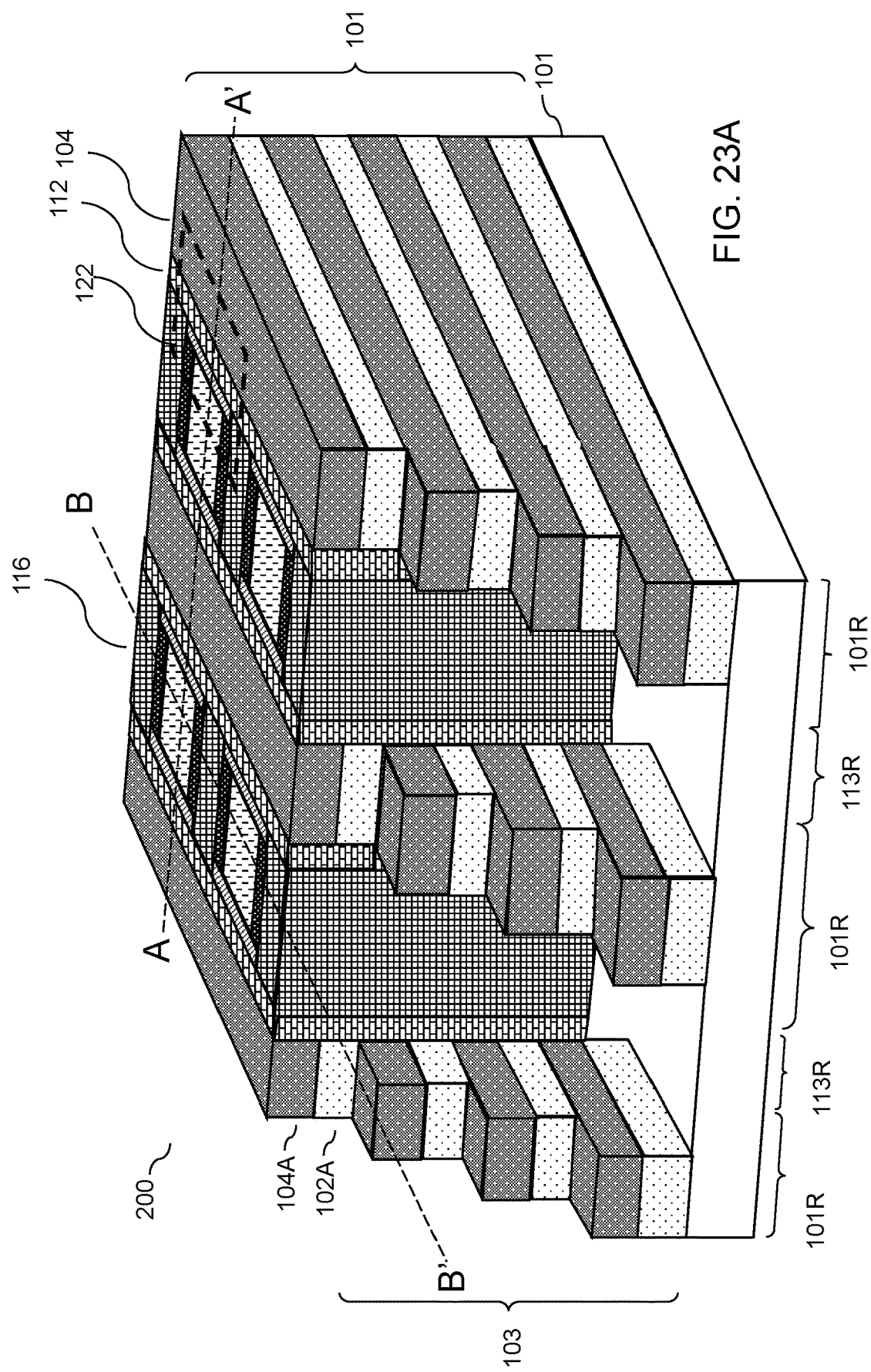
FIG. 23A is a perspective view of the transistor device illustrated in FIG. 22 according to various embodiments of the present disclosure.

FIG. 23A is a perspective view of the integrated semiconductor device 200 illustrated in FIG. 22 with the IMD layer 107 (FIG. 10A) removed to illustrate the underlying details. FIG. 23B is a vertical cross-sectional view through line AA' of FIG. 23A. FIG. 23C is a vertical cross-sectional view through line BB' of FIG. 23A. As can be seen in FIG. 23A, the rails 101R of alternating conductive layers 104 and dielectric layers 102 may have a staircase structure 103. This configuration allows for easy access to individual word lines by way of contact via structures (not shown) coupled to each level of conductive layer 104A-104D word lines. That is, an individual contact via structure may be subsequently formed to connect to an individual word line (step) in the staircase. Between the rails 101R of alternating conductive layers 104 and dielectric layers 102 may be rails 113R which include vertical pillars 117 of oxide semiconductor transistors 122 as discussed in greater detail in regards to FIGS. 23B and 23C.

Referring to FIGS. 23B and 23C, transistors 122A-122D may be located in vertical device levels separated by dielectric layers 102A-102D, thereby forming a vertical pillar of oxide semiconductor transistors 122A-122D. As illustrated in FIG. 23B, the channel layer 112 extends in a vertical direction through each device level 102A-102D and may be separated from the word lines, i.e. conductive layers 104A-104D, by the high k dielectric layer 114. Thus, the channel layer 112 may act as a common channel for all of the transistors 122 in the vertical pillar of oxide semiconductor transistors 122A-122D. As discussed above, the adjacent word lines, i.e. conductive layers 104A-104D may be separated from each other by intervening dielectric layers 102A-102D.

As illustrated in FIG. 23C, the source/drain regions 120 may extend in a vertical direction through each device level. Thus, each transistor 122A-122D in a vertical pillar 117 of transistors 122A-122D may share a common drain line 120 and a common source line 120. Adjacent vertical pillars 117 of transistors 122A-122D may be separated from each other by the isolation structures 116.

Figures 24A, 24B:
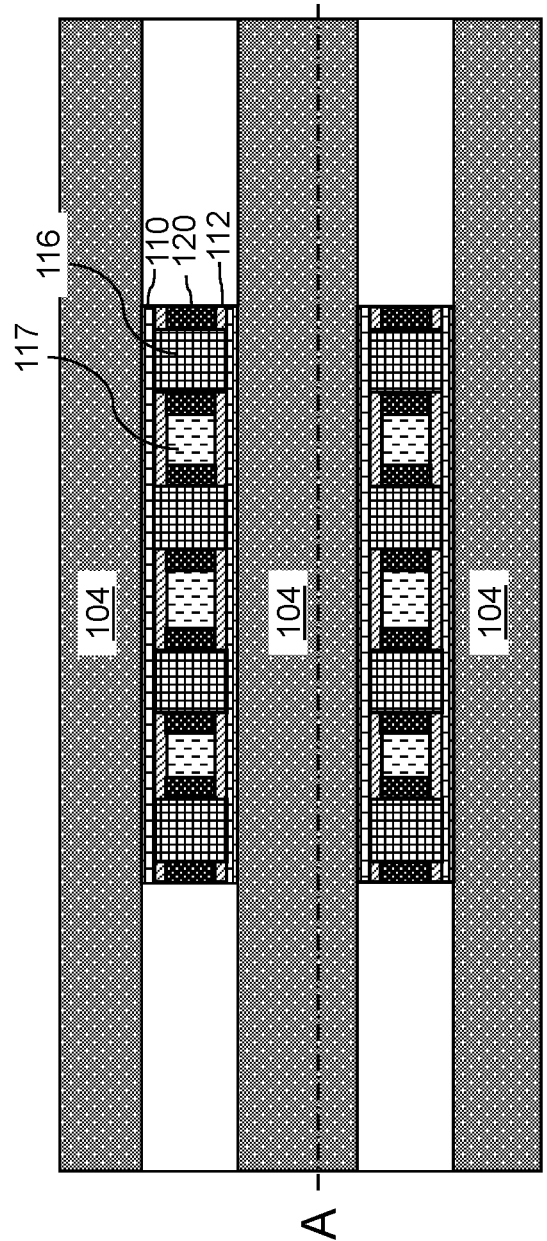
FIG. 24A is a plan view of an a transistor device according to an alternative embodiment of the present disclosure.
FIG. 24B is a vertical cross-sectional view taken along line A-A' of FIG. 24A according to an alternative embodiment of the present disclosure.

FIGS. 24A and 24B illustrate an alternative integrated semiconductor device 300 according to various embodiments. FIG. 24A is a plan view for the alternative integrated semiconductor device 300 while FIG. 24B is a vertical cross section through AA' of FIG. 24A. As illustrated in FIG. 24B, the alternative integrated semiconductor device 300 has two staircase structures 103A and 103B. The vertical pillars of oxide semiconductor transistors 122 are located between the two staircase structures 103. This configuration allows for additional contact via structures (not shown) to contact the word lines 104A-104D.

Figure 25A:
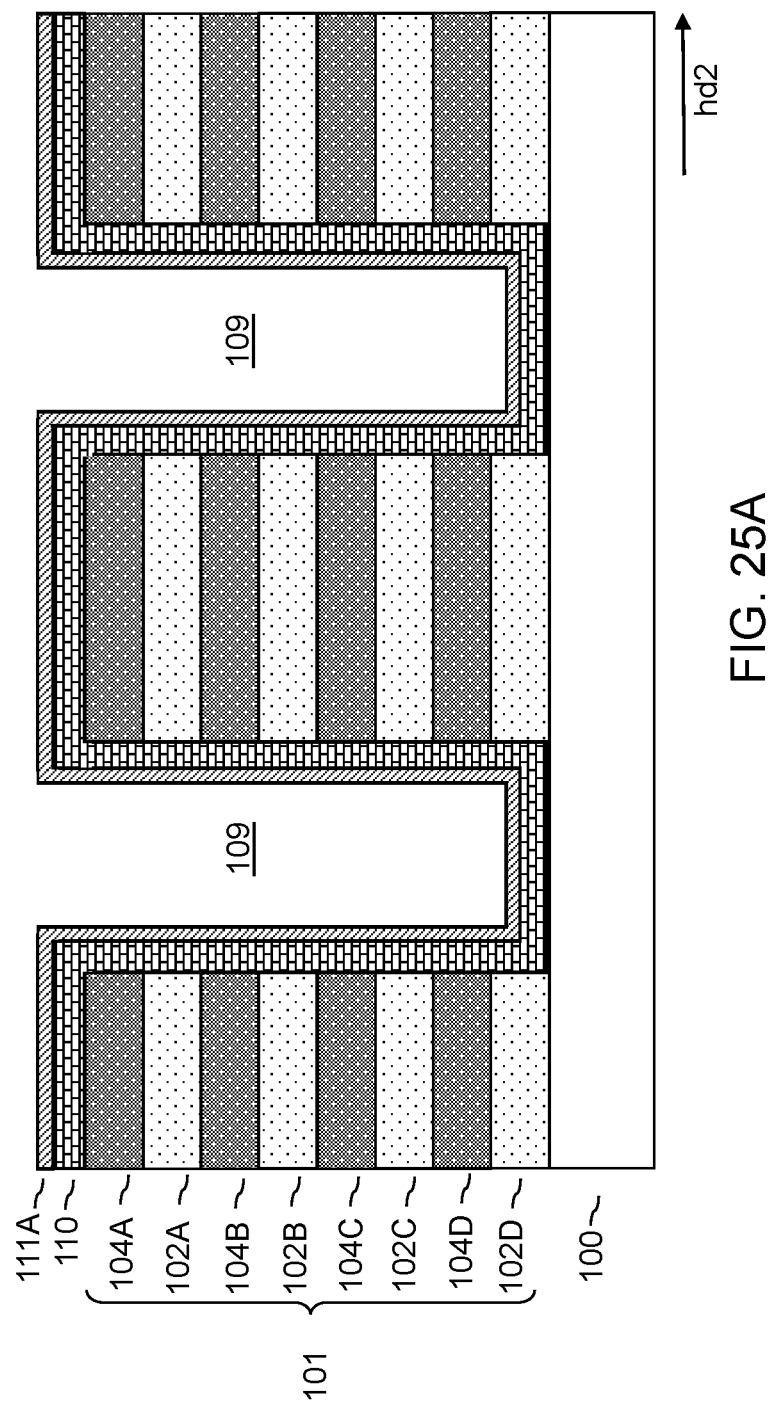
FIG. 25A is a vertical cross-sectional view of an alternative configuration of an exemplary intermediate structure for forming a transistor device including a first channel layer formed over a dielectric layer according to an embodiment of the present disclosure.

FIG. 25A is a vertical cross-sectional view of an alternative configuration of an exemplary intermediate structure for forming a transistor device according to an embodiment of the present disclosure. Referring to FIG. 25A, the alternative configuration of the exemplary intermediate structure may be derived by conformally depositing a first channel layer 111A over the dielectric layer 110 in the intermediate structure illustrated in FIG. 13 according to various embodiments of the present disclosure. In various embodiments, the first channel layer 111A may be made of a semiconductor oxide material. In embodiments, the first channel layer 111A may be made of a semiconductor oxide material having the formula $In_xGa_yZn_zMO$, where M is a metal selected from the group consisting of Ti, Al, Ag, W, Ce and Sn and combinations thereof. In various embodiments, $0<x<1$, $0\leq y\leq 1$, and $0\leq z\leq 1$. Other semiconductor oxide materials are within the contemplated scope of disclosure. The first channel layer 111A may be deposited using a suitable deposition process, including physical vapor deposition (PVD), pulsed laser deposition (PLD), chemical vapor deposition (CVD), and atomic layer deposition (ALD). The first channel layer 111A may have a thickness between 0.1 nm and 50 nm, such as between 5 nm and 35 nm.

Referring again to FIG. 25A, following the deposition of the first channel layer 111A, the exemplary intermediate structure including the first channel layer 111A may be subjected to a thermal treatment at an elevated temperature. In various embodiments, the thermal treatment may be in a vacuum or low pressure environment. As used herein, a "vacuum or low pressure environment" means that the total gas pressure within the vessel or other receptacle containing the exemplary intermediate structure during the thermal treatment process is controlled to be less than the ambient air pressure outside of the vessel or receptacle. In various embodiments, the pressure during the thermal treatment may be between $10^{-17}$ torr and 760 torr, such as between $10^{-9}$ torr and 100 torr. In various embodiments, the pressure during the thermal treatment may be between $10^{-3}$ Torr and 760 Torr. In embodiments, the temperature during the thermal treatment may be greater than room temperature (e.g., >25° C., such as ≥30° C.), and may be up to ~450° C. In embodiments, the thermal treatment may be performed as a soak anneal or a plasma treatment. The thermal treatment in a vacuum or low pressure environment may promote carrier generation in the first channel layer 111A.

In various embodiments, the exemplary intermediate structure including the first channel layer 111A may be subjected to thermal treatment at an elevated temperature in the presence of a process gas including CO, $H_2$, $CH_4$, HBr and combinations thereof. Other gas species are within the contemplated scope of disclosure. The process gas may include a reduction gas, such as CO, to promote oxygen desorption from the first channel layer 111A. In particular, in embodiments in which CO is included in the process gas, the CO may react with the semiconductor oxide material of the first channel layer 111A in accordance with the formula $MO+CO \rightarrow MO_{1-x}+CO_{1+x}+V_O+e-$, where MO is metal-oxygen and $V_O$ is an oxygen vacancy. Thus, the reaction may promote desorption of oxygen from the first channel layer 111A, and an increase in oxygen vacancies and carrier concentration of the first channel layer 111A. Alternately, or in addition, the process gas may include a hydrogen-based gas, such as $H_2$, $CH_4$, HBr, etc. The thermal treatment in the presence of a hydrogen-based gas may promote hydrogen doping of the semiconductor oxide material and an increase in free carriers within the first channel layer 111A.

The process gas may be introduced into the vessel or other receptacle containing the exemplary intermediate structure during the thermal treatment process. In various embodiments, the thermal treatment of the exemplary intermediate structure including the first channel layer 111A may be conducted in an environment that is basically or essentially free of oxygen gas ($O_2$).

Figure 25B:
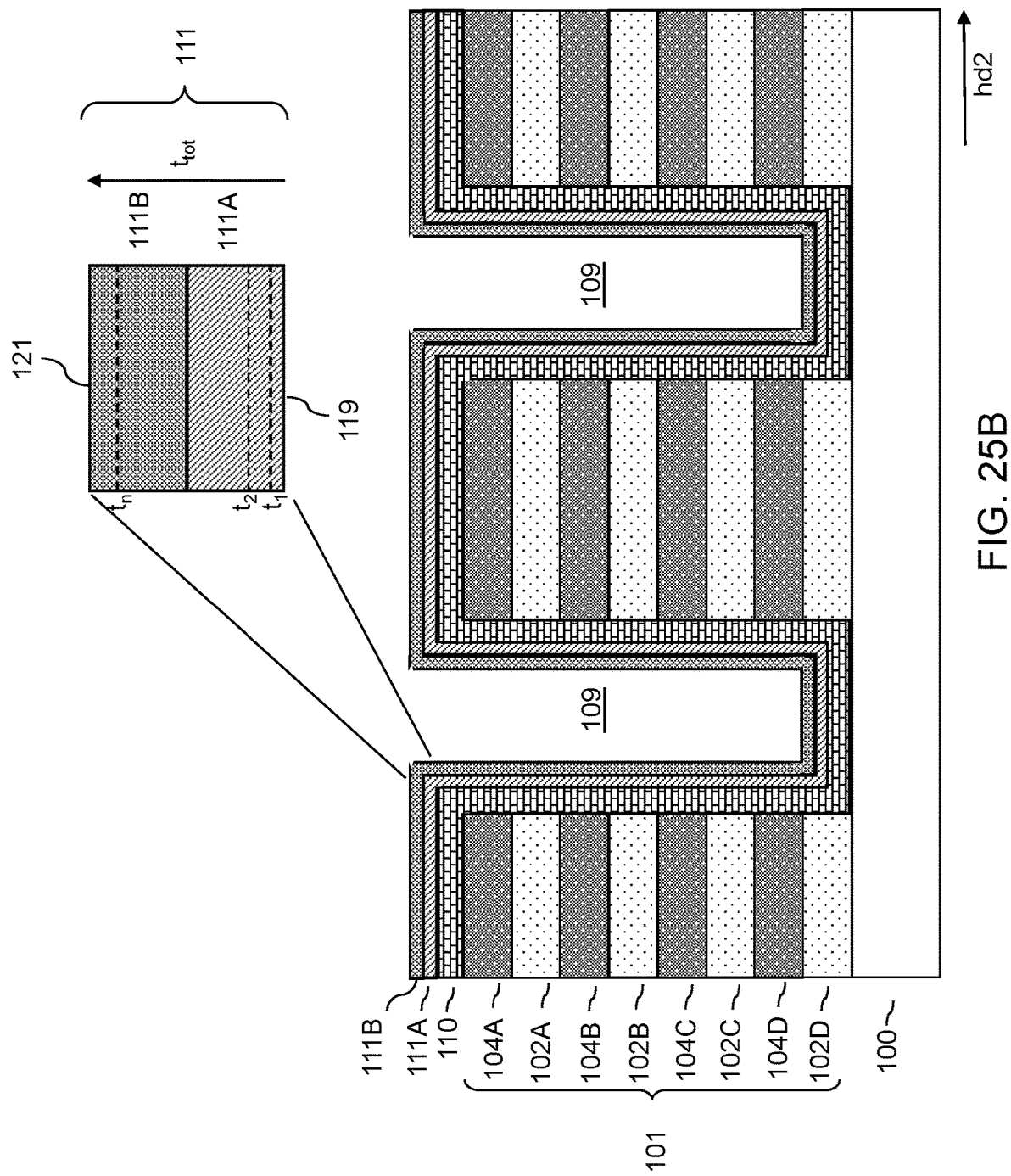
FIG. 25B is a vertical cross-sectional view of an alternative configuration of the exemplary intermediate structure that includes a second channel layer conformally deposited over the first channel layer according to an embodiment of the present disclosure.

FIG. 25B is a vertical cross-sectional view of an alternative configuration of the exemplary intermediate structure that includes a second channel layer 111B conformally deposited over the first channel layer 111A according to an embodiment of the present disclosure. Referring to FIG. 25B, the second channel layer 111B may be made of a semiconductor oxide material. In embodiments, the second channel layer 111B may be made of a semiconductor oxide material having the formula $In_xGa_yZn_zMO$, where M is a metal selected from the group consisting of Ti, Al, Ag, W, Ce and Sn and combinations thereof. In various embodiments, $0<x<1$, $0\leq y\leq 1$, and $0\leq z\leq 1$. Other semiconductor oxide materials are within the contemplated scope of disclosure. In various embodiments, the ratio of In:Ga:Zn:M may be the same in both the first channel layer 111A and the second channel layer 111B. Thus, in some embodiments, the first channel layer 111A and the second channel layer 111B may be formed of the same material. In alternative embodiments, the second channel layer 111B may be formed of a different material than the material of the first channel layer 111A. In various embodiments, the second channel layer 111B may be made of an $In_xGa_yZn_zMO$ material where the ratios of In:Ga:Zn:M differ from the ratios of these elements in the first channel layer 111A.

The second channel layer 111B may be deposited using a suitable deposition process, including physical vapor deposition (PVD), pulsed laser deposition (PLD), chemical vapor deposition (CVD), and atomic layer deposition (ALD). In some embodiments, the amount of $O_2$ gas in the atmosphere may be controlled to have a higher flow rate ratio of $O_2$ during the deposition of the second channel layer 111B than was used during the deposition of the first channel layer 111A. The second channel layer 111B may have a thickness between 0.1 nm and 50 nm, such as between 5 nm and 35 nm. The thickness of the second channel layer 111B may be equal to or greater than the thickness of the first channel layer 111A. In various embodiments, the combined thicknesses of the first channel layer 111A and the second channel layer 111B may be 50 nm or less.

In various embodiments, the exemplary intermediate structure including the second channel layer 111B illustrated in FIG. 25B may be subjected to thermal treatment at an elevated temperature in the presence of a process gas containing oxygen. In various embodiments, the pressure during the thermal treatment may be between $10^{-3}$ Torr and 760 Torr. In embodiments, the temperature during the thermal treatment may be greater than room temperature (e.g., >25° C., such as ≥30° C.), and may be up to ~450° C. In embodiments, the thermal treatment may be performed as a soak anneal or a plasma treatment. The thermal treatment in an oxygen-containing gas environment may promote a reduction in carrier concentration of the second channel layer 111B.

The exemplary intermediate structure including the second channel layer 111B may be subjected to a thermal treatment in the presence of an oxidizing process gas, which may include, for example, CO2, O2, O3, N2O-based gases, and combinations of the same. Other oxidizing gasses are within the contemplated scope of disclosure. In particular, the oxidizing gas may react with the semiconductor oxide material of the second channel layer 111B in accordance with the formula $MOy-1+VO+e-+O \rightarrow MOy$, where MO is metal-oxygen, O is an oxygen atom from the oxidizing process gas and VO is an oxygen vacancy. Thus, the reaction may promote a reduction of oxygen vacancies in the second channel layer 111B and a decrease in carrier concentration of the second channel layer 111B.

In various embodiments, the exemplary intermediate structure including the second channel layer 111B illustrated in FIG. 25B may also be annealed. Annealing may be performed at any suitable temperature and time, such as in the range of 800-1200° C. for times in the range of 0.5-4 hrs. In various embodiments, the annealing may be performed in the presence of an oxygen-containing gas. This may promote further oxidation of the semiconductor oxide material of the second channel layer 111B and a reduction of oxygen vacancies in the second channel layer 111B.

Referring again to FIG. 25B, the enlarged portion of FIG. 25B illustrates the first channel layer 111A and the second channel layer 111B over the first channel layer 111A, which in combination may form a channel layer 111. The channel layer 111 may include a first surface 119 facing the dielectric layer 110, and a second surface 121 opposite the first surface 119. The second surface 121 of the channel layer 111 may electrically contact source and drain electrodes (e.g., source lines and bit lines 120) in the fully-assembled transistor device. The source and drain electrodes may be subsequently formed as described above with reference to FIGS. 22-24A. The channel layer may have a total thickness, trot, between the first surface 119 and the second surface 121. Portions of the channel layer 111 that are more proximate to the first surface 119 than to the second surface 121 may be relatively oxygen poor relative to portions of the channel layer 111 that are more proximate to the second surface 121 than to the first surface 119. This may be the result of the process conditions used to form the first channel layer 111A and the second channel layer 111B, which may promote the desorption of oxygen from the material of the first channel layer 111A and the diffusion of the oxygen into the material of the second channel layer 111B. This may also increase in the concentration of oxygen vacancies in the first channel layer 111A relative to the concentration of oxygen vacancies in the second channel layer 111B. By controlling the process conditions used in forming the first channel layer 111A and the second channel layer 111B, the oxygen content and carrier concentration throughout the thickness, trot, of the channel layer 111 may be controllably varied.

Figure 25C:
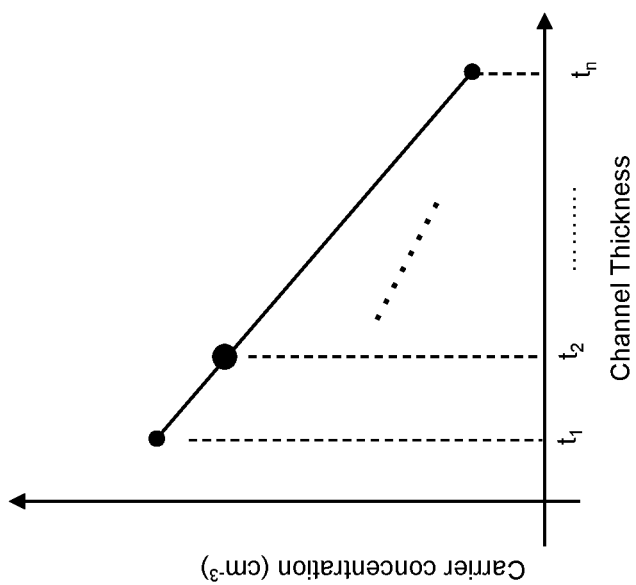
FIG. 25C is a plot showing the carrier concentration through a thickness of a channel layer according to an embodiment of the present disclosure.

FIG. 25C is a plot showing the carrier concentration through a thickness of a channel layer 111 according to an embodiment of the present disclosure. Referring to FIGS. 25C, the carrier concentration per cubic centimeter is plotted for three different thicknesses, t1, t2 and tn of the channel layer 111 illustrated in FIG. 25B. The dashed line represents an extrapolation of the carrier concentration within the channel layer 111 between thicknesses t1, t2 and tn. As shown in FIG. 25C, the carrier concentration has a gradient profile, with the highest carrier concentrations nearest to the first surface 119 of the channel layer 111, with a gradually decreasing carrier concentration through the thickness of the channel layer 111 between the first surface 119 and the second surface 121 of the channel layer 111. Put another way, the carrier concentration of the channel layer 111 may increase in accordance with a gradient profile as a function of increasing depth from the second surface 121 of the channel layer 111. In embodiments, the second surface 121 of the channel layer 111 may electrically contact respective source and drain electrodes (e.g., a source line and bit line) of a transistor device. In various embodiments, the carrier concentration throughout the channel layer 111 may vary within a range between $1\times10^{11}$ cm-3 and $1\times10^{21}$ cm-3. In embodiments, the carrier concentration of the channel layer 111 at the second surface 121 may be less than $1\times10^{18}$ cm-3, such as between $1\times10^{11}$ cm-3 and $1\times10^{15}$ cm-3, including between $1\times10^{11}$ cm-3 and $1\times10^{13}$ cm-3.

In addition, X-ray photoelectron spectroscopy (XPS) depth profile analysis of embodiment channel layers 111 confirm that the peak ratio of oxygen vacancies in the channel layer 111 gradually decreases through the thickness of the channel layer 111 between the first surface 119 and the second surface 121 of the channel layer 111. Thus, the oxygen vacancy concentration of the channel layer 111 may increase in accordance with a gradient profile as a function of increasing depth from the second surface 121 of the channel layer 111.

Various embodiments of the present invention provide a channel layer 111 having a carrier concentration that increases in accordance with a gradient profile as a function of increasing depth from a surface 121 of the channel layer 111. In embodiments, the surface 121 of the channel layer 111 may electrically contact respective source and drain electrodes (e.g., a source line and bit line) of a transistor device. In various embodiments, the carrier concentration throughout the channel layer 111 may vary within a range between $1\times10^{11}$ cm-3 and $1\times10^{21}$ cm-3. In various embodiments, channel layer 111 may have an oxygen vacancy concentration that increases in accordance with a gradient profile as a function of increasing depth from the surface 121 of the channel layer 111. By providing a channel layer 111 for a transistor device having a carrier concentration that increases in accordance with a gradient profile as a function of increasing depth from a surface 121 of the channel layer 111, the transistor device may have a small positive threshold voltage shift and high Ion current, and may enable ultra-fast driving, while avoiding the formation of unwanted conductive paths through the channel due to the short channel effect.

Subsequent to the formation of the channel layer 111, the processing steps of FIGS. 15-23C may be performed to form a dielectric layer 114 over the channel layer 111, selectively etch the dielectric layer 114 and the channel layer 111 to separate the channel layer 111 such that each rail 101R of alternating conductive layers 104 and dielectric layers 102 has its own channel layer 111 separate from a channel layer 111 of an adjacent rail 101R, fill the trenches with dielectric material 114 and planarize the dielectric material 114 to form device rails 113R between adjacent rails 101R of alternating conductive layers 104 and dielectric layers 102, selectively etch portions of the channel layer 111 and the dielectric material 114 to form isolation trenches 115 between adjacent device vertical pillars 117, fill the isolation trenches with dielectric material to form isolation structures 116, form source line and bit line trenches 118 on alternate sides of the isolation structures 116, and deposit conductive material within the source line and bit line trenches 118 to form source lines 120 and bit lines 120 electrically contacting the second surface 121 of the channel layers 111 to form transistor devices 122.

Each transistor device 122 may include a word line 104 that serves as a gate electrode, a dielectric layer 110, a channel layer 111, and source/drain electrodes contacting a surface 121 of the channel layer 111. Each channel layer 111 may have a carrier concentration that increases in accordance with a gradient profile as a function of increasing depth from the surface 121 of the channel layer 111.

Each rail 101R may include a plurality of transistor devices 122 formed on opposite sides of the rail 101R, where each adjacent transistor device 122 may be spaced from one another in a first horizontal direction hd1 and isolated from one another by an isolation structure 116. Moreover, each transistor device 122 may be spaced away from one another and isolated in a vertical direction by the dielectric layers 102 formed between each conductive word line layer 104. One or more staircase structures 103, 103A, 103B may be provided in the alternating conductive layers 104 and dielectric layers 102 to facilitate the formation of electrical contacts to each of the conductive word line layers 104.

In some embodiments, a channel of a transistor device 122 may include a combination of a channel layer 112 formed with multiple sub layers as described above with reference to FIG. 14 and a channel layer 111 having a gradient carrier concentration profile as described above with reference to FIGS. 25A-25C. In one exemplary embodiment, for example, a first oxide semiconductor layer 112A may be deposited using a high flow rate ratio of O2 to the total flow amount of Ar and O2 (i.e., O2/Ar+O2) during the oxide semiconductor film deposition. The higher ratio of oxygen to argon insures a desired percentage of oxygen in the environment during the deposition process to form an oxide semiconductor with a lower carrier concentration. To form the first oxide semiconductor layer 112A a ratio of flow rates "X" of O2/(Ar+O2), where 0.05<X<1, provides for a desired O2 percentage during the deposition process. Thus, for example, when the flow rate of O2 is the 1 sccm and the flow rate of Ar is 19 sccm, the ratio may be 1/(19+1) or 0.05. In other embodiments, the atmosphere may contain predominately or all O2, the ratio may be 1/(0+1) or 1.

A second oxide semiconductor layer 112B may be formed over the first oxide semiconductor layer 112A. The second oxide semiconductor layer may have a higher carrier concentration than that of the first oxide semiconductor layer 112A. The oxygen content of the second oxide semiconductor layer 112B may be lower than that of the first oxide semiconductor layer 112A. In embodiments, a lower flow rate ratio O2 to the total flow amount of Ar and O2 (i.e., O2:Ar+O2) insures a desired percentage of oxygen in the environment during the deposition process to form an oxide semiconductor with a higher carrier concentration. To form the second oxide semiconductor layer 112B a ratio of flow rates "Y" of O2/(Ar+O2), where 0<Y<0.05, may be used to provide for a desired O2 percentage during the deposition process. Thus, for example, when no O2 is flowed into the deposition chamber, the ratio of flow rates may be 0 (i.e., 0/Ar+0=0). In other embodiments, the flow rate of O2 may be as much as 1 sccm and the flow rate of Ar is 19 sccm, the ratio may be 1/(19+1) or 0.05. In this manner, the oxygen content of the second oxide semiconductor layer 112B may be lower than the oxygen content of the first oxide semiconductor layer 112A.

The second oxide semiconductor layer 112B may then be subjected to a thermal treatment at an elevated temperature to promote the desorption of oxygen from the second oxide semiconductor layer 112B, such as described above with reference to FIG. 25A. In various embodiments, the thermal treatment may be in a vacuum or low pressure environment, and may optionally be conducted in the presence of a process gas, such as CO, H2, CH4, HBr and combinations thereof, to further promote the desorption of oxygen from the second oxide semiconductor layer 112B and the generation of oxygen vacancies in the second oxide semiconductor layer 112B. The thermal treatment may be conducted in an environment that is basically or essentially free of oxygen gas (O2).

A third oxide semiconductor layer 112C may be formed over the second oxide semiconductor layer 112B. In some embodiments, the amount of O2 gas in the atmosphere may be controlled to have a higher flow rate ratio of O2 during the deposition of the third oxide semiconductor layer 112C than was used during the deposition of the second oxide semiconductor layer 112B. In embodiments, the third oxide semiconductor layer 112C may be formed in a manner similar to (i.e., using flow rate ratios similar to those used to form) the first oxide semiconductor layer 112A. Alternately, the third oxide semiconductor layer 112C may be formed using flow rate ratios that are similar to those used to form the second oxide semiconductor layer 112B. In some embodiments, the flow rate ratio used to form the third oxide semiconductor layer 112C may be dissimilar from the flow rate ratios used to form either the first oxide semiconductor layer 112A and the second oxide semiconductor layer 112B.

Following the deposition of the third oxide semiconductor layer 112C, the intermediate structure may be annealed, optionally in the presence of an oxygen-containing gas which may further oxidize the third oxide semiconductor layer 112C. The process conditions used to form the second oxide semiconductor layer 112B and the third oxide semiconductor layer 112C may promote the desorption of oxygen from second oxide semiconductor layer 112B and the diffusion of the oxygen into the third oxide semiconductor layer 112C (and optionally also into the first oxide semiconductor layer 112A), and may also increase in the concentration of oxygen vacancies in the second oxide semiconductor layer 112B relative to the concentration of oxygen vacancies in the first and third oxide semiconductor layers 112A and 112C.

A channel layer 112 formed with multiple sub layers 112A, 112B and 112C as described above may have a carrier concentration that initially increases in accordance with a gradient profile as a function of increasing depth from a first surface of the channel layer 112 (corresponding to an upper surface of the third oxide semiconductor layer 112C), followed by a decrease in carrier concentration proximate to a second surface of the channel layer 112 (corresponding to the lower surface of the first oxide semiconductor layer 112A). Similarly, the oxygen vacancy concentration of the channel layer 112 may increase in accordance with a gradient profile as a function of increasing depth from the first surface, and the oxygen vacancy concentration may then decrease proximate to the second surface. Accordingly, the channel layer 112 may prevent unwanted conductive paths due to the short channel effect from forming between the source and drain electrodes while in addition fewer charge traps may be formed at the interface between the channel layer 112 and the high k dielectric layer 110, resulting in lower recombination and improved device performance.

Figure 26:
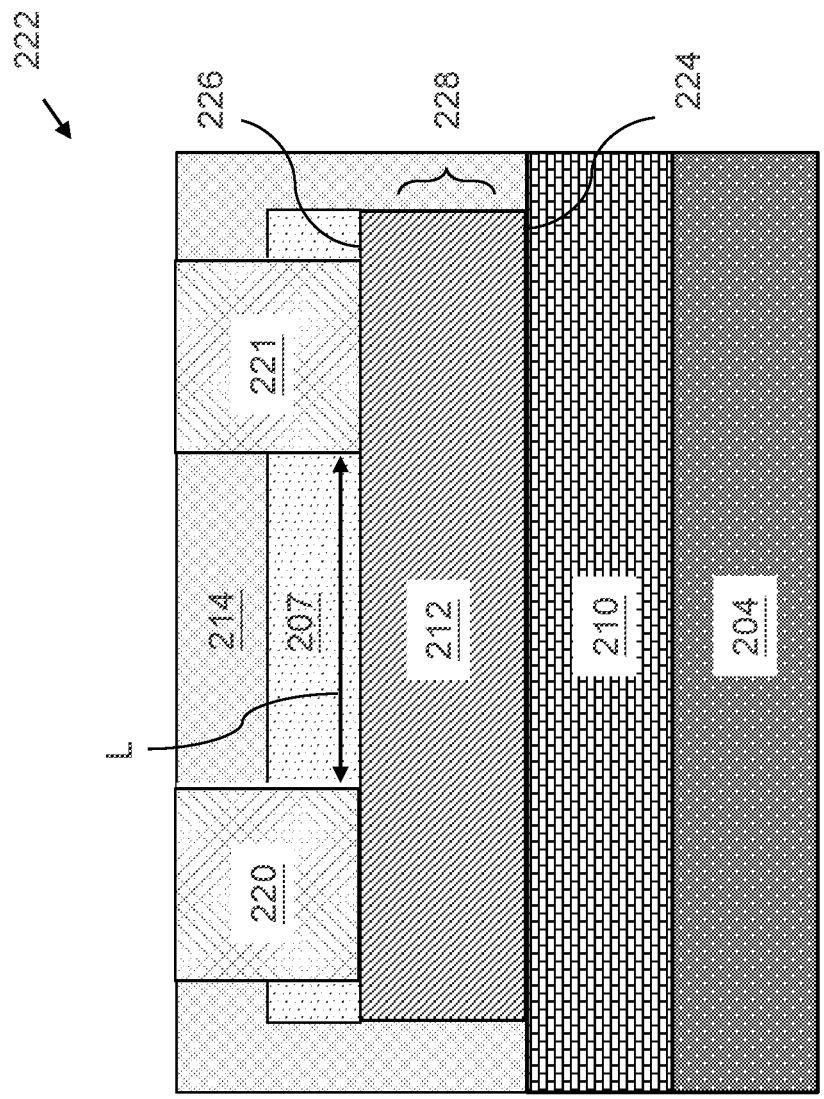
FIG. 26 is a vertical cross-section view of another exemplary structure of a transistor device according to an embodiment of the present disclosure.

FIG. 26 is a vertical cross-section view of another exemplary structure of a transistor device 222 according to an embodiment of the present disclosure. The transistor device 222 may be formed over a support structure, which may be a substrate or a lower level device structure 100 as shown in FIGS. 1A-1C. Referring to FIG. 26, the transistor device 222 may include a word line 204 made of a conductive material, such as a metal (e.g., W, Cu, Co, Mo, Ru, etc.), a conductive metallic nitride (e.g., TiN, TaN or WN) or various combinations of conductive materials. The word line 204 may function as a gate electrode for the transistor device 222.

A dielectric layer 210 may be disposed over the word line 204. The dielectric layer 210 may include, for example, hafnium oxide (HfO2), hafnium silicon oxide (HfSiO), hafnium tantalum oxide (HfTaO), hafnium titanium oxide (HfTiO), hafnium zirconium oxide (HfZrO), zirconium oxide (ZrO2), titanium oxide (TiO2), hafnium lanthanum oxide (HfLaO), alumina (Al2O3), hafnium dioxide-alumina (HfO2-Al2O3), tantalum oxide (Ta2O5), or combinations thereof. In some embodiments, the dielectric layer 210 may include SiOx/SiNy/SiOx (ONO), ferroelectrics, or another memory layer.

Referring again to FIG. 26, a channel layer 212 may be disposed over the dielectric layer 210. The channel layer 212 may include an oxide semiconductor material, such as $In_xGa_yZn_zMO$, where M is a metal selected from the group consisting of Ti, Al, Ag, W, Ce and Sn and combinations thereof. In various embodiments, $0<x<1$, $0\leq y\leq 1$, and $0\leq z\leq 1$.

The channel layer 212 may include a channel layer formed with multiple sub layers, such channel layer 112 described above with reference to FIG. 14. In particular, the lower channel layer 212 may include a first oxide semiconductor layer 112A over the high-k layer 210 having a first oxygen concentration, a second oxide semiconductor layer 112B over the first oxide semiconductor layer 112A having a second oxygen concentration, and a third oxide semiconductor layer 112C over the second oxide semiconductor layer 112B having a third oxygen concentration, where the oxygen concentration of the second oxide semiconductor layer 112B is lower than the oxygen concentration of the first oxide semiconductor layer 112A and the third oxide semiconductor layer 112C. The second oxide semiconductor layer 112B may have a higher carrier concentration than the first oxide semiconductor layer 112A and the third oxide semiconductor layer 112C. Thus, in various embodiments, the channel layer 212 may have a lower carrier concentration proximate to a lower surface 224 of the channel layer 212 (i.e., at an interface between the channel layer 212 and the dielectric layer 210), and a lower carrier concentration proximate to an upper surface 226 of the channel layer 212 (i.e., at an interface between the channel layer 212, a capping layer 207, and the source and drain electrodes 220, 221) than the carrier concentration in a middle portion 228 of the channel layer 212 between the lower surface 224 and the upper surface 226.

Alternatively, or in addition, the channel layer 212 may include a channel layer having a gradient carrier concentration profile, such as channel layer 111 described above with reference to FIGS. 25A-25C. In particular, the channel layer 212 may have a carrier concentration that increases in accordance with a gradient profile as a function of increasing depth from the upper surface 226 of the channel layer 212. The channel layer 112 may also have an oxygen vacancy concentration that decreases in accordance with a gradient profile as a function of increasing depth from the upper surface 226 of the channel layer 212. Thus, in various embodiments, the channel layer 212 may have a lower carrier concentration proximate to an upper surface 226 of the channel layer 212 (i.e., at an interface between the channel layer 212, the capping layer 207, and the source and drain electrodes 220, 221) than the carrier concentration in the middle portion 228 of the channel layer 212.

Referring again to FIG. 26, a capping layer 207 may be disposed over the upper surface 226 of the channel layer 212. The capping layer 207 may include a suitable dielectric material, such as silicon oxide (SiO), silicon nitride (SiN), or a high-k material, such as alumina (Al2O3). Other suitable dielectric materials are within the contemplated scope of disclosure.

The transistor device 222 may also include a source line 220 and a bit line 221 that extend through openings in the capping layer 207 and contact the upper surface 226 of the channel layer 212. The source line 220 and the bit line 221 may be made of a conductive material, such as a metal (e.g., W, Cu, Co, Mo, Ru, etc.), a conductive metallic nitride (e.g., TiN, TaN or WN) or various combinations of conductive materials. The source line 220 may function as a source electrode for the transistor device 222, and the bit line 221 may function as a drain electrode for the transistor device 222. The source line 220 and the bit line 221 may be laterally spaced from one another, and the capping layer 207 may extend over the upper surface 226 of the channel layer 212 between the source line 220 and the bit line 221. The distance between the source line 220 and the bit line 221 may define the effective channel length, L, of the transistor device 222. In various embodiments, the effective channel length, L, of the transistor device 222 may be within a range of 5 nm to 500 nm. In embodiments, the relatively lower carrier concentration of the channel layer 212 proximate to the upper surface 226 of the channel layer 212 may prevent conductive paths from forming through the channel layer 212 between the source line 220 and the bit line 221 due to the short channel effect, and may also limit the formation of charge traps at the interface between the channel layer 112 and the capping layer 207.

A dielectric material 214, which may be interlayer dielectric (ILD) material such as silicon oxide, silicon oxynitride, and/or a low-k dielectric material such as organosilicate glass or any other suitable dielectric material may be disposed over the top surface of the capping layer 207, over the lateral side surfaces of the capping layer 207 and the channel layer 212, and over the exposed upper surface of the dielectric layer 210. The dielectric material 214 may laterally surround portions of the source line 220 and bit line 221.

In various embodiments, a transistor device 222 as shown in FIG. 26 may be fabricated by depositing a continuous channel layer and a continuous capping layer over the dielectric layer 210, forming a patterned mask over at least one region of the continuous capping layer using lithographic processes, and etching the remaining unmasked portions of the continuous capping layer and the continuous channel layer to provide a patterned channel layer 212 and a patterned capping layer 207 over the dielectric layer 210. Then, the dielectric material 214 may be deposited over the top surface of the patterned capping layer 207, over the lateral side surfaces of the patterned capping layer 207 and the patterned channel layer 212, and over the exposed upper surface of the dielectric layer 210 using a suitable deposition method, such as by CVD, PVD, PECVD, ALD, etc. A patterned mask may be formed over the dielectric material 214 using a lithographic process, and the unmasked portions of the dielectric material 214 may be etched to form openings through the dielectric material 214 and the capping layer 207, where portions of the upper surface 226 of the channel layer 212 may be exposed in the bottom surfaces of the openings. Then, a conductive material may be deposited within the openings, and optionally planarized, to form a source line 220 and a bit line 221, respectively, electrically contacting the upper surface 226 of the channel layer 212.

Although the transistor device 222 shown in FIG. 26 is a bottom gate or back gate transistor, in which the gate electrode (i.e., word line 204) is disposed beneath a lower surface 224 of the channel layer 212, in alternative embodiments, the transistor device 222 may be a top gate transistor in which a patterned dielectric layer 210 and a patterned gate electrode (i.e., word line 205) may be disposed over the upper surface 226 of the channel layer 212, between the source line 220 and the bit line 221.

Figure 27:
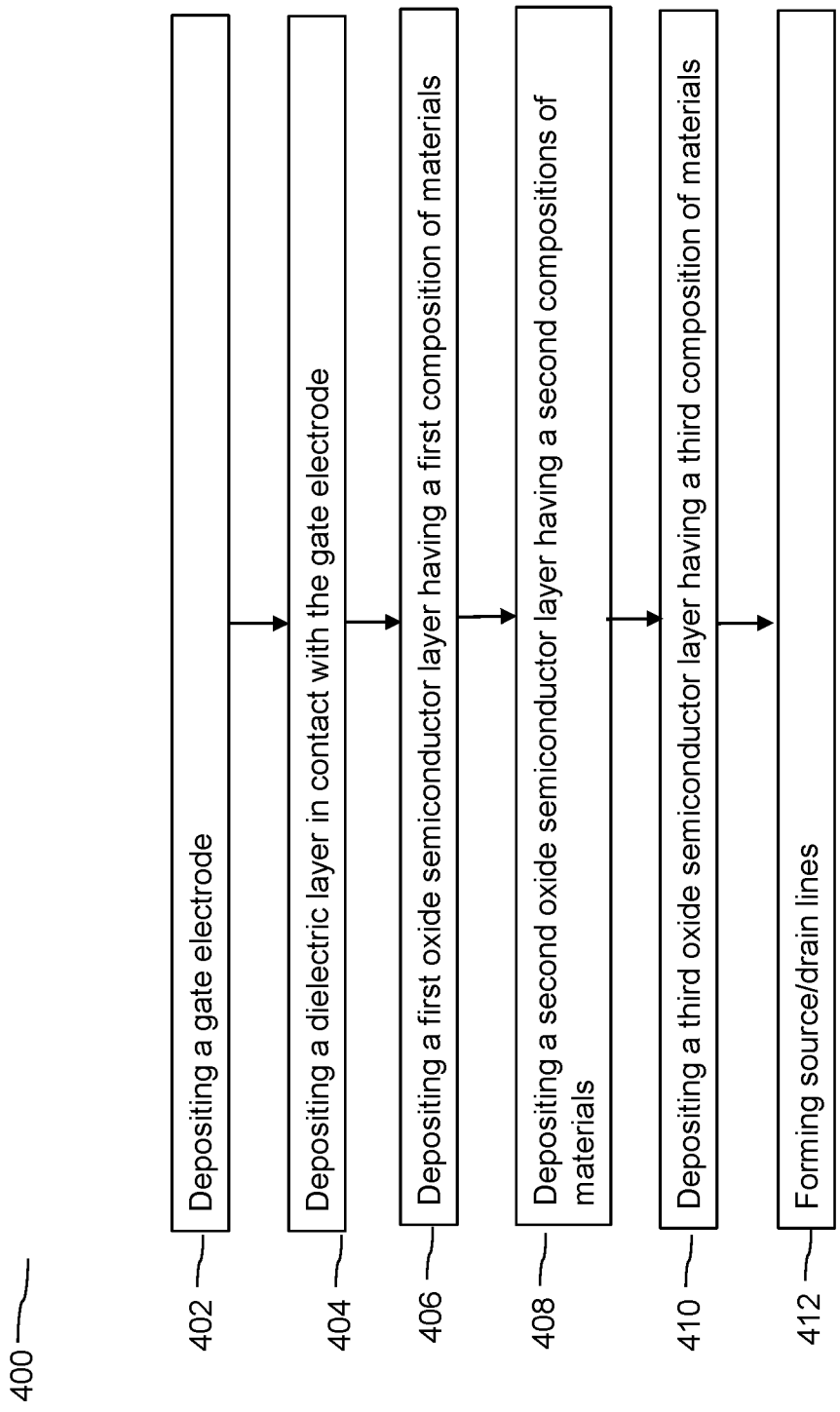
FIG. 27 is a flowchart that illustrates an embodiment method of forming an embodiment oxide semiconductor transistor.

FIG. 27 illustrates an embodiment method 400 of forming an embodiment oxide semiconductor transistor (122, 222). Referring to FIG. 27, the method 400 includes a step 402 of depositing a gate electrode (104, 204). Referring to step 404, the method includes depositing a dielectric layer (110, 210) in contact with the gate electrode (104, 204). Referring to step 406, the method includes depositing a channel layer (112, 212) in contact with the dielectric layer 110, wherein depositing the channel layer (112, 212) includes the step of depositing a first oxide semiconductor layer 112A comprising InxGayZnzMO, wherein M is selected from the group consisting of Ti, Al, Ag, Si, Sn and combinations thereof;

and 0<(x, y, z)<1. Referring to step 408 the step of depositing a channel layer (112, 212), further includes depositing a second oxide semiconductor layer 112B comprising InxGayZnzMO, wherein M is selected from the group consisting of Ti, Al, Ag, Si, Sn and combinations thereof, wherein a composition of the second oxide semiconductor layer 112B is different from a composition of the first oxide semiconductor layer 112A. Referring to step 410 the step of depositing a channel layer (112, 212) further includes depositing a third oxide semiconductor layer 112C comprising InxGayZnzMO, wherein M is selected from the group consisting of Ti, Al, Ag, Si, Sn and combinations thereof, wherein a composition of the third oxide semiconductor layer 112C is different from the composition of the second oxide semiconductor layer 112B. Referring to step 412, the method further includes the step of forming source/drain lines (120, 220, 221) in contact with the channel layer (112, 212). In an embodiment method 400, the compositions of the first oxide semiconductor layer 112A and the second oxide semiconductor layer 112B result in a second oxygen concentration of the second oxide semiconductor layer being lower than a first oxygen concentration of the first oxide semiconductor layer.

Figure 28:
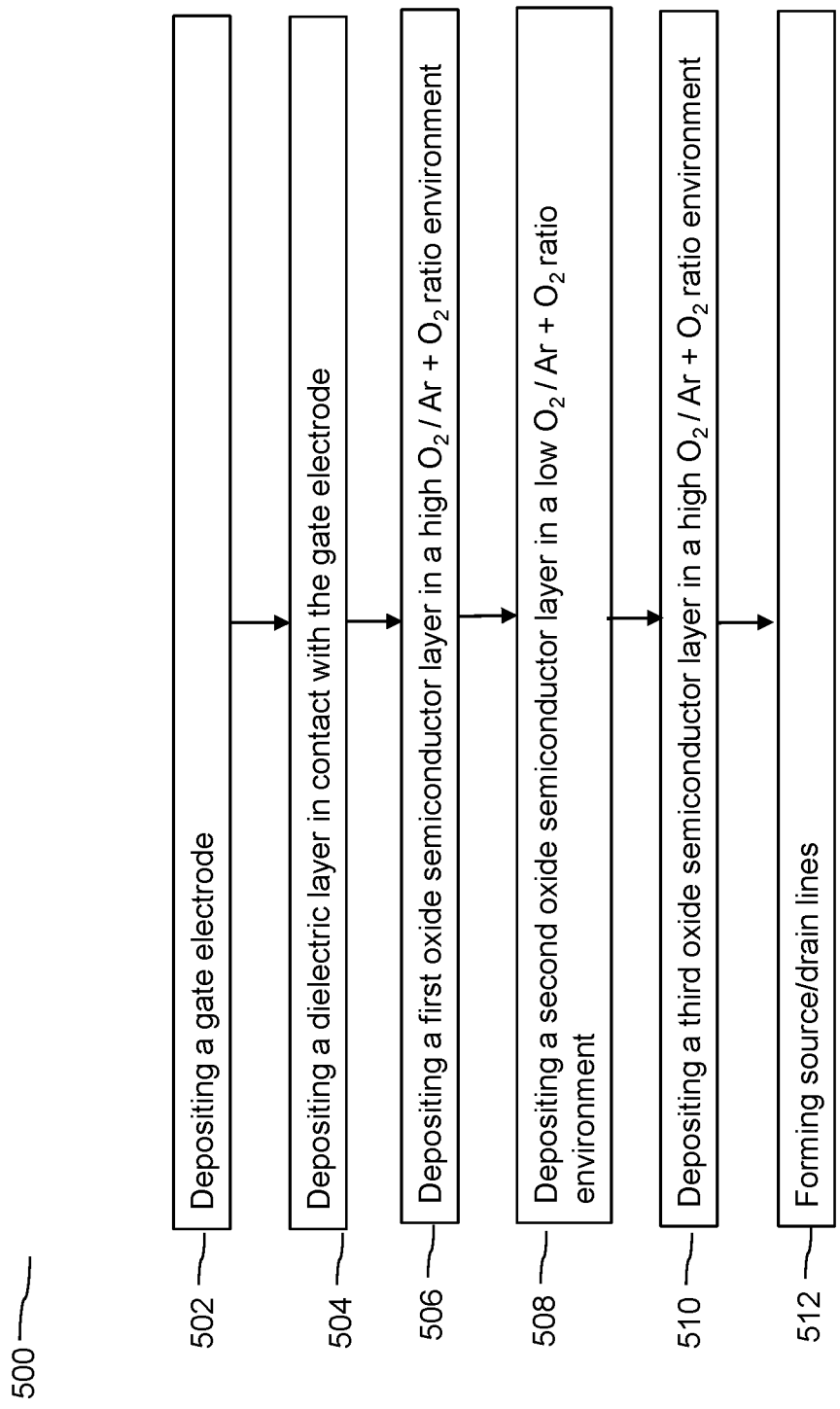
FIG. 28 is a flowchart that illustrates an alternative embodiment method of forming an embodiment oxide semiconductor transistor.

FIG. 28 illustrates an alternative embodiment method 500 of forming an embodiment oxide semiconductor transistor (122, 222). Referring to FIG. 28, the method includes the step 502 of depositing a gate electrode (104, 204). Referring to step 504, the method includes depositing a dielectric layer (110, 210) in contact with the gate electrode (104, 204). Referring to step 506, the method includes depositing a channel layer (112, 212) in contact with the dielectric layer (110, 210), wherein depositing the channel layer (112, 212) includes the step of depositing a first oxide semiconductor layer 112A in a high flow rate ratio of O2 to Ar+O2 environment. Referring to step 508 the step of depositing a channel layer (112, 212), further includes depositing a second oxide semiconductor layer 112B in a low O2/Ar+O2 ratio environment. Referring to step 510 the step of depositing a channel layer (112, 212), further includes depositing a third oxide semiconductor layer 112C in a high O2/Ar+O2 ratio environment. Referring to step 512, the method further includes the step of forming source/drain lines (120, 220, 221 (in contact with the channel layer (112, 212). In an embodiment method 500, a resulting first oxygen concentration of the first oxide semiconductor layer 112A is higher than a second oxygen concentration of the second oxide semiconductor layer 112B.

Figure 29:
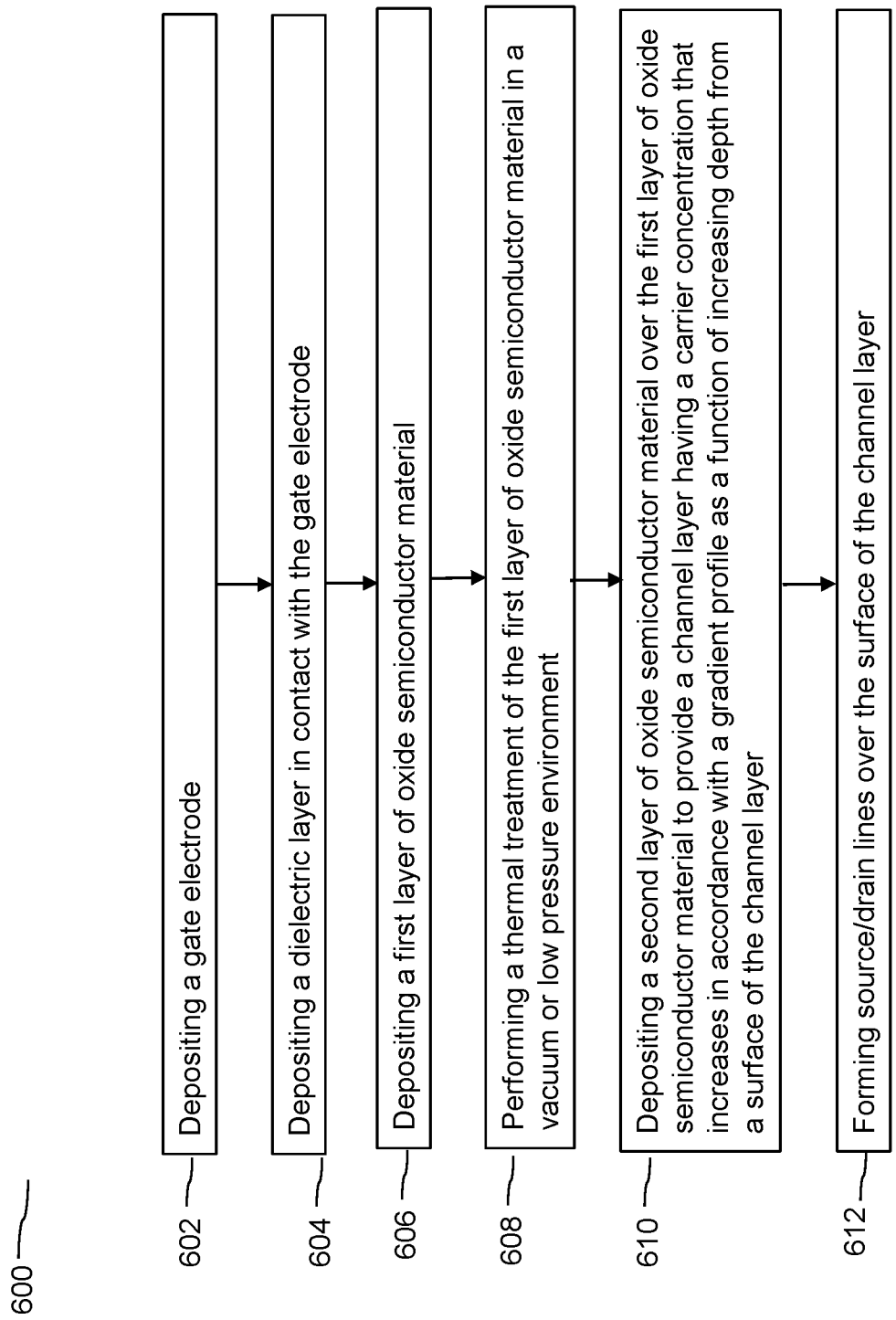
FIG. 29 is a flowchart that illustrates another alternative embodiment of forming an embodiment transistor device.

FIG. 29 illustrates an alternative embodiment method 600 of forming an embodiment oxide semiconductor transistor (122, 222). Referring to FIG. 29, the method includes the step 602 of depositing a gate electrode (104, 204). Referring to step 604, the method includes depositing a dielectric layer (110, 210) in contact with the gate electrode (104, 204). Referring to step 606, the method includes depositing a first layer of an oxide semiconductor material 111A. Referring to step 608, the method further includes performing a thermal treatment of the first layer of an oxide semiconductor material 111A in a vacuum or low pressure environment. Referring to step 610, the method further includes depositing a second layer of an oxide semiconductor material 111B over the first layer 111A to provide a channel layer (111, 212) having a carrier concentration that increases in accordance with a gradient profile as a function of increasing depth from a surface (121, 226) of the channel layer (111, 212). Referring to step 612, the method further includes the step of forming source/drain lines (120, 220, 221) over the surface (121, 226) of the channel layer (111, 212).

In some applications, the various embodiments disclosed herein provide a multilayer channel layer having different oxygen levels that reduces interfacial carrier traps by suppressing the interaction between the oxide semiconductor channel layer and adjacent dielectric oxide layers. Further, the multilayer channel layer may enhance to low hysteresis characteristics of the device as the small-signal RF characteristics due to gate swing bias. Another advantage of the multilayer channel layer having different oxygen levels is that the oxygen concentration can be detected and confirmed by secondary ion mass spectroscopy (SIMS).

In some applications, the various embodiments disclosed herein provide a channel layer having a carrier concentration that increases in accordance with a gradient profile as a function of increasing depth from a surface of the channel layer. In embodiments, the surface of the channel layer may electrically contact respective source and drain electrodes (e.g., a source line and bit line) of a transistor device. In various embodiments, the carrier concentration throughout the channel layer may vary within a range between $1 \times 10^{11}$ cm-3 and $1 \times 10^{21}$ cm-3. In various embodiments, channel layer may have an oxygen vacancy concentration that increases in accordance with a gradient profile as a function of increasing depth from the surface of the channel layer. By providing a channel layer for a transistor device having a carrier concentration that increases in accordance with a gradient profile as a function of increasing depth from a surface of the channel layer, the transistor device may provide high performance while avoiding the formation of unwanted conductive paths through the channel due to the short channel effect.

Referring to all drawings and according to various embodiments of the present disclosure, a transistor (122, 222) is provided, wherein the transistor (122, 222) includes a gate electrode (104, 204), a dielectric layer (110, 210), source and drain electrodes (120, 220, 221), and a channel layer (112, 111, 226) having an upper surface (121, 226), a lower surface (119, 224), and a middle portion (112B, 228) between the upper surface (121, 226) and the lower surface (119, 224), where the source and drain electrodes (120, 220, 221) electrically contact the upper surface (121, 226) of the channel layer (112, 111, 226), and the channel layer (112, 111, 226) has a first carrier concentration proximate to the upper surface of the channel layer (112, 111, 226), and a second carrier concentration in the middle portion (112B, 228) of the channel layer (112, 111, 226), and the first carrier concentration is less than the second carrier concentration.

In an embodiment, the channel layer (112, 226) has a third carrier concentration proximate to the lower surface (119, 224) of the channel layer (112, 111, 226), and the third carrier concentration is less than the second carrier concentration.

In another embodiment, the channel layer (112, 226) includes a first oxide semiconductor layer 112A having a first oxygen concentration, a second oxide semiconductor layer 112B having a second oxygen concentration and a third oxide semiconductor layer 112C having a third oxygen concentration. In an embodiment transistor, the second oxide semiconductor layer 112B is located between the first oxide semiconductor layer 112A and the third oxide semiconductor layer 112C. In addition, wherein the second oxygen concentration is lower than the first oxygen concentration or the third oxygen concentration.

In another embodiment, the first oxygen concentration and the third oxygen concentration are equal. In another embodiment, the dielectric layer (110, 210) is located adjacent the first oxide semiconductor layer 112A opposite the second oxide semiconductor layer 112B. In another embodiment, the gate electrode (104, 204) is located adjacent the dielectric layer (110, 210) opposite the first oxide semiconductor layer 112A. In another embodiment, the dielectric layer (110, 210) may be selected from the group consisting of hafnium oxide (HfO2), hafnium silicon oxide (HfSiO), hafnium tantalum oxide (HfTaO), hafnium titanium oxide (HfTiO), hafnium zirconium oxide (HfZrO), zirconium oxide (ZrO2), titanium oxide (TiO2), alumina (Al2O3), hafnium dioxide-alumina (HfO2-Al2O3), tantalum oxide (Ta2O5), SiOx/SiNy/SiOx or ferroelectrics. In another embodiment, the first oxide semiconductor layer 112A, the second oxide semiconductor layer 112B and the third oxide semiconductor layer 112C comprise InxGayZnzMO, wherein M is selected from the group consisting of Ti, Al, Ag, Si, Sn and combinations thereof; and 0<(x, y, z)<1. In another embodiment, the first oxide semiconductor layer 112A, the second oxide semiconductor layer 112B and the third oxide semiconductor layer 112C comprise different compositions of InxGayZnzMw. In another embodiment, a thickness of the second oxide semiconductor layer 112B is greater than a combined thickness of the first oxide semiconductor layer 112A and the third oxide semiconductor layer 112C. In another embodiment, a ratio of a carrier concentration in the second oxide semiconductor layer 112B to the first oxide semiconductor layer 112A is in a range of 1:1 to 1:109.

An additional embodiment is drawn to a method of forming an oxide semiconductor transistor (122, 222) that includes depositing a gate electrode (104, 204), depositing a dielectric layer (110, 210), and depositing a channel layer (112, 212), where depositing the channel layer includes depositing a first oxide semiconductor layer 112A including InxGayZnzMO, where M is selected from the group consisting of Ti, Al, Ag, Si, Sn and combinations thereof; and 0<(x, y, z)<1, depositing a second oxide semiconductor layer 112B including InxGayZnzMO, where M is selected from the group consisting of Ti, Al, Ag, Si, Sn and combinations thereof, and where a composition of the second oxide semiconductor layer 112B is different from a composition of the first oxide semiconductor layer 112A, and depositing a third oxide semiconductor layer 112C including InxGayZnzMO, where M is selected from the group consisting of Ti, Al, Ag, Si, Sn and combinations thereof, and where a composition of the third oxide semiconductor layer 112C is different from the composition of the second oxide semiconductor layer 112B, and where a second oxygen concentration of the second oxide semiconductor layer 112B is lower than a first oxygen concentration of the first oxide semiconductor layer 112A. The method further includes forming a source electrode (120, 220) and a drain electrode (120, 221) in contact with the channel layer (112, 212).

In another embodiment, depositing the channel layer (112, 212) is performed by at least one of atomic layer deposition and physical vapor deposition. In another embodiment, the composition of the first oxide semiconductor layer 112A and the composition of the third oxide semiconductor layer 112C are the same. In another embodiment, the second oxygen concentration of the second oxide semiconductor layer 112B is lower than a third oxygen concentration of the third oxide semiconductor layer 112C.

An additional embodiment is drawn to a method of forming an oxide semiconductor transistor (122, 222) that includes depositing a gate electrode (104, 204), depositing a dielectric layer (110, 210), and depositing a channel layer (112, 212), where depositing the channel layer includes depositing a first oxide semiconductor layer 112A having a first oxygen concentration using a physical vapor deposition process in an environment having a first flow rate ratio of O2/(Ar+O2), depositing a second oxide semiconductor layer 112B having a second oxygen concentration using a physical vapor deposition process in an environment having a second flow rate ratio of O2/(Ar+O2), and depositing a third oxide semiconductor layer 112C having a third oxygen concentration using a physical vapor deposition process in an environment having a third flow rate ratio of O2/(Ar+O2), where the second flow rate ratio of O2/(Ar+O2) is lower than the first flow rate ratio and the third flow rate ratio of O2/(Ar+O2), and where the second oxygen concentration is lower than the first oxygen concentration and the third oxygen concentration. The method further includes forming a source electrode (120, 220) and a drain electrode (120, 221) in contact with the channel layer (112, 212).

In another embodiment, depositing the channel layer (112, 212) is performed by physical vapor deposition. In another embodiment, the method includes annealing the channel layer (112, 212). In another embodiment, the first and third flow rate ratios of O2/(Ar+O2) are greater than 0.05 and less than 1. In another embodiment, the second flow rate ratio of O2/(Ar+O2) is greater than or equal to 0 and less than or equal to 0.05. In another embodiment, the first oxide semiconductor layer 112A, the second oxide semiconductor layer 112B, and the third oxide semiconductor layer 112C include compositions of InxGayZnzMO, wherein M is selected from the group consisting of Ti, Al, Ag, Si, Sn and combinations thereof, and a ratio of In:Ga:Zn:M is identical in each of the first oxide semiconductor layer 112A, the second oxide semiconductor layer 112B, and the third oxide semiconductor layer 112C.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor comprising:
   a gate electrode;
   a dielectric layer;
   source and drain electrodes; and
   a channel layer comprising:
   a first oxide semiconductor layer having a first oxygen concentration;
   a second oxide semiconductor layer having a second oxygen concentration; and
   a third oxide semiconductor layer having a third oxygen concentration, wherein the second oxide semiconductor layer is located between the first oxide semiconductor layer and the third oxide semiconductor layer; and
   wherein the second oxygen concentration is lower than the first oxygen concentration and the third oxygen concentration, and
   a thickness of the second oxide semiconductor layer is greater than a combined thickness of the first oxide semiconductor layer and the third oxide semiconductor layer.

2. The transistor of claim 1, wherein the first oxygen concentration and the third oxygen concentration are equal.

3. The transistor of claim 1, wherein the dielectric layer is located adjacent the first oxide semiconductor layer opposite the second oxide semiconductor layer, and the gate electrode is located adjacent the dielectric layer opposite the first oxide semiconductor layer.

4. The transistor of claim 3, wherein the dielectric layer comprises a material selected from a group consisting of hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide ($ZrO_2$), titanium oxide ($TiO_2$), alumina ($Al_2O_3$), hafnium dioxide-alumina ($HfO_2$—$Al_2O_3$), tantalum oxide ($Ta_2O_5$), $SiO_x/SiN_y/SiO_x$ or ferroelectrics.

5. The transistor of claim 1, wherein:
the first oxide semiconductor layer, the second oxide semiconductor layer and the third oxide semiconductor layer comprise $In_xGa_yZn_zMO$, wherein M is selected from the group consisting of Ti, Al, Ag, Si, Sn and combinations thereof and 0<(x, y, z)<1; and
the source and drain electrodes comprise a conductive metal material.

6. The transistor of claim 5, wherein the first oxide semiconductor layer, the second oxide semiconductor layer and the third oxide semiconductor layer comprise different compositions of $In_xGa_yZn_zM_w$.

7. The transistor of claim 1, wherein a ratio of a carrier concentration in the second oxide semiconductor layer to the first oxide semiconductor layer is in a range of 1:1 to 1:109.

8. The transistor of claim 1, wherein a ratio of the thickness of the second oxide semiconductor layer to the thickness of the first oxide semiconductor layer is in a range of 10:1 to 100:1 and a ratio of the thickness of the second oxide semiconductor layer to the thickness of the third oxide semiconductor layer is in a range of 10:1 to 100:1.

9. A method of forming an oxide semiconductor transistor, comprising:
depositing a gate electrode;
depositing a dielectric layer;
depositing a channel layer, comprising:
depositing a first oxide semiconductor layer;
depositing a second oxide semiconductor layer;
depositing a third oxide semiconductor layer,
wherein an oxygen concentration of the second oxide semiconductor layer is lower than an oxygen concentration of the first oxide semiconductor layer, and
an oxygen concentration of the third oxide semiconductor layer, and
a thickness of the second oxide semiconductor layer is greater than a combined thickness of the first oxide semiconductor layer and third oxide semiconductor layer; and
forming a source electrode and a drain electrode in contact with the channel layer.

10. The method of claim 9, wherein the channel layer is deposited using atomic layer deposition.

11. The method of claim 9, wherein the channel layer is deposited using physical vapor deposition.

12. The method of claim 9, wherein the composition of the first oxide semiconductor layer and the composition of the third oxide semiconductor layer are the same.

13. The method of claim 9, wherein a carrier concentration of the second oxide semiconductor layer is greater than a combined carrier concentration of the first oxide semiconductor layer and the third oxide semiconductor layer.

14. A method of forming an oxide semiconductor transistor, comprising:
depositing a gate electrode;
depositing a dielectric layer;
depositing a channel layer, comprising:
depositing a first oxide semiconductor layer having a first oxygen concentration;
depositing a second oxide semiconductor layer having a second oxygen concentration;
subjecting the second oxide semiconductor layer to a thermal treatment at an elevated temperature in an environment that is essentially free of oxygen gas ($O_2$);
depositing a third oxide semiconductor layer having a third oxygen concentration;
wherein the second oxygen concentration is lower than the first oxygen concentration and the third oxygen concentration; and
forming a source electrode and a drain electrode in contact with the channel layer.

15. The method of claim 14, wherein the first oxide semiconductor layer, the second oxide semiconductor layer, and the third oxide semiconductor layer are formed using a physical vapor deposition process.

16. The method of claim 15, wherein a flow rate ratio of $O_2/(Ar+O_2)$ during the deposition of the second oxide semiconductor layer is greater than or equal to 0 and less than or equal to 0.05.

17. The method of claim 14, further comprising annealing the channel layer.

18. The method of claim 17, wherein the thermal treatment of the second oxide semiconductor layer is conducted in the presence of a reduction gas to promote desorption of oxygen from the second oxide semiconductor layer, and the channel layer is annealed in the presence of an oxygen-containing gas to promote oxidation of the third oxide semiconductor layer.

19. The method of claim 14, wherein the first oxide semiconductor layer, the second oxide semiconductor layer, and the third oxide semiconductor layer comprise compositions of $In_xGa_yZn_zMO$, wherein M is selected from the group consisting of Ti, Al, Ag, Si, Sn and combinations thereof.

20. The method of claim 19, wherein a ratio of In:Ga: Zn:M is identical in each of the first oxide semiconductor layer, the second oxide semiconductor layer, and the third oxide semiconductor layer.

* * * * *